United States Patent [19]
Kawahara et al.

[11] Patent Number: 5,679,978
[45] Date of Patent: Oct. 21, 1997

[54] SEMICONDUCTOR DEVICE HAVING RESIN GATE HOLE THROUGH SUBSTRATE FOR RESIN ENCAPSULATION

[75] Inventors: Toshimi Kawahara; Shinya Nakaseko; Mitsunada Osawa, all of Kawasaki; Shinichirou Taniguchi, Kagoshima; Mayumi Osumi, Kawasaki; Hiroyuki Ishiguro, Kawasaki; Yoshitugu Katoh, Kawasaki; Junichi Kasai, Kawasaki, all of Japan

[73] Assignees: Fujitsu Limited, Kawasaki; Kyushu Fujitsu Electronics Limited, Kagoshima, both of Japan

[21] Appl. No.: 330,848

[22] Filed: Oct. 24, 1994

[30] Foreign Application Priority Data

Dec. 6, 1993 [JP] Japan ................. 5-305642

[51] Int. Cl.⁶ .................. H01L 23/10; H01L 23/31
[52] U.S. Cl. .................. 257/697; 257/700; 257/787; 257/796
[58] Field of Search .................. 257/678, 680, 257/697, 700, 704, 730, 778, 787, 788, 796

[56] References Cited

U.S. PATENT DOCUMENTS

| | | | |
|---|---|---|---|
| 5,200,366 | 4/1993 | Yamada et al. | 257/697 |
| 5,311,059 | 5/1994 | Banerji et al. | 257/778 |
| 5,385,869 | 1/1995 | Liu et al. | 437/209 |
| 5,394,009 | 2/1995 | Loo | 257/778 |
| 5,455,456 | 10/1995 | Newman | 257/697 |

FOREIGN PATENT DOCUMENTS

| | | | |
|---|---|---|---|
| 0 564 865 | 10/1993 | European Pat. Off. | |
| 2 103 917 | 4/1972 | France. | |
| 0305542 | 12/1988 | Japan | 257/697 |
| 0041254 | 2/1989 | Japan. | |
| 0252148 | 11/1991 | Japan. | |
| 0219959 | 8/1992 | Japan | 257/697 |
| 0245449 | 9/1992 | Japan. | |
| 0306865 | 10/1992 | Japan. | |
| 0021537 | 1/1993 | Japan. | |
| 0021538 | 1/1993 | Japan. | |
| 0029500 | 2/1993 | Japan. | |
| 0121473 | 5/1993 | Japan. | |
| 2 218 570 | 11/1989 | United Kingdom. | |

OTHER PUBLICATIONS

IBM Technical Disclosure Bulletin, vol. 22, No. 09, Feb. 1980, New York, U.S. p. 3988.

*Primary Examiner*—Peter Toby Brown
*Attorney, Agent, or Firm*—Nikaido, Marmelstein, Murray & Oram LLP

[57] ABSTRACT

A semiconductor device includes a substrate having top and bottom surfaces, a semiconductor element mounted on the top surface of the substrate, and a resin package made of a resin and encapsulating the semiconductor element. The substrate includes at least one resin gate hole enabling the resin to be introduced from the bottom surface of the substrate via the resin gate hole when encapsulating the semiconductor element by the resin.

15 Claims, 51 Drawing Sheets

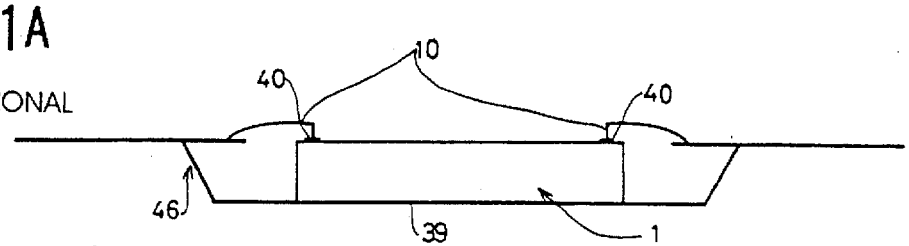
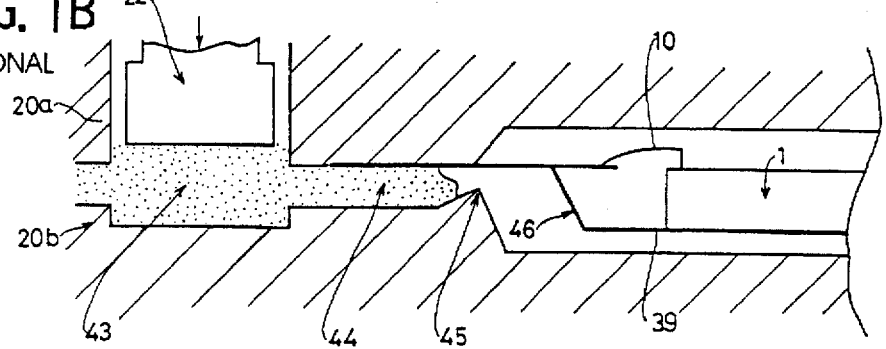
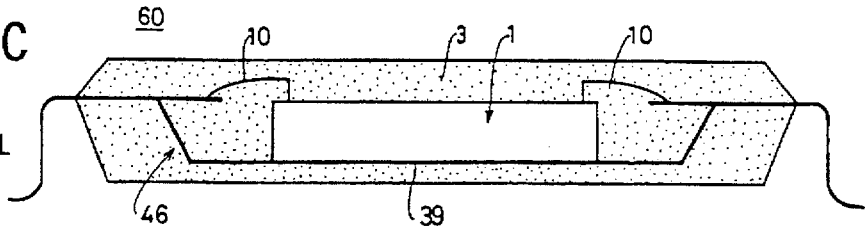

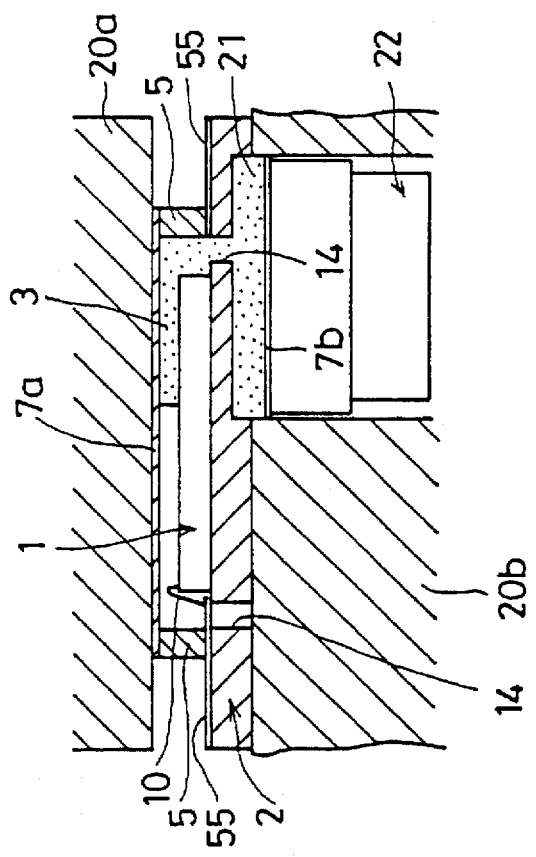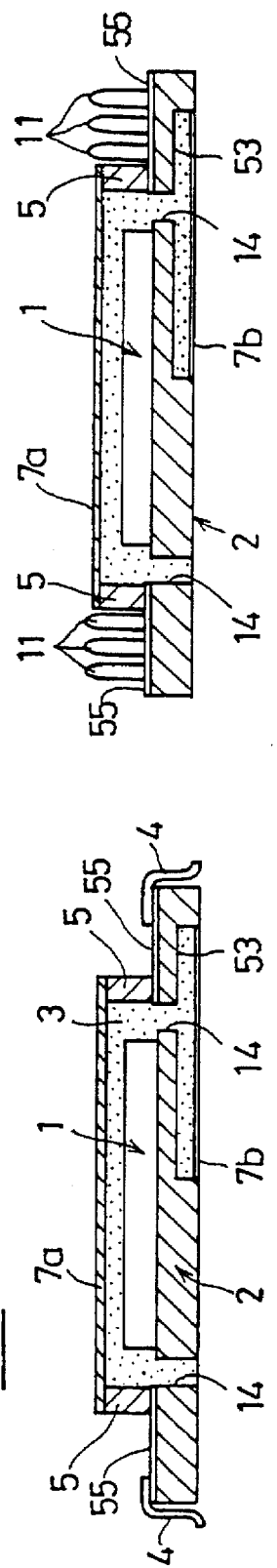

FIG. 20A
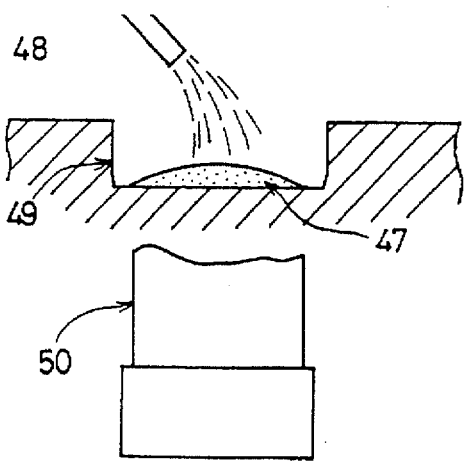
FIG. 20B
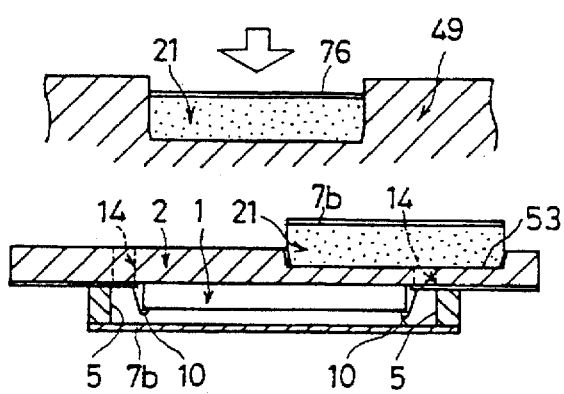
FIG. 20C
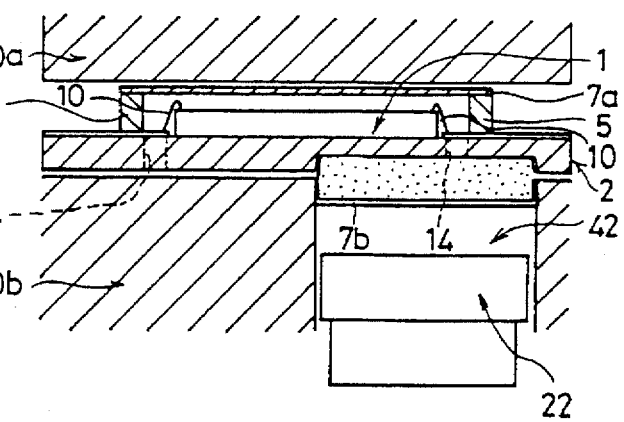
FIG. 20D
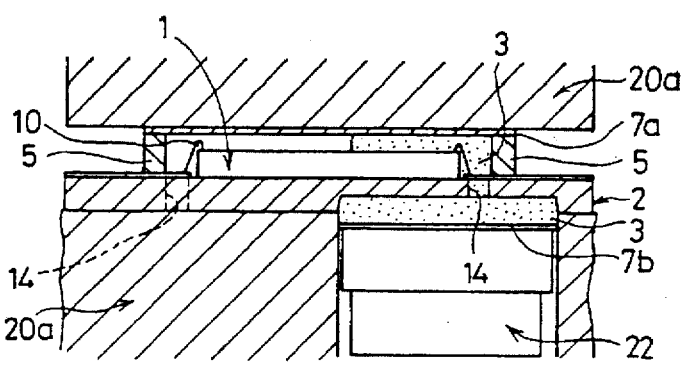
FIG. 20E

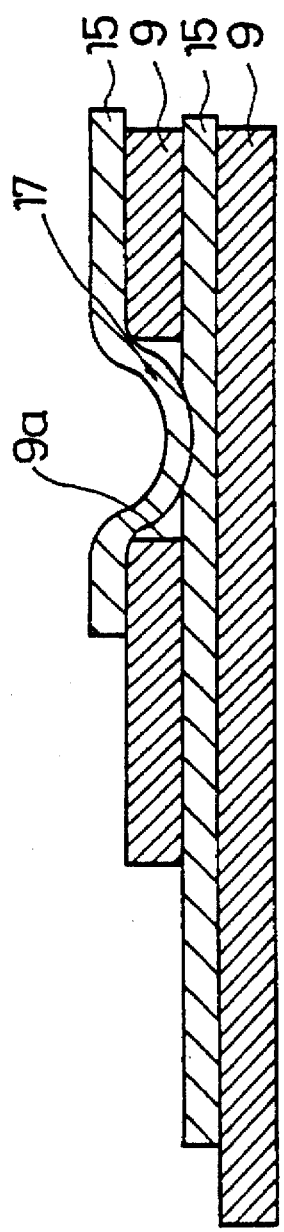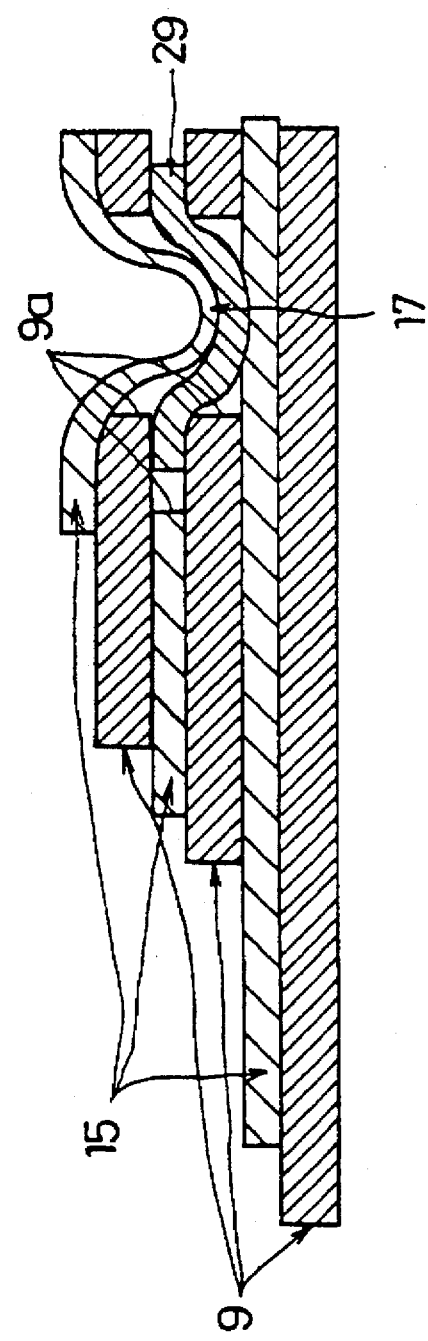
FIG. 21A
FIG. 21B

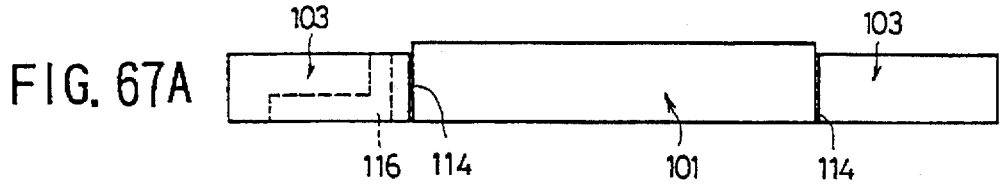
FIG. 67A
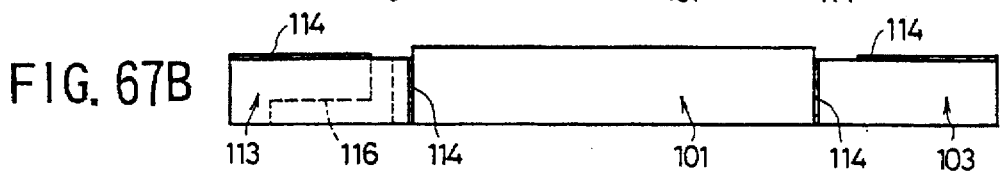
FIG. 67B
FIG. 67C
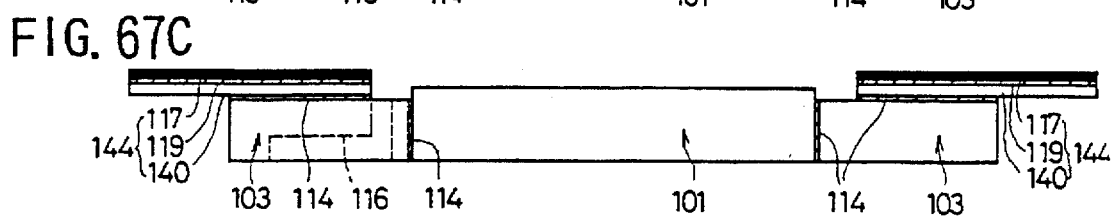
FIG. 67D
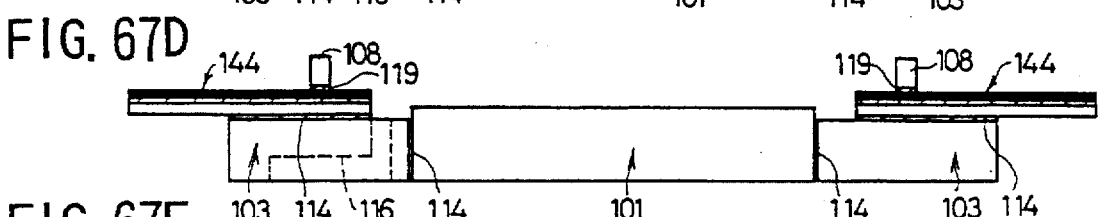
FIG. 67E
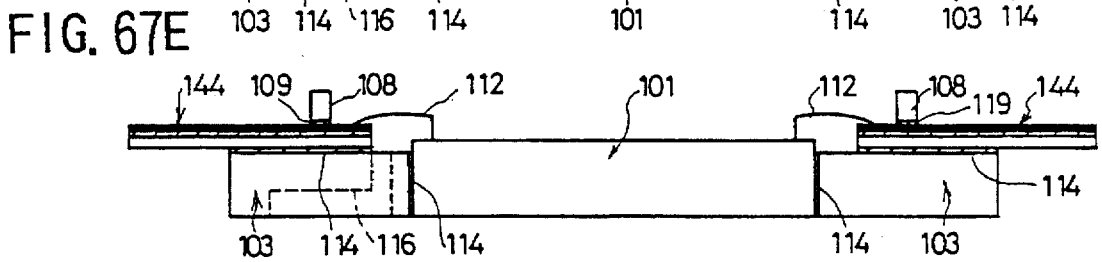
FIG. 67F
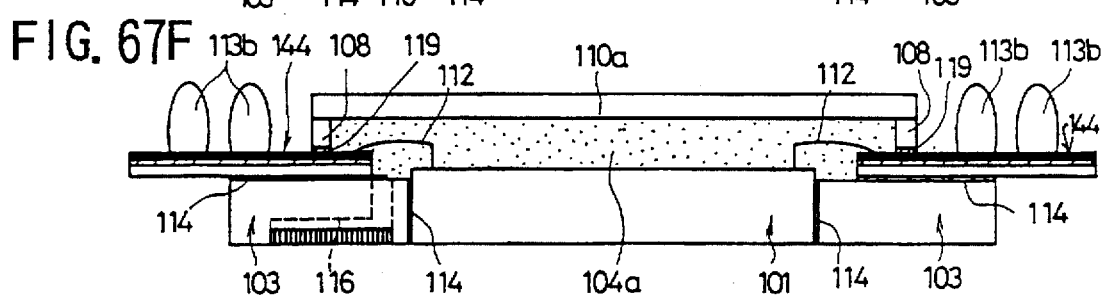

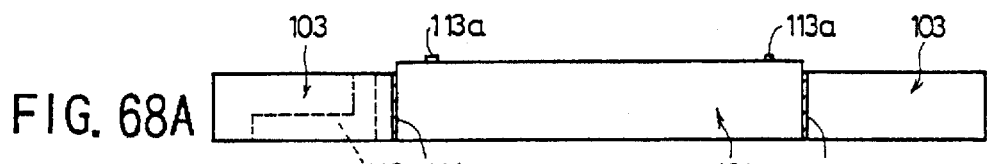
FIG. 68A
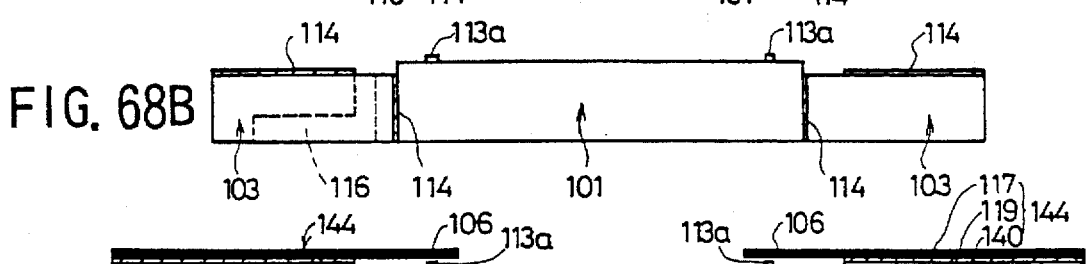
FIG. 68B
FIG. 68C
FIG. 68D
FIG. 68E
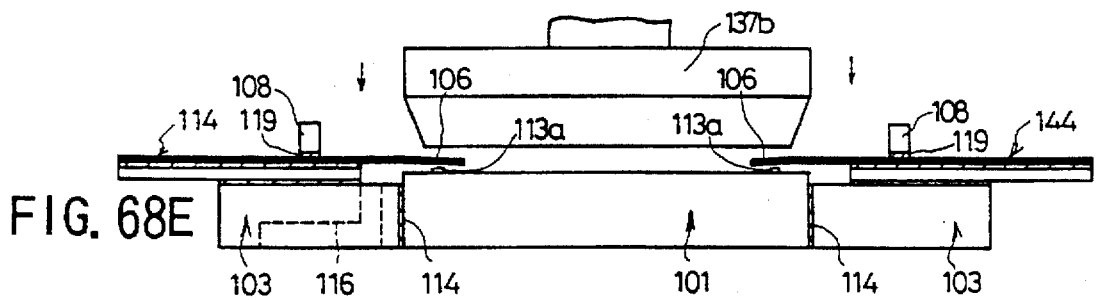
FIG. 68F
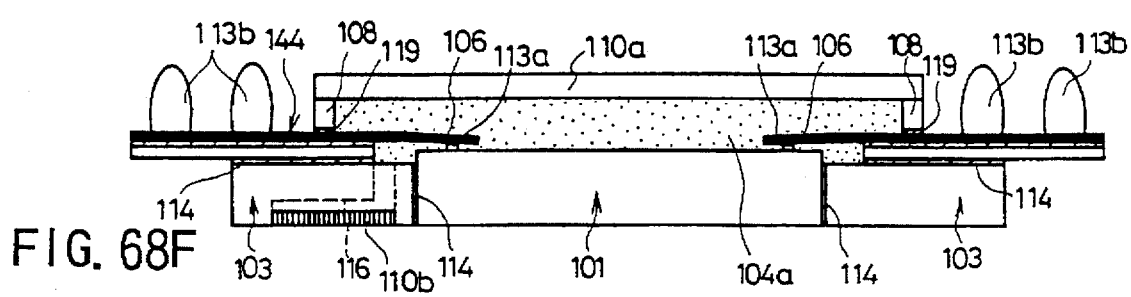

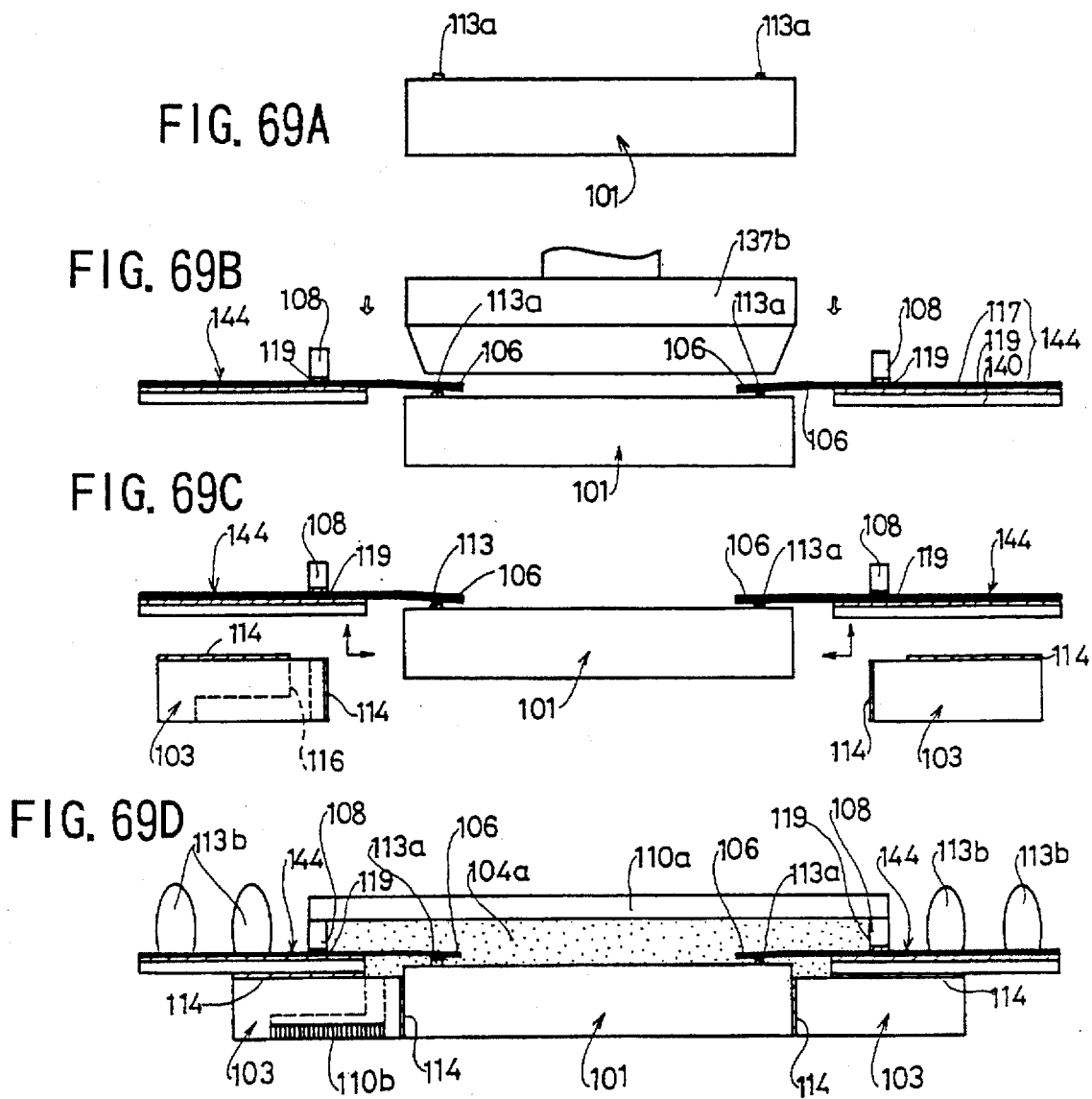

5,679,978

SEMICONDUCTOR DEVICE HAVING RESIN GATE HOLE THROUGH SUBSTRATE FOR RESIN ENCAPSULATION

BACKGROUND OF THE INVENTION

The present invention generally relates to semiconductor devices and methods of producing the same, and more particularly to a semiconductor device which encapsulates a semiconductor element by a resin and to a method of producing such a semiconductor device.

Recently, there are demands to further reduce the size of electronic equipments such as personal computers, and as a result, there are increased demands to realize smaller semiconductor devices which are used in such electronic equipments.

In semiconductor devices, a substrate which holds a semiconductor element or the volume of an encapsulating resin is large compared to the size of the semiconductor element. For this reason, in order to reduce the size of the semiconductor device, it is necessary to appropriately reduce the size of the substrate or the encapsulating resin.

On the other hand, when the size of the semiconductor device is reduced, the heat radiation characteristic of the semiconductor device deteriorates. As a result, it is necessary to provide an efficient heat radiation means.

Therefore, there are demands to realize a semiconductor device which has a reduced size but can be formed with ease and has a satisfactory heat radiation characteristic.

A description will be given of an example of a conventional semiconductor device and a method of producing the same, by referring to FIGS. 1A through 1C. FIGS. 1A through 1C respectively show cross sections of the conventional semiconductor device at various stages of the production process.

As shown in FIG. 1C, a conventional semiconductor device 60 includes a semiconductor element 1, a mold resin 3, a lead frame 46 and the like. The semiconductor element 1 is die-bonded on a die-pad portion 39 which is formed on the lead frame 46. In addition, wires 10 are provided between electrode pad portions 40 on the top surface of the semiconductor element 1 and inner lead portions of the lead frame 46. The electrode pad portions 40 are shown in FIG. 1A. The mold resin 3 encapsulates the semiconductor element 1, the wires 10 and the inner lead portions of the lead frame 46, so as to protect the semiconductor element 1 and the wires 10.

The mold resin 3 is formed as shown in FIG. 1B. In FIG. 1B, an upper mold 20a and a lower mold 20b form a transfer mold. When the lead frame 46 mounted with the semiconductor element 1 and having the wires 10 bonded thereto as shown in FIG. 1A is loaded between the upper and lower molds 20a and 20b.

A plunger 22 arranged on the upper mold 20a heats and presses a resin tablet (mold resin 3) which is indicated by a dot-pattern, so that the melted resin tablet flows into a cavity part formed between the upper and lower molds 20a and 20b via a cull part 43, a runner part 44 and a gate part 45. The cavity formed between the upper and lower molds 20a and 20b has a shape corresponding to the outer shape of the semiconductor device 60. Hence, by filling the rein into this cavity part, the mold resin 3 is formed into a package having a predetermined shape.

According to the conventional resin filling method, the mold resin 3 remains at the cull part 43, the runner part 44 and the gate part 45, integrally to the package part of the semiconductor device 60. Accordingly, when the semiconductor device 60 is removed from the upper and lower molds 20a and 20b, the remaining resin is broken at the gate part 45 and the broken off resin is thrown away.

On the other hand, as is well known, the semiconductor element 1 generates heat when driven. In the case of the semiconductor device 60 which is produced in the above described manner, the heat generated from the semiconductor element 1 thermally conducts via the mold resin 3, and the heat radiation takes place particularly at the back surface of the package where the thickness of the mold resin 3 is thin. The back surface of the package is the bottom surface of the mold resin 3 in FIG. 1C.

As described above, the main function of the mold resin 3 is to protect the semiconductor element 1 and the wires 10. However, the mold resin 3 must also have a satisfactory adhesive strength. In other words, if the adhesive strength of the mold resin 3 with respect to the semiconductor element 1 and the wires 10 provided within the mold resin 3 is weak, the semiconductor element 1 and the wires 10 may move within the package. If the semiconductor element 1 and the wires 10 move within the package, it becomes impossible to positively protect the semiconductor element 1 and the wires 10, and the reliability of the semiconductor device 60 will deteriorate.

But when carrying out the transfer molding, it is essential to separate the upper and lower molds 20a and 20b from the molded package, and the upper and lower molds 20a and 20b can be separated more satisfactorily if the above adhesive strength is not too strong. For this reason, a mold release agent which facilitates the separation of the upper and lower molds 20a and 20b is conventionally added to the mold resin 3. The kind and quantity of this mold release agent that is to be added are selected to optimize the balance between the reliability of the semiconductor device 60 and the mold release (or parting) characteristic of the upper and lower molds 20a and 20b with respect to the molded package. More particularly, out of the cull part 43, the runner part 44 and the gate part 45, the mold release characteristic is poorest at the gate part 45 where the flow passage of the mold resin 3 is the narrowest. Hence, the kind and quantity of the mold release agent to be added are generally selected with reference to the mold release characteristic at the gate part 45.

However, as the size of the semiconductor device 60 is further reduced and the package becomes smaller, the cull part 43, the runner part 44 and the gate part 45 all become smaller, thereby deteriorating the mold release characteristic. For this reason, it is necessary to increase the amount of the mold release agent that facilitates the mold release as the package becomes smaller, but there was a problem in that the reliability of the semiconductor device 60 deteriorates if the amount of the mold release agent is increased for the reasons described above.

On the other hand, as for the heat radiation characteristic, the conventional semiconductor device 60 is designed to radiate heat via the back surface of the package. For this reason, there was a problem in that the heat generated from the semiconductor element 1 could not be released efficiently. In addition, there have been proposals to provide a plurality of radiator fins independently on the package, but the provision of the radiator fins increases the overall size of the semiconductor device 60, and there was a problem in that the provision of the independent radiator fins cannot realize the size reduction of the semiconductor device 60.

SUMMARY OF THE INVENTION

Accordingly, it is a general object of the present invention to provide a novel and useful semiconductor device and a method of producing the same, wherein the problems described above are eliminated.

Another and more specific object of the present invention is to provide a semiconductor device which can be made small while at the same time improving the mold release characteristic and the reliability of the semiconductor device, and to a method of producing such a semiconductor device.

Still another object of the present invention is to provide a semiconductor device which can be made small while at the same time realizing a satisfactory heat radiation characteristic, and to a method of producing such a semiconductor device.

A further object of the present invention is to provide a semiconductor device comprising a substrate having top and bottom surfaces, a semiconductor element mounted on the top surface of the substrate, and a resin package made of a resin and encapsulating the semiconductor element, where the substrate includes at least one resin gate hole enabling the resin to be introduced from the bottom surface of the substrate via the resin gate hole when encapsulating the semiconductor element by the resin. According to the semiconductor device of the present invention, it is possible to directly introduce the resin onto the substrate via the resin gate hole in the substrate when encapsuating the semiconductor element by the resin. Hence, it becomes unnecessary to provide a cull part, a runner part, a gate part and the like in the molds that is used for the resin mold. In addition, it is possible to reduce the contact area between the resin and the molds, and the kind and amount of mold release agent to be added to the resin may be selected without taking into account the mold release characteristic. As a result, it becomes possible to use a resin having a large adhesive strength, and the reliability of the semiconductor device can be improve even when the size of the semiconductor device is reduced.

Another object of the present invention is to provide a semiconductor device comprising a circuit, a semiconductor element having a top surface and mounted on the circuit, a frame body provided on the circuit and surrounding the semiconductor element in a state where a gap is formed between the semiconductor element and the frame body, and a resin package made of a resin filled on an inner side of the frame body and encapsulating the semiconductor element, where the frame body includes a resin gate hole which opens at a surface other than a surface confronting the top surface of the semiconductor element and enables the resin to be introduced on the inner side of the frame body via the resin gate hole when encapsulating the semiconductor element by the resin. According to the semiconductor device of the present invention, it is possible to reduce the contact area of the rein and the molds, because the semiconductor element is encapsulated by the resin by introducing the resin on the inner side of the frame body via the resin gate hole that opens at the surface of the circuit other than the surface confronting the top surface of the semiconductor element. Hence, the kind and amount of mold release agent to be added to the resin may be selected without taking into account the mold release characteristic. Therefore, it is possible to use a resin having a high adhesive strength, and the reliability of the semiconductor device can be improved even when the size of the semiconductor device is reduced.

Still another object of the present invention is to provide a method of producing a semiconductor device comprising the steps of (a) forming a resin gate hole penetrating a substrate and arranging wiring layers on a predetermined surface of the substrate, (b) mounting a semiconductor element on the predetermined surface of the substrate and electrically connecting the semiconductor element and the wiring layers, (c) loading the substrate mounted with the semiconductor element into molds so that an end of the resin gate hole opposite to the predetermined surface of the substrate faces a plunger pot of the molds, and filling a resin supplied from the plunger pot to a side of the substrate mounted with the semiconductor element via the resin gate hole, and (d) forming external connecting terminals on the circuit, the external connecting terminals being used to electrically connect the semiconductor device to an outside element. According to the method of the present invention, it is possible to directly introduce the resin onto the substrate via the resin gate hole in the substrate when encapsuating the semiconductor element by the resin. Hence, it becomes unnecessary to provide a cull part, a runner part, a gate part and the like in the molds that is used for the resin mold. In addition, it is possible to reduce the contact area between the resin and the molds, and the kind and amount of mold release agent to be added to the resin may be selected without taking into account the mold release characteristic. As a result, it becomes possible to use a resin having a large adhesive strength, and the reliability of the semiconductor device can be improve even when the size of the semiconductor device is reduced.

A further object of the present invention is to provide a method of producing a semiconductor device comprising the steps of (a) forming a substrate which makes contact with side surfaces of a semiconductor element and surrounds the semiconductor element to hold the semiconductor element, (b) providing a circuit electrically connected to the semiconductor element and having external connecting terminals for electrically connecting the semiconductor element to an outside element, and (c) encapsulating the semiconductor element by a resin. According to the method of the present invention, the contact area between the semiconductor element and the substrate is large because the substrate surrounds the semiconductor element. For this reason, it is possible to positively release the heat generated from the semiconductor element via the substrate, and the heat radiation characteristic of the semiconductor element can be improved. In addition, since the substrate for holding the semiconductor element is used to release the heat generated from the semiconductor element, it is possible to prevent the size of the semiconductor device from increasing.

Another object of the present invention is to provide a method of producing a semiconductor device comprising the steps of (a) forming a plurality of divided substrates forming a substrate, (b) forming the substrate which surrounds a semiconductor element by bonding the divided substrates to the semiconductor element using a bond material, (c) providing a circuit on the substrate and electrically connecting the circuit and the semiconductor element, (d) loading the substrate mounted with the semiconductor element into molds having a plunger pot, and filling a resin supplied from the plunger pot so as to encapsulate a surface of the semiconductor element electrically connected to the circuit, and (e) forming external connecting terminals on the circuit, where the external connecting terminals are used to electrically connect the semiconductor device to an outside element. According to the method of the present invention, it is possible to directly introduce the resin onto the substrate via the resin gate hole in the substrate when encapsuating the semiconductor element by the resin. Hence, it becomes unnecessary to provide a cull part, a runner part, a gate part and the like in the molds that is used for the resin mold. In addition, it is possible to reduce the contact area between the resin and the molds, and the kind and amount of mold release agent to be added to the resin may be selected without taking into account the mold release characteristic. As a result, it becomes possible to use a resin having a large adhesive strength, and the reliability of the semiconductor device can be improve even when the size of the semiconductor device is reduced.

Other objects and further features of the present invention will be apparent from the following detailed description when read in conjunction with the accompanying drawings.

BRIEF DESCRIPTION OF THE DRAWINGS

FIGS. 1A, 1B send 1C respectively are cross sectional views for explaining an example of a conventional semiconductor device and a method of producing the same;

FIGS. 16A, 16B, 16C, 16D, 16E and 16F respectively are cross sectional views for explaining a first embodiment of a method of producing the semiconductor device according to the present invention;

FIGS. 20A, 20B, 20C, 20D and 20E respectively are cross sectional views for explaining a fourth embodiment of the method of producing the semiconductor device according to the present invention;

FIGS. 21A and 21B respectively are cross sectional views for explaining a method of producing a mechanical via;

FIGS. 67A, 67B, 67C, 67D, 67E and 67F respectively are cross sectional views for explaining a sixth embodiment of the method of producing the semiconductor device according to the present invention;

FIGS. 68A, 68B, 68C, 68D, 68E and 68F respectively are cross sectional views for explaining a seventh embodiment of the method of producing the semiconductor device according to the present invention;

FIGS. 69A, 69B, 69C and 69D respectively are cross sectional views for explaining an eighth embodiment of the method of producing the semiconductor device according to the present invention;

DESCRIPTION OF THE PREFERRED EMBODIMENTS

FIGS. 2 through 33 are diagrams for explaining a first aspect of the present invention, and FIGS. 34 through 72 are diagrams for explaining a second aspect of the present invention. First, a description will be given of the first aspect of the present invention, by referring to FIGS. 2 through 33.

Figure 2:
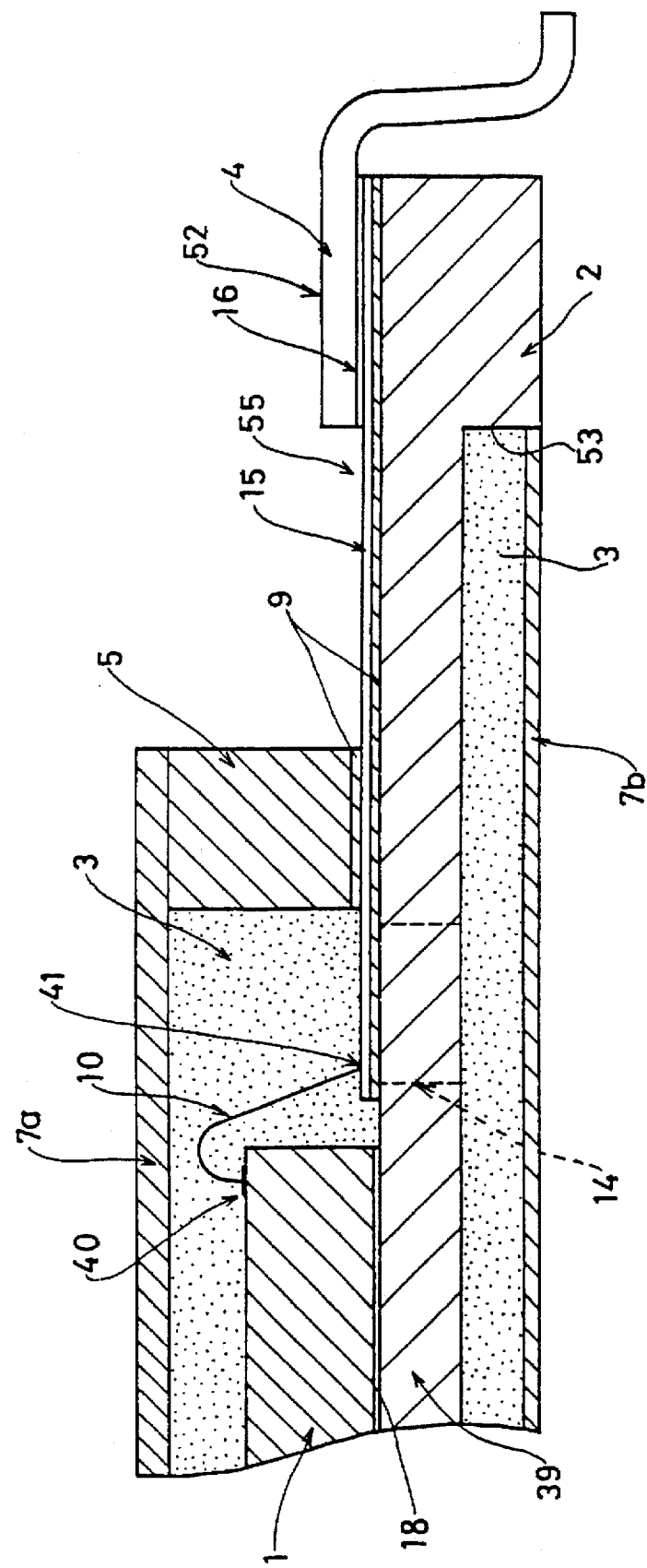
FIG. 2 is a cross sectional view showing an important part of a first embodiment of a semiconductor device according to the present invention.
Figure 3:
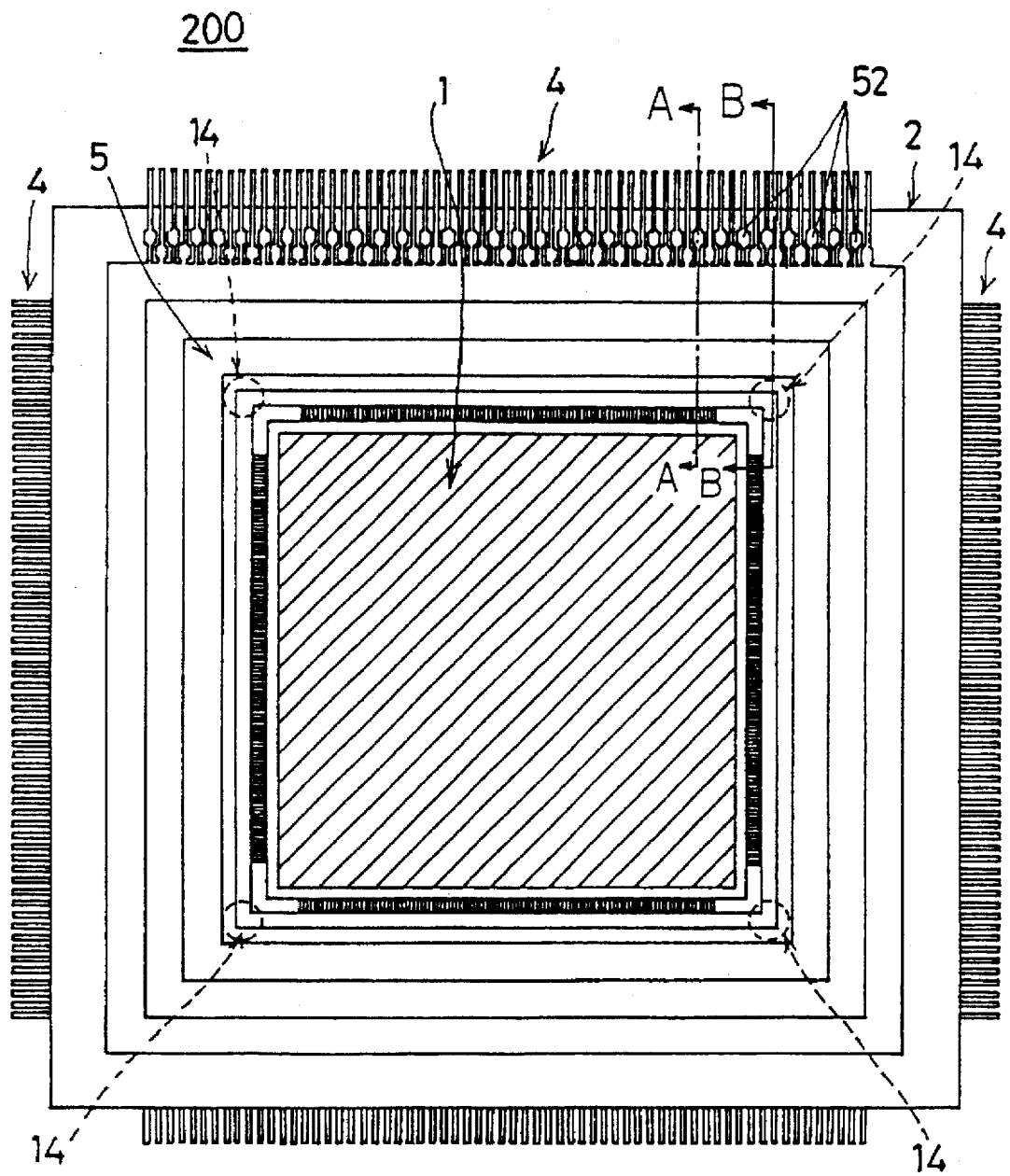
FIG. 3 is a plan view showing the first embodiment of the semiconductor device.
Figure 4:
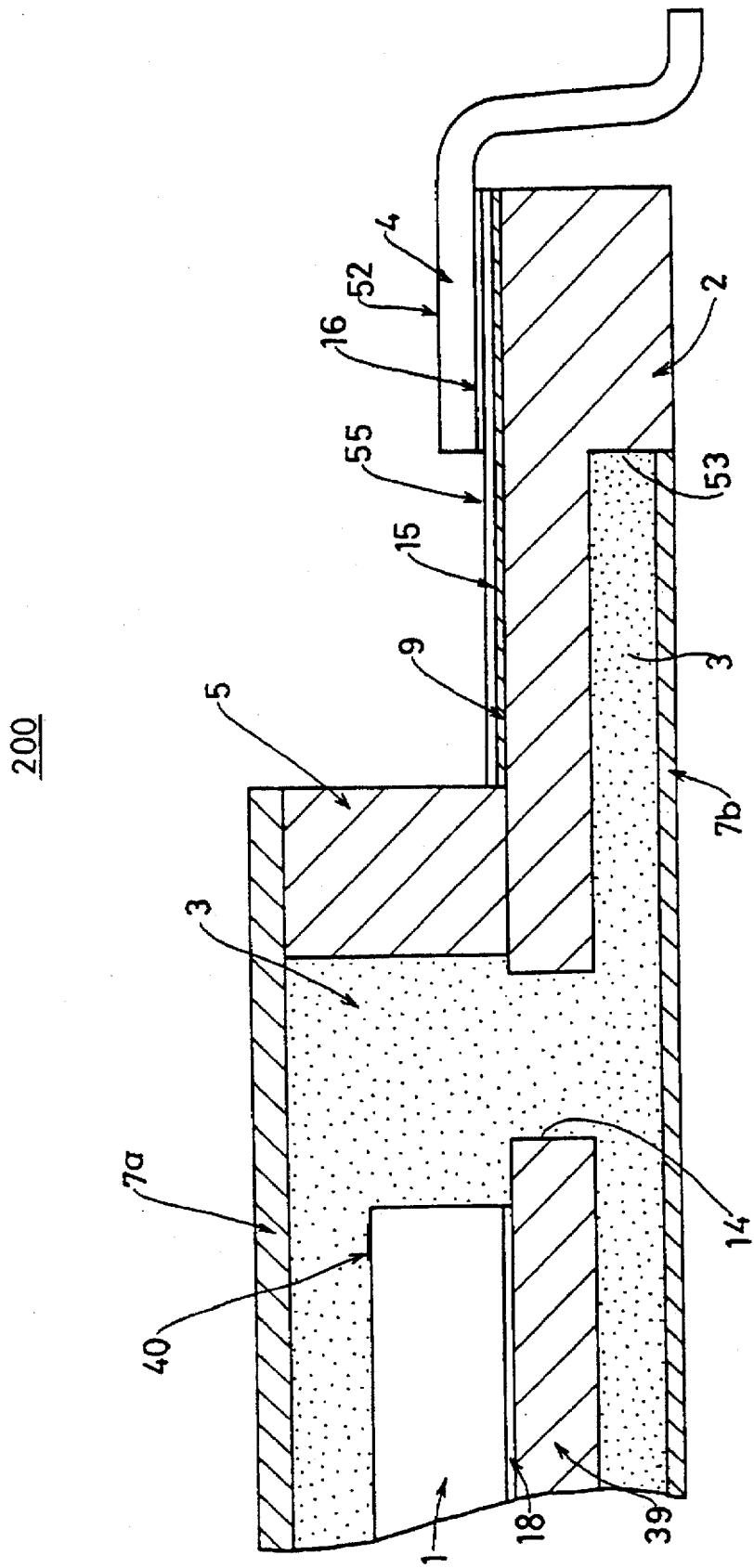
FIG. 4 is a cross sectional view showing another important part of the first embodiment.

FIGS. 2 through 4 show a first embodiment of a semiconductor device according to the present invention employing the first aspect of the present invention. FIG. 3 shows a plan view of the first embodiment of the semiconductor device. FIG. 2 shows a cross sectional view along a line A—A in FIG. 3, and FIG. 4 shows a cross sectional view along a line B—B in FIG. 3.

In FIGS. 2 through 4, a semiconductor element 1 of a semiconductor device 200 is fixed on a die-pad 39 of a base substrate 2 by a die-bond layer 18. This substrate 2 is made of a metal material having a satisfactory thermal conductivity, and a resin filling recess 53 is formed on the lower portion of this substrate 2. In addition, resin gate holes 14 penetrate the substrate 2. The upper end of the resin gate hole 14 opens to the side of the substrate 2 provided with the semiconductor element 1, and the lower end of the resin gate hole 14 opens within the resin filling recess 53, as may be seen from FIG. 4.

A multi-level (or multi-layer) wiring (or interconnection) circuit 55 is arranged on the side of the substrate 2 provided with the semiconductor element 1. This multi-level circuit 55 is made up of insulator layers 9 and a wiring layer 15, and in this embodiment, the wiring layer 15 is sandwiched between the insulator layers 9. The inner end portion of the multi-level circuit 55 is electrically connected to electrodes pad 40 on the top surface of the semiconductor element 1 via wires 10. Outer leads 4 which become external connecting terminals for connecting the semiconductor device 200 and connecting terminals formed on a mounting substrate (not shown) are arranged on the outer end portion of the multi-level circuit 55. The outer leads 4 are bonded on the wiring layer 15 by a conductive bonding agent 16, and are bent downwards into a gull-wing shape. The top surface of the outer lead 4 forms a test pad portion 52 to which a probe pin connects when carrying out a test or the like.

A frame body 5 is arranged at a predetermined position on the top portion of the substrate 2 so as to surround the semiconductor element 1, and an upper lid member 7a is arranged on the upper portion of this frame body 5. The frame body 5 and the upper lid member 7a are both made of a metal material having a satisfactory thermal conductivity. The frame body 5 and the upper lid member 7a are bonded by soldering, bonding, welding or the like.

Figure 33A:
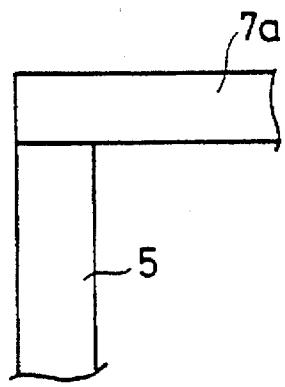
FIGS. 33A, 33B, 33C, 33D and 33E respectively are cross sectional views for explaining methods of connecting a frame body and an upper lid member.
Figure 33B:
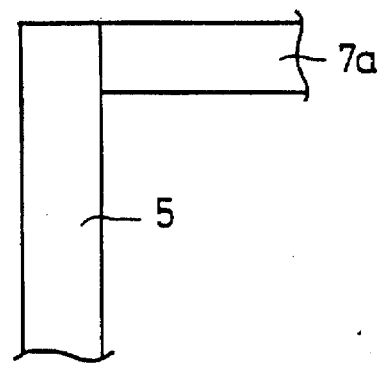
Figure 33C:
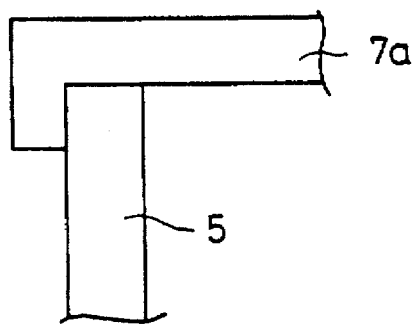
Figure 33D:
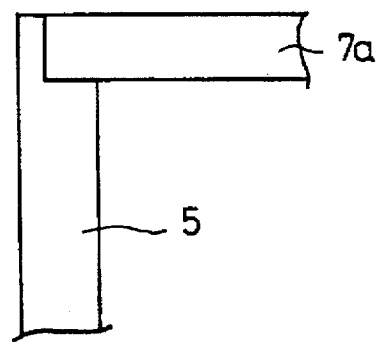
Figure 33E:
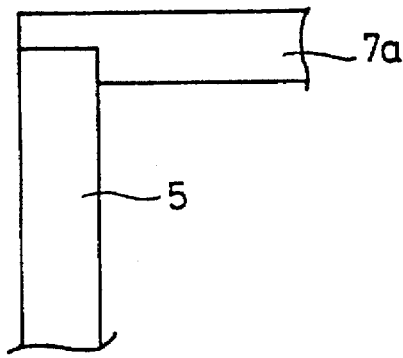

FIGS. 33A through 33E show bonded states of the frame body 5 and the upper lid member 7a. FIG. 33A shows a case where the two are bonded in a state where the upper lid member 7a is placed on top of the frame body 5. FIG. 33B shows a case where the two are bonded in a state where the upper lid member 7a is place on the side of the frame body 5. FIG. 33C shows a case where a flange is provided on an outer peripheral portion of the upper lid member 7a and this flange is bonded on the outer top edge portion of the frame body 5. FIG. 33D shows a case where a stepped portion is formed on the top edge portion of the frame body 5, and the top lid member 7a is inserted into and bonded to this stepped portion. Further, FIG. 33E shows a case where a stepped portion is formed on the outer side edge portion of the upper lid member 7a, and this stepped portion is inserted into and bonded to the frame body 5.

Returning now to the description of FIGS. 2 through 4, the frame body 5 and the upper lid member 7a are provided on the side of the substrate 2 provided with the semiconductor element 1. Hence, the semiconductor element 1 is positioned within a space formed by the substrate 2, the frame body 5 and the upper lid member 7a. A resin 3 indicated by a dot-pattern is filled into this space formed by the substrate 2, the frame body 5 and the upper lid member 7a.

As will be described later in conjunction with a method of producing the semiconductor device 200, the resin 3 is filled from the resin filling recess 53 and is fills the space formed by the substrate 2, the frame body 5 and the upper lid member 7a via the resin gate holes 14. In other words, the resin 3 is directly filled into the space formed by the substrate 2, the frame body 5 and the upper lid member 7a via the resin filling recess 53 and the resin gate holes 14. In addition, a lower lid member 7b is arranged at the bottom portion of the resin filling recess 53 that is filled with the resin 3. This lower lid member 7b prevents the resin 3 from leaking outside the substrate 2.

Because it is possible to fill the resin 3 directly into the side of the substrate 2 provided with the semiconductor element 1 via the resin filling recess 53 and the resin gate holes 14, it is unnecessary to provide a cull part, a runner part, a gate part and the like on the molds that are used when filling the resin 3. In addition, the contact area between the resin 3 and the molds can be reduced, thereby making it possible to select the kind and amount of mold release agent to be added to the resin 3 without having to take into consideration the mold release characteristic.

Therefore, it is possible to use as the resin 3 a resin having a high adhesive strength, and the reliability of the semiconductor device 200 can be improved even when the size of the semiconductor device 200 is reduced. Moreover, since there will be no resin remaining at the cull part, the runner part, the gate part and the like of the molds, it is possible to minimize the consumption of the resin 3 and accordingly reduce the cost of the semiconductor device 200. In this embodiment, a resin having a high adhesive strength and added with no mold release agent is used as the resin 3.

Figure 5:
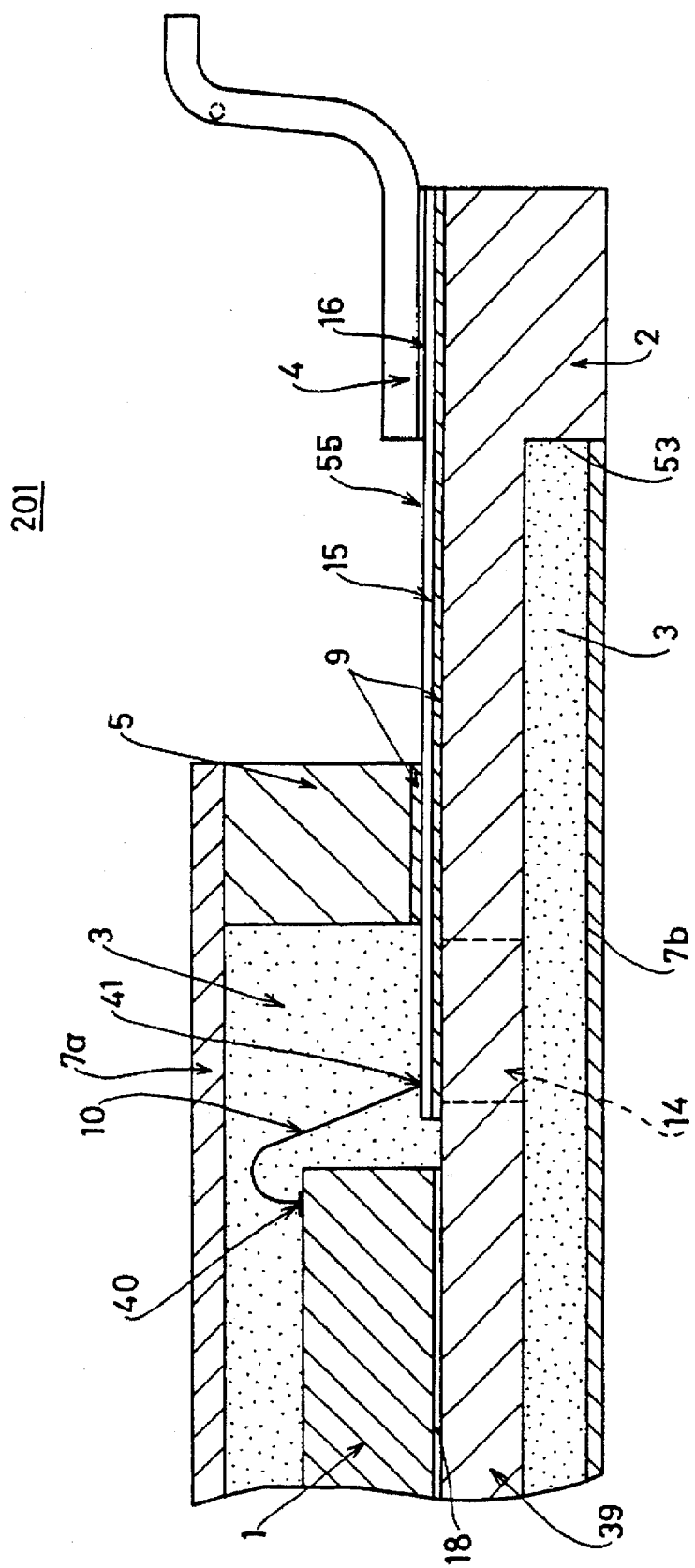
FIG. 5 is a cross sectional view showing an important part of a second embodiment of the semiconductor device according to the present invention.

FIG. 5 shows a cross section of a second embodiment of the semiconductor device according to the present invention employing the first aspect of the present invention. In FIG. 5, those parts which are the same as those corresponding parts in FIGS. 2 through 4 are designated by the same reference numerals, and a description thereof will be omitted.

The basic construction of a semiconductor device 201 shown in FIG. 5 is the same as that of the semiconductor device 200 described above. However, the semiconductor device 201 is characterized in that the outer leads 4 arranged on the outer end portion of the multi-level circuit 55 are bend upwards into the gull-wing shape.

According to this second embodiment, the semiconductor device 201 is mounted on the mounting substrate in a state where the semiconductor device 201 shown in FIG. 5 is arranged upside-down, that is, in a state where the substrate 2 is arranged on the top and the frame body 5 and the upper lid member 7a are arranged on the bottom. By employing this mounting arrangement, it is possible to protect the frame body 5 and the upper lid member 7a which are relatively weak strengthwise as compared to the substrate 2, by the substrate 2. As a result, it is possible to improve the reliability of the semiconductor device 201 after it is mounted on the mounting substrate. Furthermore, it is possible to select the mounting arrangement from two kinds depending on whether the outer leads 4 are bent upwards or downwards, and the degree of freedom with which the semiconductor device can be mounted is improved.

Figure 6:
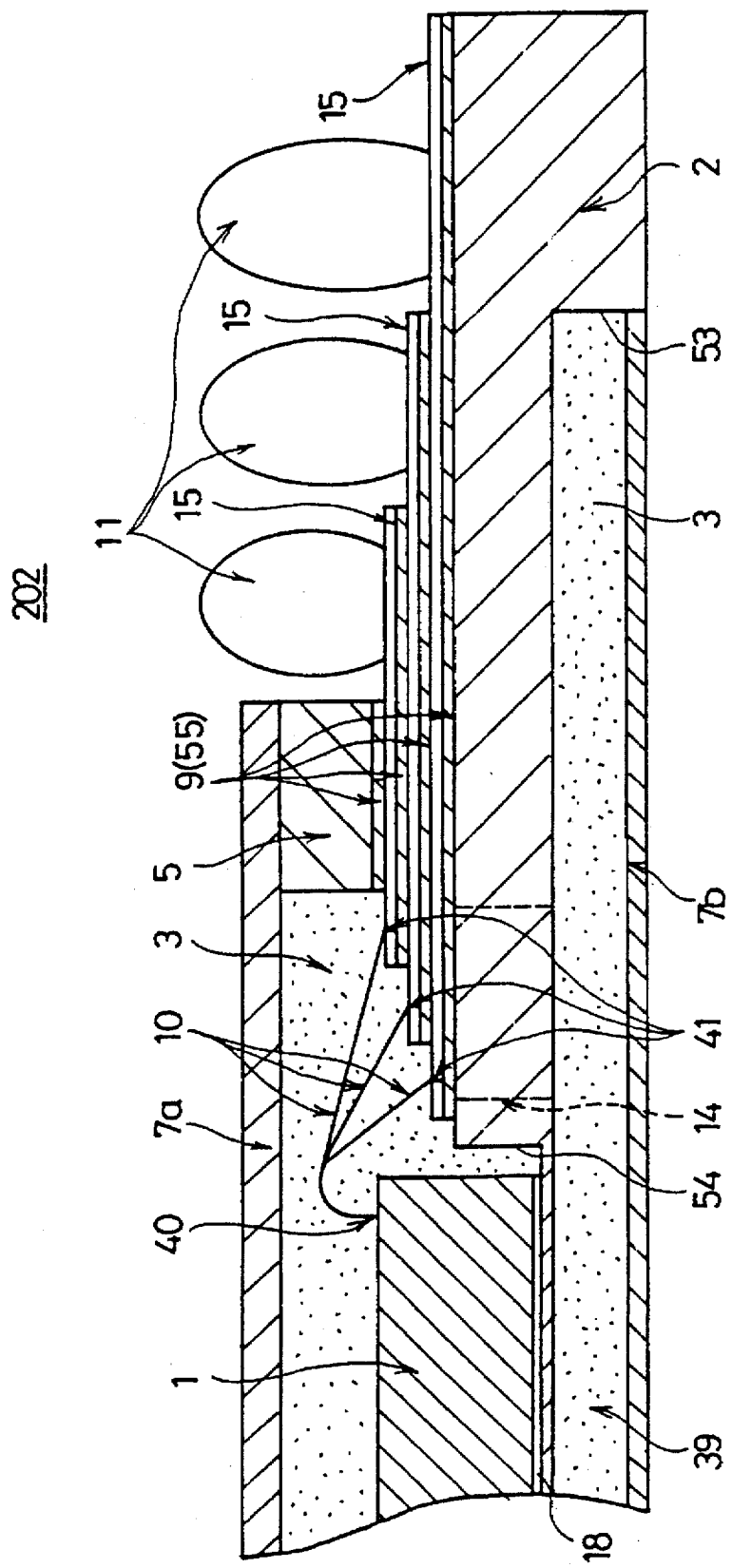
FIG. 6 is a cross sectional view showing an important part of a third embodiment of the semiconductor device according to the present invention.

FIG. 6 shows a cross section of a third embodiment of the semiconductor device according to the present invention employing the first aspect of the present invention. In FIG. 6, those parts which are the same as those corresponding parts in FIGS. 2 through 4 are designated by the same reference numerals, and a description thereof will be omitted.

A semiconductor device 202 shown in FIG. 6 is characterized in that the multi-level circuit 55 has a structure made up of 3 stacked wiring layers 15, bumps 11 are used as external connecting terminals to connect the semiconductor device 202 to the mounting substrate, and a counter sunk (or counterbore) part 54 is formed in the die-pad portion 39 of the substrate 2.

The multi-level circuit 55 includes the insulator layers 9 respectively interposed between each 2 adjacent ones of the 3 wiring layers 15. The right and left ends of the multi-level circuit 55 have a stepped shape as shown in FIG. 6 so that each wiring layer 15 is exposed. The wiring layers 15 which are exposed at the left stepped portion of the multi-level circuit 55 are electrically connected to the electrode pads 40 of the semiconductor element 1 via the wires 10. On the other hand, the bumps 11 are formed on the wiring layers 15 which are exposed at the right stepped portion of the multi-level circuit 55.

As described above, the counter sunk part 54 is formed in the die-pad portion 39 of the substrate 2, and the semiconductor element 1 is arranged within the counter sunk part 54. By forming the counter sunk part 54 in the substrate 2 and arranging the semiconductor element 1 within this counter sunk part 54, it is possible to make the height position of the top surface of the semiconductor element I approximately the same as the height position of the multi-level circuit 55. The wire bonding process for connecting the wires 10 is facilitated when the height positions of the top surface of the semiconductor element 1 and the height position of the multi-level circuit 55 are approximately the same.

As described above, the bumps 11 are formed on the wiring layers 15 which are exposed at the right stepped portion of the multi-level circuit 55. When mounting the semiconductor device 202 on the mounting substrate, each bump 11 (only 3 shown in FIG. 6) must have the same height from the top surface of the substrate 2. Otherwise, if the heights of the bumps 11 are not uniform, only the bumps 11 which have the high height position will make contact with the mounting substrate, and the bumps 11 having the low height position will float from the mounting substrate and make no electrical contact.

But in this embodiment, the bumps 11 are formed on the wiring layers 15 at the right stepped portion of the multi-level circuit 55. For this reason, if the sizes of the bumps 11 were the same, the height positions of the bumps 11 would become different depending on the stepped shape of the multi-level circuit 55. In this case, the differences in the height positions of the bumps 11 would correspond to the thicknesses of the insulator layers 9 and the wiring layers 15. Accordingly, when forming the bumps 11 on the multi-level circuit 55, it is necessary to carry out a process of matching the height positions of each of the bumps 11 relative to the top surface of the substrate 2.

Next, a description will be given of a method of matching the height positions of the bumps 11 relative to the top surface of the substrate 2, by referring to FIGS. 23 through 32. FIGS. 23 through 26 are diagrams for explaining a first method of matching the height positions of the bumps 11 relative to the top surface of the substrate 2, and FIGS. 27 through 32 are diagrams for explaining a second method of matching the height positions of the bumps 11 relative to the top surface of the substrate 2.

FIGS. 23A, 24A, 25A, 26, 27A, 28A, 29A, 30A, 31A and 32 are side views. On the other hand, FIGS. 23B, 24B, 25B, 27B, 28B, 29B, 30B and 31B are plan views. In FIGS. 23 through 32, those parts which are the same as those corresponding parts in FIG. 6 are designated by the same reference numerals, and a description thereof will be omitted.

Figure 23A:
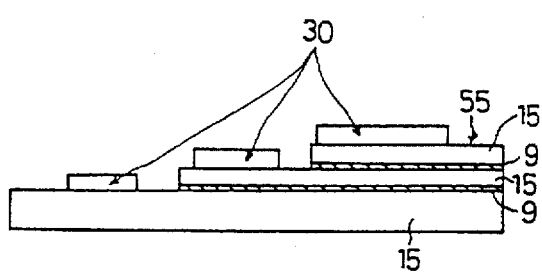
FIGS. 23A and 23B respectively are a cross sectional view and a plan view for explaining a first method of making the height position of solder bumps uniform.
Figure 23B:
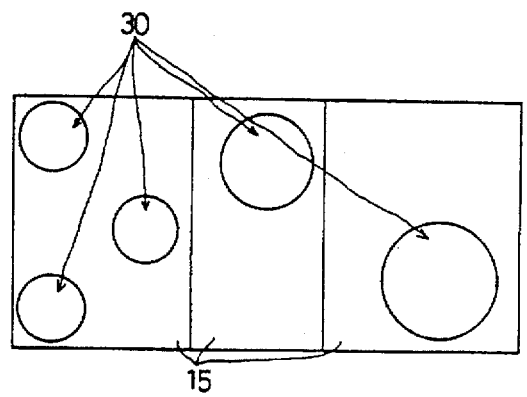

According to the first method, lands 30 are formed on the multi-level circuit 55 having the 3 wiring layers 15 which are insulated by the insulator layers 9 as shown in FIGS. 23A and 23B. The multi-level circuit 55 is formed in advance to have the stepped shape, and the insulator layers 9 are partially removed so as to expose each of the wiring layers 15 as shown in FIG. 23A. The lands 30 are formed on such exposed wiring layers 15.

The lands 30 are made of a material having a satisfactory wetting characteristic, and are formed at predetermined positions using a method such as thick film formation, deposition and plating. The areas of the lands 30 are different depending on the height position of the wiring layer 15 on which each land 30 is formed. More particularly, the land 30 formed on the lowermost wiring layer 15 has the smallest area, and the areas of the lands 30 formed on the intermediate wiring layer 15 and the uppermost wiring layer 15 successively increase compared to the smallest area.

Figure 24A:
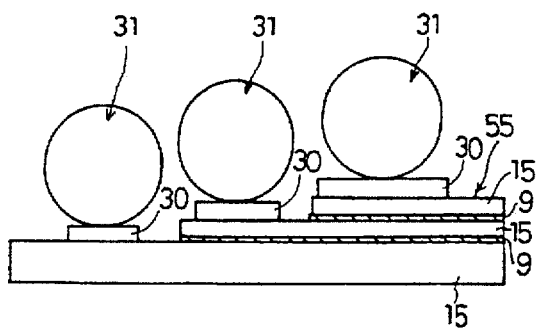
FIGS. 24A and 24B respectively are a cross sectional view and a plan view for explaining the first method of making the height position of the solder bumps uniform.
Figure 24B:
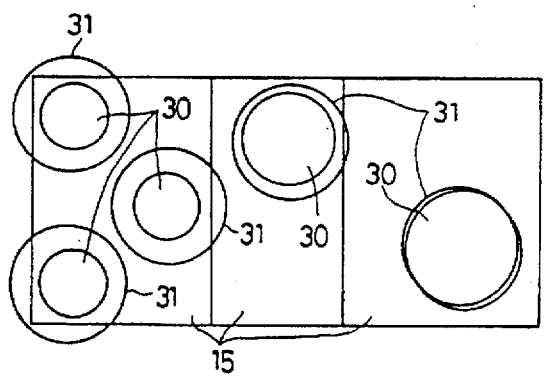

After forming the land 30 having a predetermined area on each wiring layer 15, a solder ball 31 is provided on each land 30 as shown in FIGS. 24A and 24B. The size (volume) of each of the solder balls 31 provided on the lands 30 is the same. The solder balls 31 have a uniform size at the stage shown in FIGS. 24A and 24B, and thus, the height of the top portion of the solder balls 31 from the top surface of the substrate (corresponding to the bottom surface of the lowermost wiring layer 15 in FIG. 24A) differs depending on the differences of the height positions of the lowermost, intermediate and uppermost wiring layers 15.

Figure 25A:
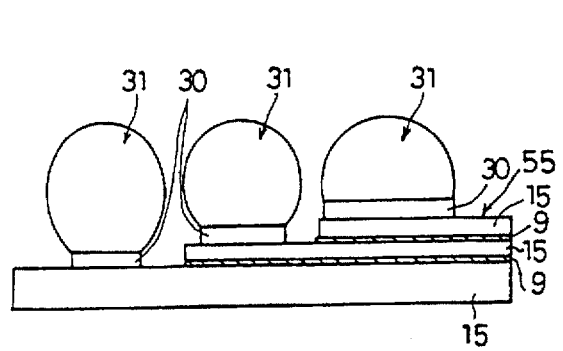
FIGS. 25A and 25B respectively are a cross sectional view and a plan view for explaining the first method of making the height position of the solder bumps uniform.
Figure 25B:
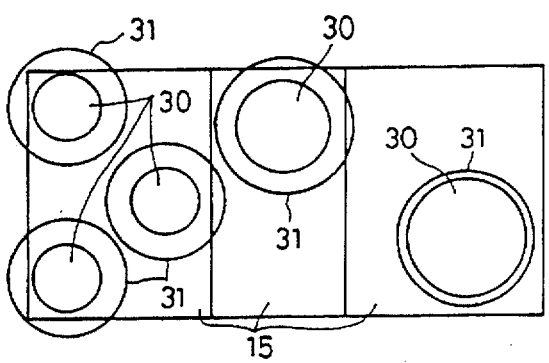

After the solder balls 31 are provided on the lands 30, a heating process is carried out to heat the multi-level circuit 55 in a reflow chamber or the like. As a result, the solder balls 31 melt and lower portions of the solder balls 31 make contact with the entire surface of the corresponding lands 30 as shown in FIGS. 25A and 25B. In addition, the upper portions of the solder balls 31 have a spherical shape due to the surface tension that is generated when the solder balls 31 melt.

As described above, the areas of the lands 30 are set different depending on the whether the land 30 is formed on the lowermost, intermediate or uppermost wiring layer 15. In other words, the so-called wetting areas are set differently depending on the height positions of the wiring layers 15. Accordingly, the solder ball 31 (solder bump) that is provided on the lowermost wiring layer 15 having the land 30 with the small area, that is, having the small wetting area, becomes tall and the cross section becomes an oval which is vertically long as shown in FIG. 25A. On the other hand, the solder ball 31 (solder bump) that is provided on the uppermost wiring layer 15 having the land 30 with the large area, that is, having the large wetting area, becomes short and the cross section becomes an oval which is horizontally long as shown in FIG. 25A. Furthermore, the area of the land 30 formed on the intermediate wiring layer 15 is an intermediate area between the areas of the lands 30 formed on the uppermost and lowermost wiring layers 15. Hence, the height and cross section of the solder ball 31 (solder bump) that is provided on the intermediate wiring layer 15 having the land 30 with the medium area respectively are between the above short and tall and between the above vertically long and the horizontally long.

Figure 26:
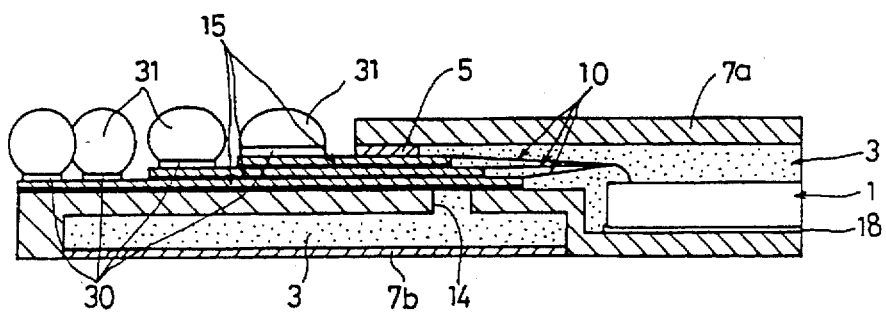
FIG. 26 is a cross sectional view for explaining the first method of making the height position of the solder bumps uniform.

As is clear from the description above, the height of the solder ball 31 (solder bump) that is formed can be controlled by controlling the area of the land 30. Thus, it is possible to make the heights of the solder balls 31 from top surface of the substrate 2 uniform by appropriately selecting the areas of the lands 30 that are formed on the wiring layers 15. FIG. 26 shows the semiconductor device having the bumps 31 having the uniform height.

Next, a description will be given of the second method of matching the height positions of the bumps 11 relative to the top surface of the substrate 2, by referring to FIGS. 27 through 32.

Figure 27A:
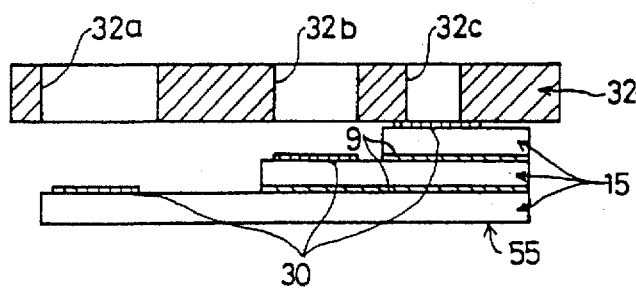
FIGS. 27A and 27B respectively are a cross sectional view and a plan view for explaining a second method of making the height position of solder bumps uniform.

According to this second method, the lands 30 are formed on the multi-level circuit 55 having the 3 wiring layers 15 and the insulator layers 9, as shown in FIG. 27A. The lands 30 have the same area regardless of the locations thereof. Similarly as in the case of the first method described above, the multi-level circuit 55 is formed in advance to have the stepped shape, and the wiring layers 15 are exposed by partially removing the insulator layers 9. The lands 30 are formed on such exposed wiring layers 15.

Figure 27B:
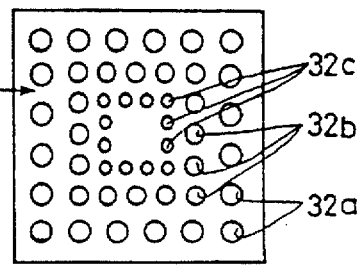

A mask 32 is arranged above the multi-level circuit 55 which is formed with the lands 30. A plurality of holes 32a through 32c having different sizes are provided in this mask 32 as shown in FIGS. 27A and 27B. Each hole 32a having the large diameter is provided at a position confronting the land 30 that is formed on the lowermost wiring layer 15. Each hole 32b having the medium diameter is provided at a position confronting the land 30 that is formed on the intermediate wiring layer 15. In addition, each hole 32c having the small diameter is provided at a position confronting the land 30 that is formed on the uppermost wiring layer 15. The mask 32 and the multi-level circuit 55 are held by a jig (not shown), for example, so that the relative positions thereof do not change.

Figure 28A:
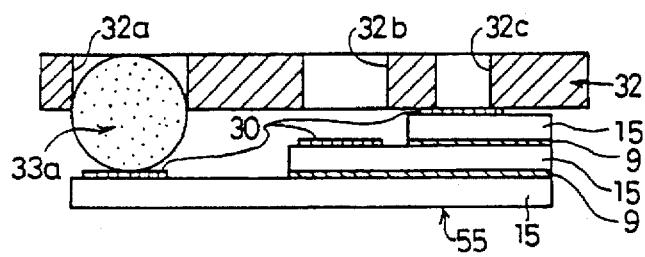
FIGS. 28A and 28B respectively are a cross sectional view and a plan view for explaining the second method of making the height position of the solder bumps uniform.
Figure 28B:
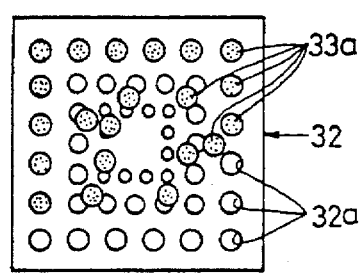

Then, as shown in FIGS. 28A and 28B, a plurality of solder balls 33a having a large diameter such that they pass through the large holes 32a but will not pass through the small and medium holes 32c and 32b are supplied from the top of the mask 32. As a result, the large solder balls 33a enter within the large holes 32a in the mask 32, and lower ends of the large solder balls 33a make contact with the lands 30. Excess large solder balls 33a are removed.

Figure 29A:
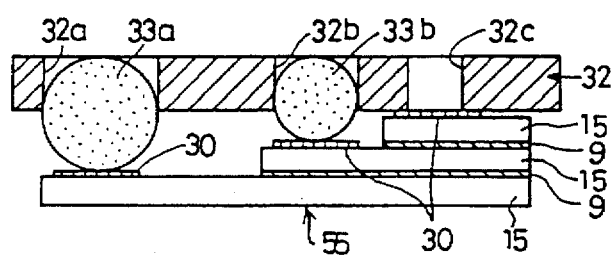
FIGS. 29A and 29B respectively are a cross sectional view and a plan view for explaining the second method of making the height position of the solder bumps uniform.
Figure 29B:
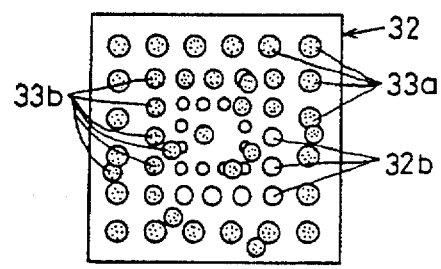

After all of the large holes 32a in the mask 32 are filled by the large solder balls 33a, a plurality of solder balls 33b having a medium diameter such that they pass through the medium holes 32b but will not pass through the small holes 32c are supplied from the top of the mask 32 as shown in FIGS. 29A and 29B. As a result, the medium solder balls 33b enter within the medium holes 32b in the mask 32, and lower ends of the medium solder balls 32b make contact with the lands 30. Excess medium solder balls 33b are removed.

Figure 30A:
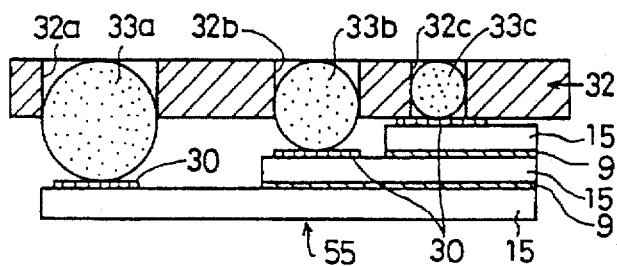
FIGS. 30A and 30B respectively are a cross sectional view and a plan view for explaining the second method of making the height position of the solder bumps uniform.
Figure 30B:
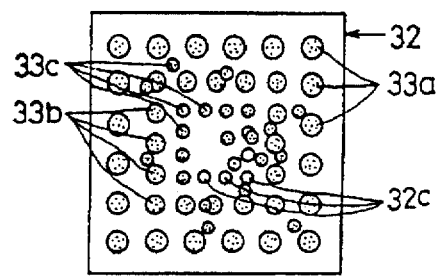

After all of the medium holes 32b in the mask 32 are filled by the medium solder balls 33b, a plurality of solder balls 33c having a small diameter such that they pass through the small holes 32c in the mask 32 are supplied from the top of the mask 32 as shown in FIGS. 30A and 30B. As a result, the small solder balls 33c enter within the small holes 32c in the mask 32, and lower ends of the small solder balls 32c make contact with the lands 30. Since the all of the large holes 32a in the mask 32 are already filled by the large solder balls 33a and all of the medium holes 32b in the mask 32 are already filled by the medium solder balls 33b, the small solder balls 33c will not enter within the large and medium holes 32a and 32b in the mask 32. Further, excess small solder balls 33c are removed if they exist.

Figure 31A:
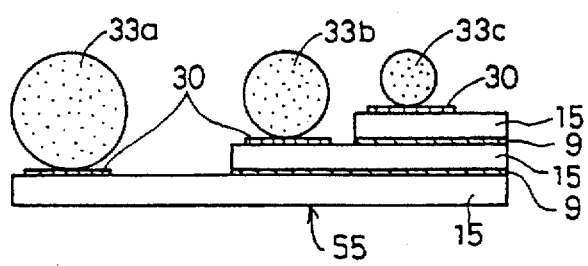
FIGS. 31A and 31B respectively are a cross sectional view and a plan view for explaining the second method of making the height position of the solder bumps uniform.
Figure 31B:
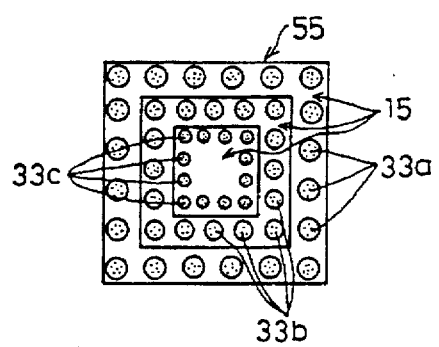

The mask 32 is removed from the multi-level circuit 55 as shown in FIGS. 31A and 31B after the solder balls 33a through 33c having the diameters corresponding to those of the holes 32a through 32c in the mask 32 are provided on the lands 30. The solder balls 33a through 33c remain on the corresponding lands 30 even after the mask 32 is removed.

After the mask 32 is removed, the multi-level circuit 55 is subjected to a heating process in a reflow chamber or the like. By this heating process, the solder balls 33a through 33c melt and form solder bumps connected to the corresponding lands 30. According to this second method, the areas of the lands 30 are the same, unlike in the first method. For this reason, the height positions of the solder bumps from the wiring layers 15 are determined by the sizes (volume) of the solder balls 33a through 33c.

Figure 32:
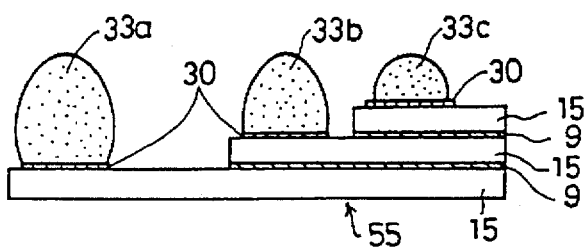
FIG. 32 is a cross sectional view for explaining the second method of making the height position of the solder bumps uniform.

The large solder ball 33a having the large volume is provided on the land 30 that is formed on the lowermost wiring layer 15 arranged at the lowermost part of the multi-level circuit 55. Since the volume of this large solder ball 33a is large, the bump formed when this large solder ball 33a melts becomes the highest. Similarly, the bump formed when the medium solder ball 33b melts becomes medium, that is, lower than the bump formed by the large solder ball 33a but higher than the bump formed by the small solder ball 33c. In addition, the bump formed when the small solder ball 33c melts becomes low, that is, lower than the bump formed by the medium solder ball 33b. Therefore, by appropriately setting the volumes of the solder balls 33a through 33c in advance, it is possible to make the heights of the bumps which are formed uniform as shown in FIG. 32.

By employing the first or second method described above, it is possible to easily make the heights of the bumps from the top surface of the substrate 2 uniform by appropriately setting the areas of the lands 30 or the volumes of the solder balls 33a through 33c, even when the bumps are formed on the stepped portions of the multi-level circuit 55.

Figure 7:
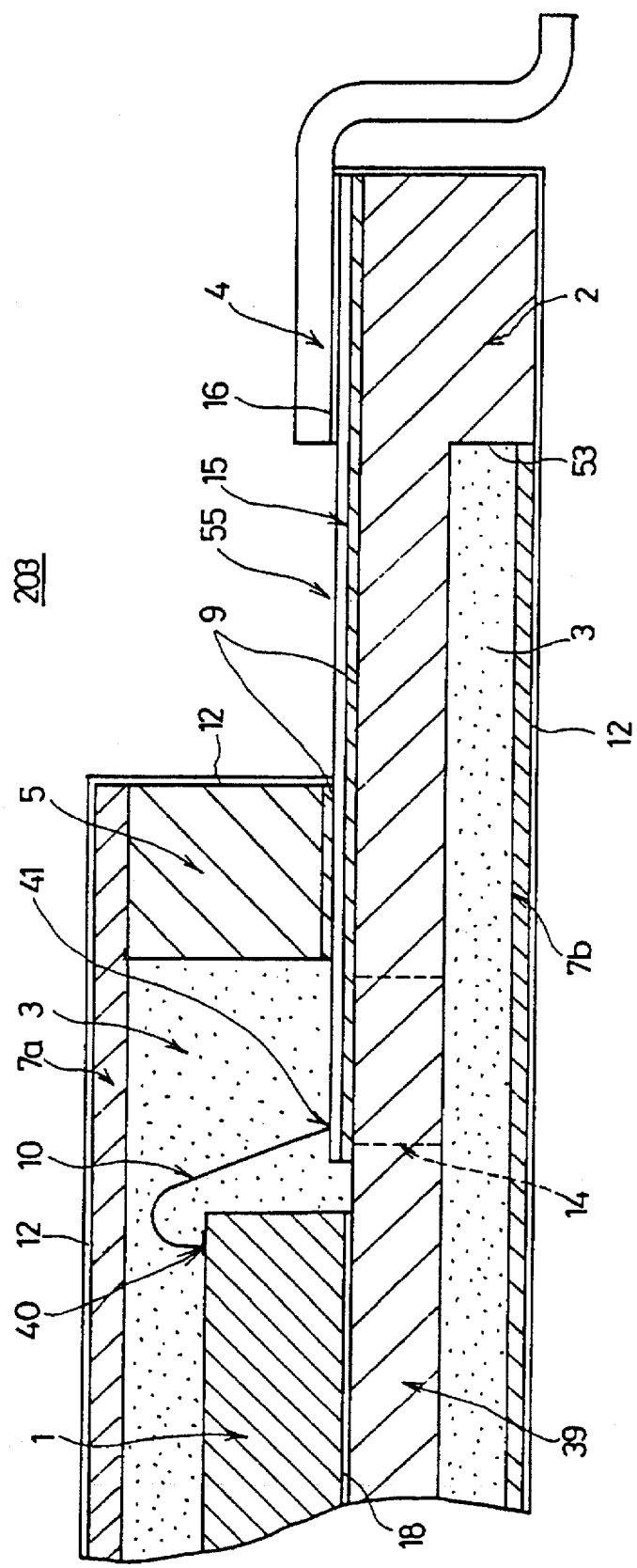
FIG. 7 is a cross sectional view showing an important part of a fourth embodiment of the semiconductor device according to the present invention.

Next, a description will be given of a fourth embodiment of the semiconductor device according to the present invention, by referring to FIG. 7. This fourth embodiment of the semiconductor device employs the first aspect of the present invention. FIG. 7 shows a cross section of the fourth embodiment of the semiconductor device. In FIG. 7, those parts which are the same as those corresponding parts in FIGS. 2 through 4 are designated by the same reference numerals, and a description thereof will be omitted.

A semiconductor device 203 shown in FIG. 7 is characterized in that a material 12 having a high thermal conductivity is formed to a predetermined thickness on the frame body 5, the upper lid member 7a, the lower lid member 7b, and the bottom surface of the substrate 2 excluding the part provided with the lower lid member 7b. The material 12 is formed on parts of the semiconductor device 203 exposed to the outside, so that the heat generated from the semiconductor element 1 is efficiently released outside the semiconductor device 203.

Figure 8:
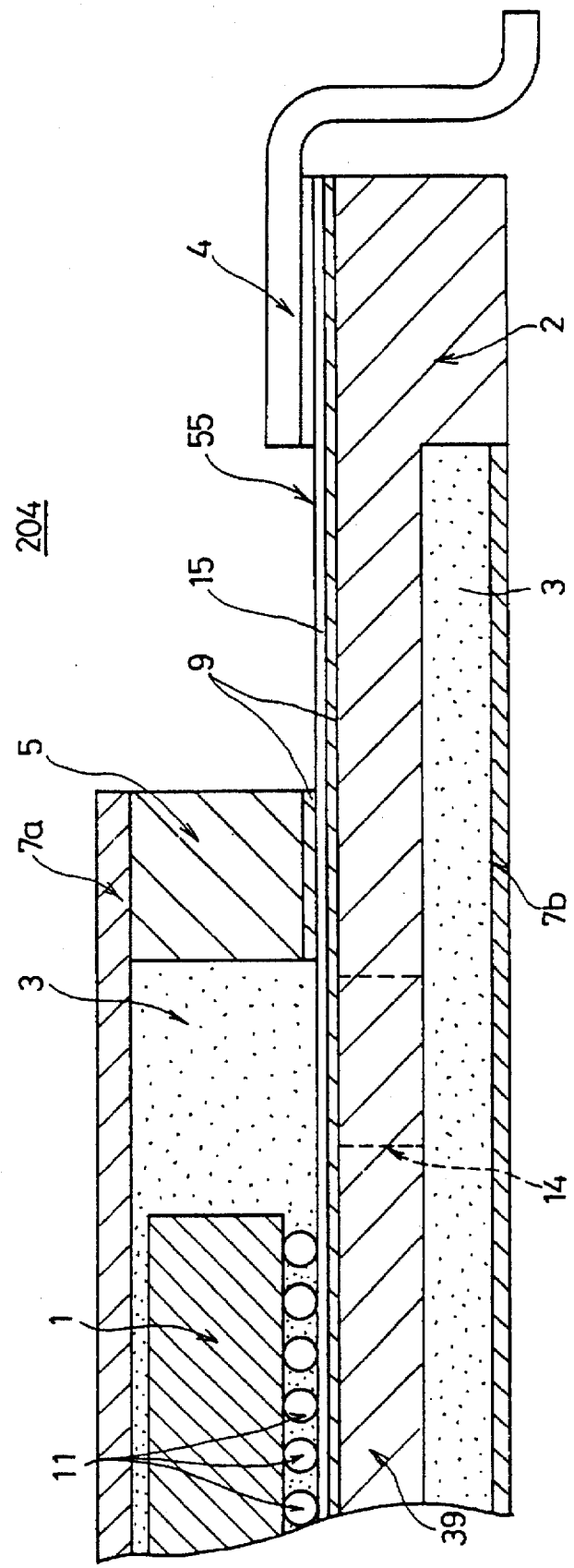
FIG. 8 is a cross sectional view showing an important part of a fifth embodiment of the semiconductor device according to the present invention.

FIG. 8 shows a cross section of a fifth embodiment of the semiconductor device according to the present invention. This fifth embodiment employs the first aspect of the present invention. In FIG. 8, those parts which are the same as those corresponding parts in FIGS. 2 through 4 are designated by the same reference numerals, and a description thereof will be omitted.

A semiconductor device 204 is characterized in that the electrical connections between the semiconductor element 1 and the multi-level circuit 55 are made by flip-chip bonding. For this reason, the multi-level circuit 55 extends on the top surface of the substrate 2 up to the position where the semiconductor element 1 is provided. In addition, the semiconductor element 1 is electrically connected to the multi-level circuit 55 using the bumps 11. According to this construction, it is possible to easily make the electrical connections between the semiconductor element 1 and the multi-level circuit 55 at a high density, even if the semiconductor element 1 has a large number of electrodes.

Figure 9:
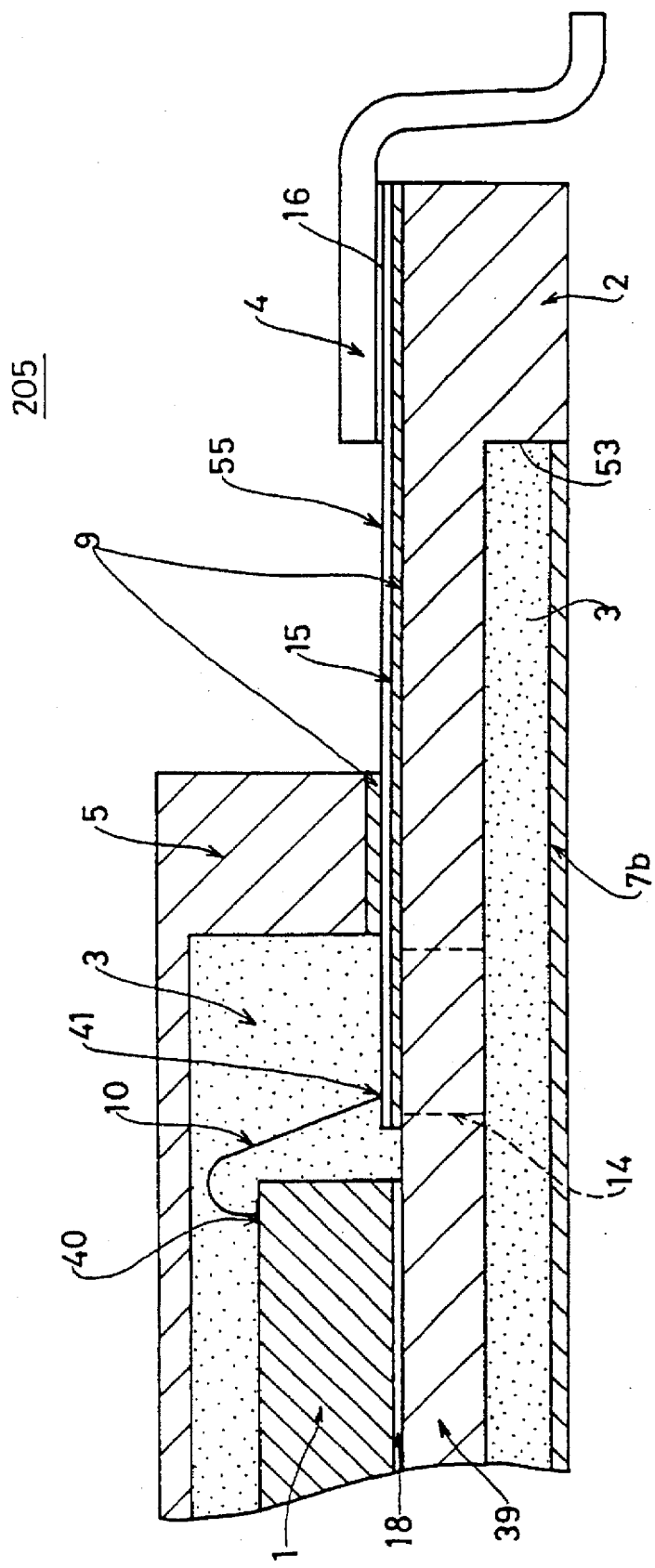
FIG. 9 is a cross sectional view showing an important part of a sixth embodiment of the semiconductor device according to the present invention.

FIG. 9 shows a cross section of a sixth embodiment of the semiconductor device according to the present invention. This sixth embodiment of the semiconductor device employs the first aspect of the present invention. In FIG. 9, those parts which are the same as those corresponding parts in FIGS. 2 through 4 are designated by the same reference numerals, and a description thereof will be omitted.

A semiconductor device 205 shown in FIG. 9 is characterized in that the frame body 5 integrally comprises the upper lid member, as compared to the first embodiment wherein the frame body 5 and the upper lid member 7a are independent parts. Although the frame body 5 shown in FIG. 9 integrally comprises the upper lid member and has an upside-down box shape, it is possible to easily form this frame body 5 by deformation processing or machining process because this frame body 5 is made of a metal material. In addition, unlike the first embodiment, this embodiment can simplify the production process of the semiconductor device 205 because it is unnecessary to carry out the process of bonding the frame body and the upper lid member. As described above with reference to the first embodiment, the first aspect of the present invention can use as the resin 3 a resin which does not include a mold release agent and has a high adhesive strength, and for this reason, the resin 3 also functions as an bonding material for bonding the frame body 5 to the substrate 2.

Figure 10:
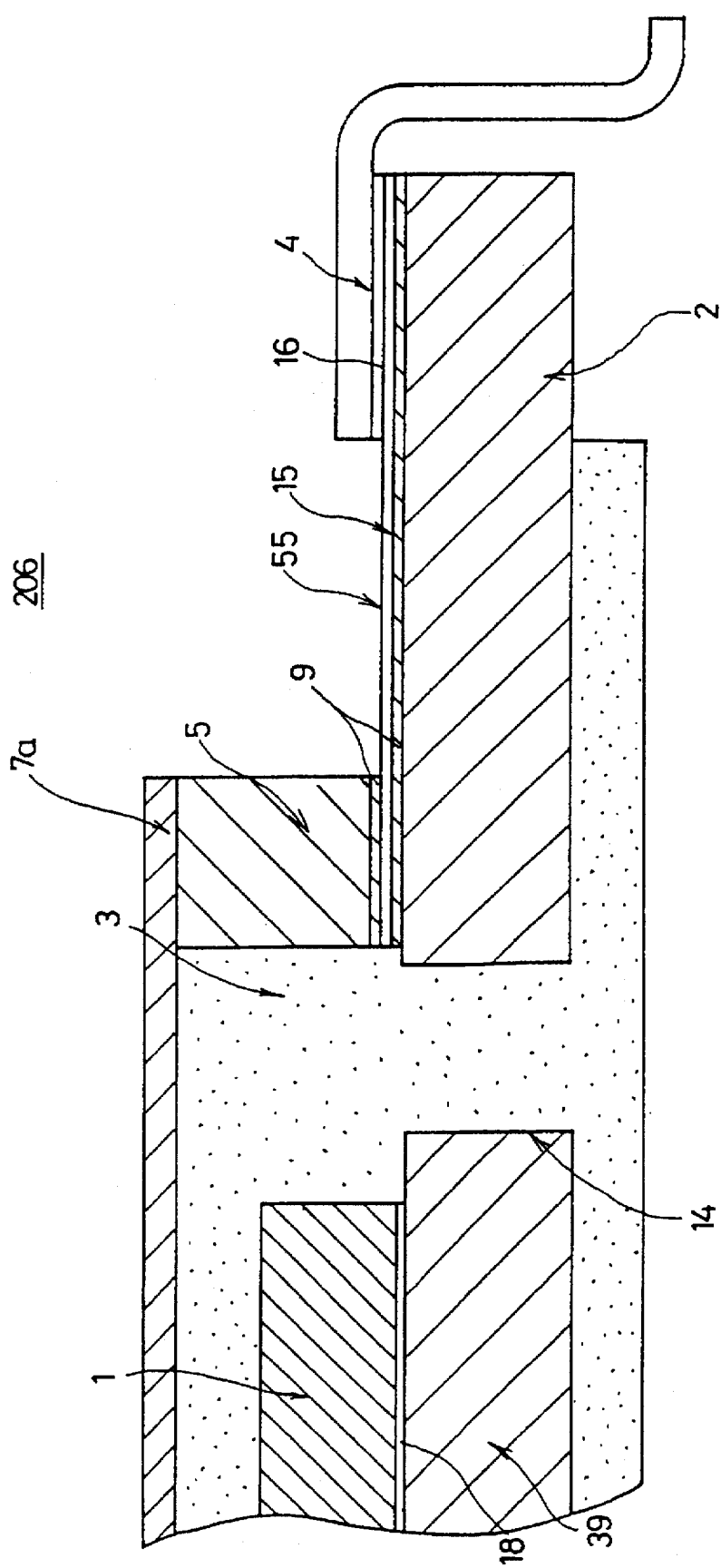
FIG. 10 is a cross sectional view showing an important part of a seventh embodiment of the semiconductor device according to the present invention.

FIG. 10 shows a cross section of a seventh embodiment of the semiconductor device according to the present invention. This seventh embodiment of the semiconductor device employs the first aspect of the present invention. In FIG. 10, those parts which are the same as those corresponding parts in FIGS. 2 through 4 are designated by the same reference numerals, and a description thereof will be omitted.

A semiconductor device 206 shown in FIG. 10 is characterized in that the resin filling recess 53 of the first embodiment is not provided. In other words, this embodiment shows that it is not essential to provide the resin filling recess 53. By not providing the resin filling recess 53, it is possible to improve the mechanical strength of the substrate 2. In addition, since it is unnecessary to form the resin filling recess 53, it is possible to facilitate the process of forming the substrate and accordingly reduce the production cost of the semiconductor device 206. In this embodiment, the resin gate holes 14 connect directly to a plunger pot of the mold that is used when filling the resin 3, and a projecting part of the resin 3 may be formed on the lower part of the substrate 2 as shown in FIG. 10. However, even if such a projecting part of the resin 3 is formed, this will not deteriorate the mounting characteristic of the semiconductor device 206.

Figure 11:
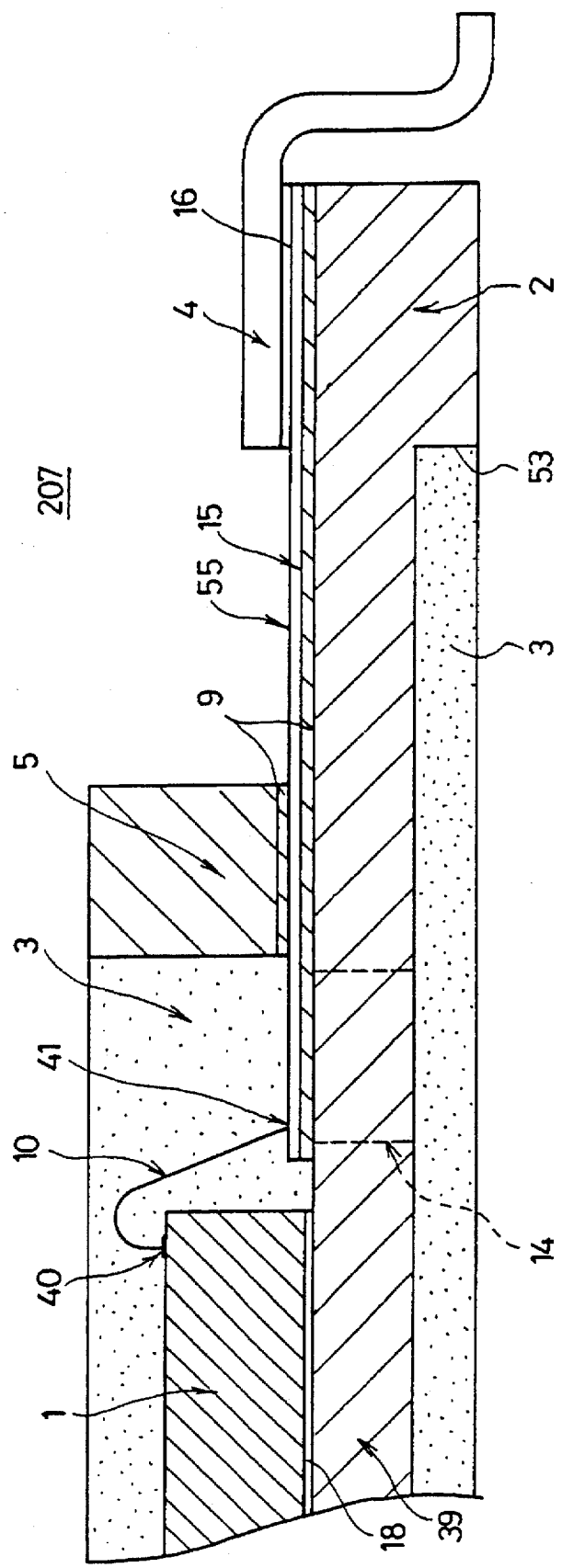
FIG. 11 is a cross sectional view showing an important part of an eighth embodiment of the semiconductor device according to the present invention.

FIG. 11 shows a cross section of an eighth embodiment of the semiconductor device according to the present invention. This eighth embodiment of the semiconductor device employs the first aspect of the present invention. In FIG. 11, those parts which are the same as those corresponding parts in FIGS. 2 through 4 are designated by the same reference numerals, and a description thereof will be omitted.

A semiconductor device 207 shown in FIG. 11 is characterized in that the upper lid member 7a and the lower lid member 7b of the first embodiment are not provided. As a result, it is possible to reduce the number of parts, and to eliminate the processes of bonding the upper lid member 7a to the frame body 5 and bonding the lower lid member 7b to the substrate 2. Therefore, the production cost of the semiconductor device 207 can be reduced, and the production process of the semiconductor device 207 can be simplified. Furthermore, it is possible to reduce the thickness of the semiconductor device 207 by an amount corresponding to the thicknesses of the upper and lower lid members 7a and 7b.

According to the semiconductor device 207, it is also possible to encapsulate the semiconductor element 1 by directly filling the resin 3 onto the substrate 2 via the resin gate holes 14 formed in the substrate 2. Hence, it is unnecessary to provide the cull part, the runner part, the gate part and the like in the molds as was required in the conventional case, and the kind and amount of the mold release agent may be selected without having to consider the mold release characteristic. As a result, it is possible to use as the resin 3 a resin having a high adhesive strength, and it is possible to improve the reliability of the semiconductor device 207 even when the size of the semiconductor device 207 is reduced. On the other hand, the exposed area of the resin 3 of the semiconductor device 207 increases compared to the other embodiments described above, and the mold release characteristic of the semiconductor device 207 becomes poorer compared to those of the embodiments described above. However, since it is unnecessary to provide the cull part, the runner part, the gate part and the like in the molds as was required in the conventional case, there is no need to take into consideration the mold release characteristic, and this eighth embodiment does not require an increased amount of mold release agent to be added to the resin 3.

Figure 12:
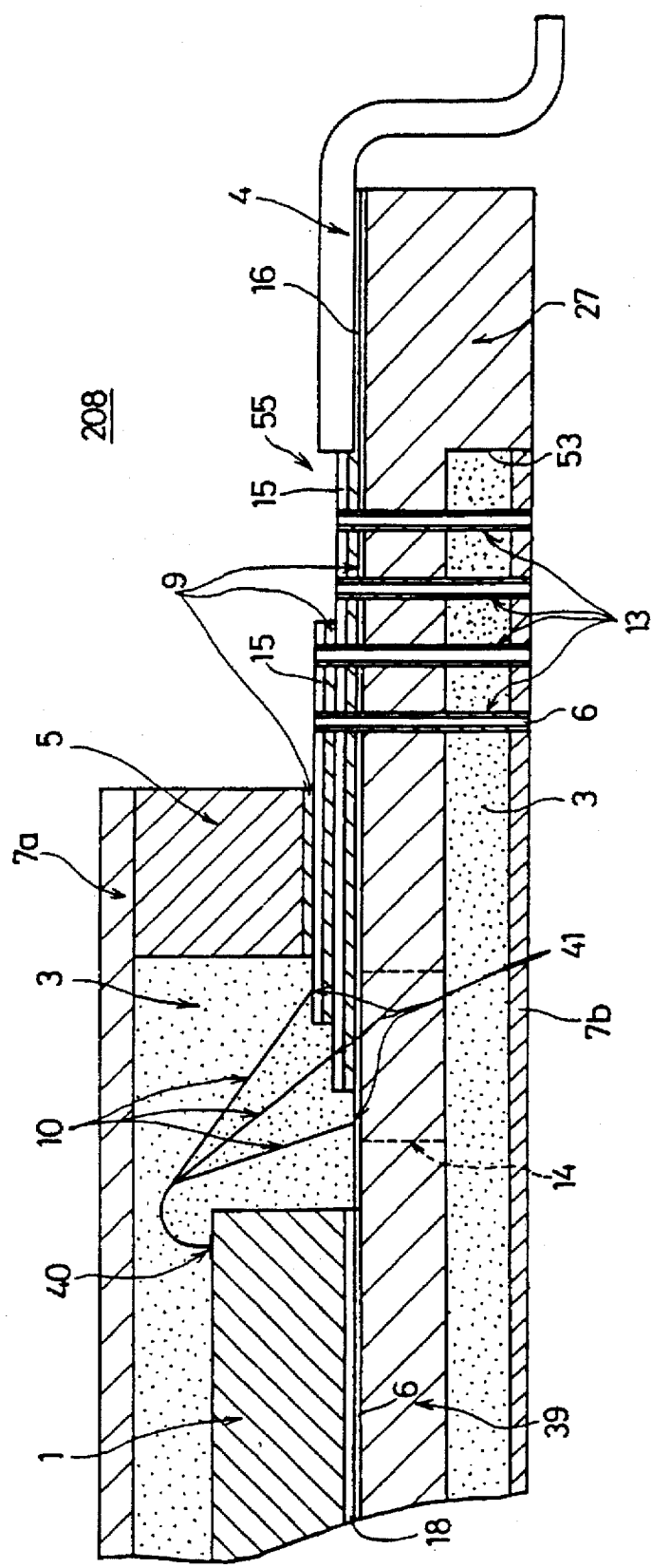
FIG. 12 is a cross sectional view showing an important part of a ninth embodiment of the semiconductor device according to the present invention.

FIG. 12 shows a cross section of a ninth embodiment of the semiconductor device according to the present invention. This ninth embodiment of the semiconductor device employs the first aspect of the present invention. In FIG. 12, those parts which are the same as those corresponding parts in FIGS. 2 through 4 are designated by the same reference numerals, and a description thereof will be omitted.

A semiconductor device 208 includes the multi-level circuit 55 that is made up of a glass epoxy substrate having 3 stacked wiring layers 15. The connections to the wiring layers 15 are made by vias 13. The via 13 is made up of a via hole which penetrates the layers of the multi-level circuit 55 and a conductor member provided inside the via hole so as to make electrical contact with one or more wiring layers 15. Hence, a connection can be made to each wiring layer 15 by the via 13. By making the electrical connections to the wiring layers 15 by the vias 13, it is possible to positively and easily make the necessary connections to the wiring layers 15, thereby improving the degree of freedom of wiring.

Figure 13:
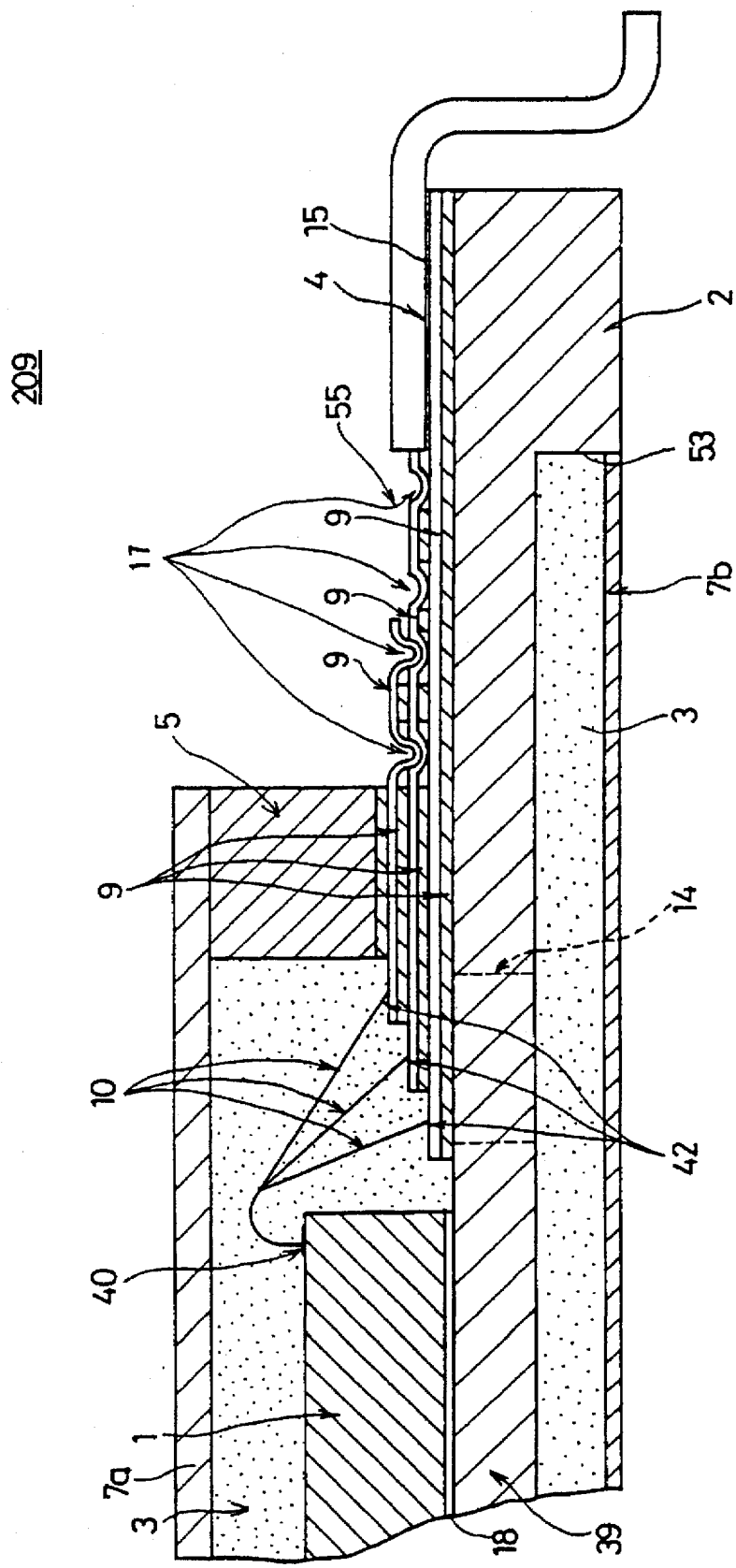
FIG. 13 is a cross sectional view showing an important part of a tenth embodiment of the semiconductor device according to the present invention.

FIG. 13 shows a cross section of a tenth embodiment of the semiconductor device according to the present invention. This tenth embodiment of the semiconductor device employs the first aspect of the present invention. In FIG. 13, those parts which are the same as those corresponding parts in FIGS. 2 through 4 are designated by the same reference numerals, and a description thereof will be omitted.

A semiconductor device 209 shown in FIG. 13 is characterized in that the connections to the wiring layers 15 of the multi-level circuit 55 are made by so-called mechanical vias 17. A description will be given of a method of forming the mechanical vias 17, by referring to FIGS. 21A and 21B.

FIG. 21A shows a case where 2 wiring layers 15 are connected by the mechanical via 17. The mechanical via 17 is obtained by subjecting the wiring layer 15 to a deformation processing to mechanically deform the wiring layer 15, so that the stacked wiring layers 15 are electrically connected. More particularly, the wiring layers 15 are made of a deformable metal material, and a hole 9a is formed in the insulator layer 9 at a position where the mechanical via 17 is to be formed. By pressing the wiring layer 15 by a jig such as a punch from above the hole 9a, the wiring layer 15 is deformed to make pressing contact (or joint) with the wiring layer 15 arranged below.

As described above, the mechanical via 17 is formed by the simple process of forming the hole 9a at a predetermined position of the insulator layer 9 and subjecting the wiring layer 15 to the deformation processing by use of the jig from above the hole 9a. Accordingly, it is possible to easily and positively connect the wiring layers 15.

On the other hand, FIG. 21B shows a case where 3 wiring layers 15 are connected by the mechanical via 17. When the uppermost wiring layer 15 is to be connected to the lowermost wiring layer 15, the load applied on the uppermost wiring layer 15 will be too large when the uppermost wiring layer 15 is simply deformed, and in this case, cracks may be generated and there is a possibility that the electrical contact among the wiring layers 15 will not be made positively.

For this reason, a metal layer 29 may interposed between the uppermost wiring layer 15 and the lowermost wiring layer 15 as shown in FIG. 21B, so that the uppermost wiring layer 15 connects to the lowermost wiring layer 15 via the metal layer 29. According to the structure shown in FIG. 21B, it is possible to reduce the load applied on the uppermost wiring layer 15, and positively realize the electrical connection of the wiring layers 15.

Figure 22A:
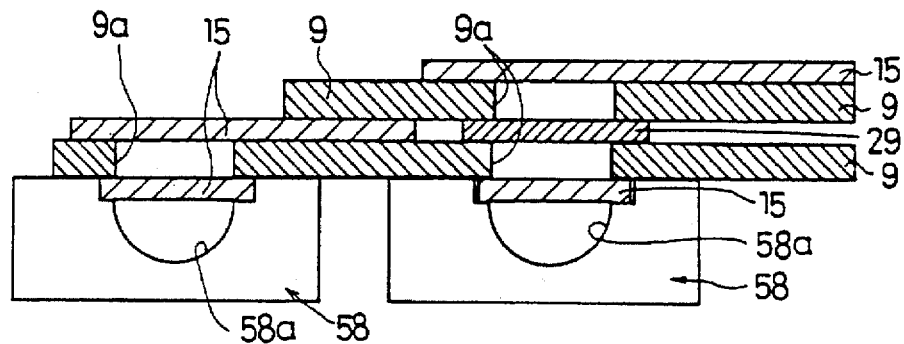
FIGS. 22A, 22B and 22C respectively are cross sectional views for explaining a method of producing a mechanical bump.
Figure 22B:
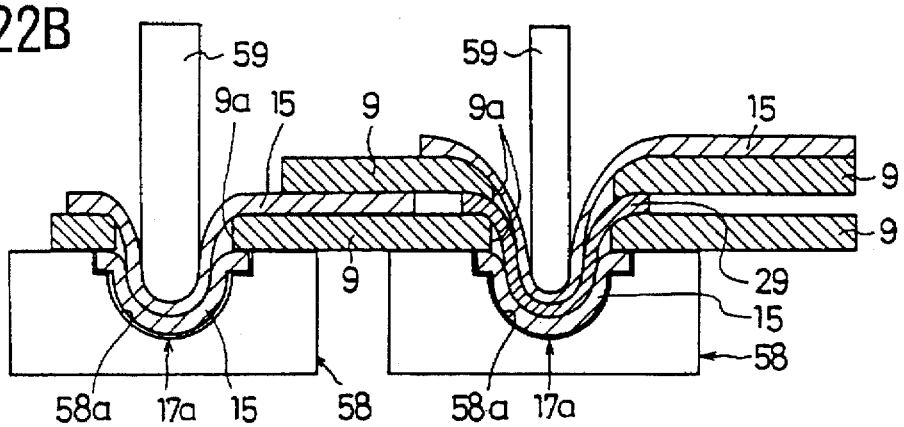
Figure 22C:
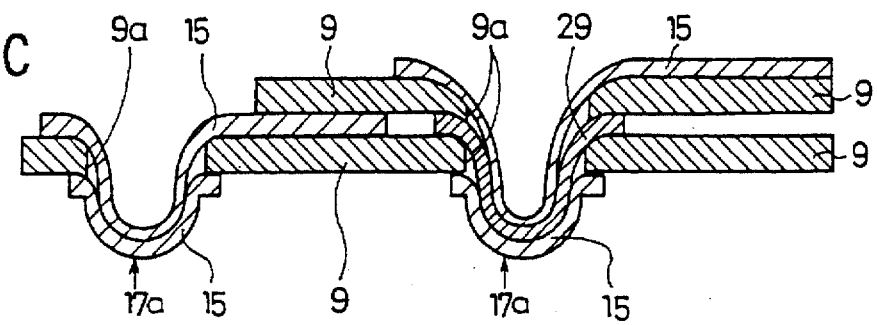

FIGS. 22A through 22C are diagrams for explaining a method of forming mechanical bumps 17a by applying the method of forming the mechanical via 17 described above with reference to FIGS. 21A and 21B . In the case of the mechanical via 17, it is sufficient to connect the wiring layers 15 of the multi-level circuit 55, and for this reason, the deformation of the wiring layers 15 is set small. However, by setting the deformation of the wiring layers 15 large so that the deformed wiring layers 15 greatly project from the multi-level circuit 55, it is possible to use this projecting part as an external connecting terminal. In other words, it is possible to use this projecting part similarly to the solder bump or the like. In this embodiment, the wiring layers 15 are greatly deformed so as to project from the multi-level circuit 55, and the projecting part is referred to as the mechanical bump 17a which is used as the external connecting terminal.

In order to form the mechanical bump 17a, the multi-level circuit 55 is formed by alternately stacking the insulator layers 9 having holes 9a and the wiring layers 15 made of a deformable metal material. This multi-level circuit 55 is placed on a mold 58 which is used for forming a bump, as shown in FIG. 22A. The mold 58 has a cavity 58a corresponding to the shape of the bump which is to be formed. The multi-level circuit 55 is placed on the mold 58 at a position such that each cavity 58a confronts the corresponding hole 9a in each insulator layer 9.

When the multi-level circuit 55 is placed on the mold 58 as described above, punches 59 are lowered towards the mold 58 as shown in FIG. 22B, so as to deform the wiring layers 15. As a result, one or more wiring layers 15 project within the cavity 58a of the mold 58 via the hole 9a in each insulator layer 9. The one or more wiring layers 15 projecting within the cavity 58a are formed into a semi-spherical shape, similarly to the shape of the cavity 58a. In addition, the projecting wiring layers 15 become electrically connected.

FIG. 22C shows the multi-level circuit 55 having the mechanical bumps 17a formed in the above described manner. By deforming the wiring layers 15 to form the mechanical bump 17a which is used as the external connecting terminal, it is possible to form a bump by a simple process similarly as in the case of the mechanical via 17. In addition, the mechanical via 17 and the mechanical bump 17a can respectively be formed in one process, and the processing efficiency is satisfactory.

Figure 14:
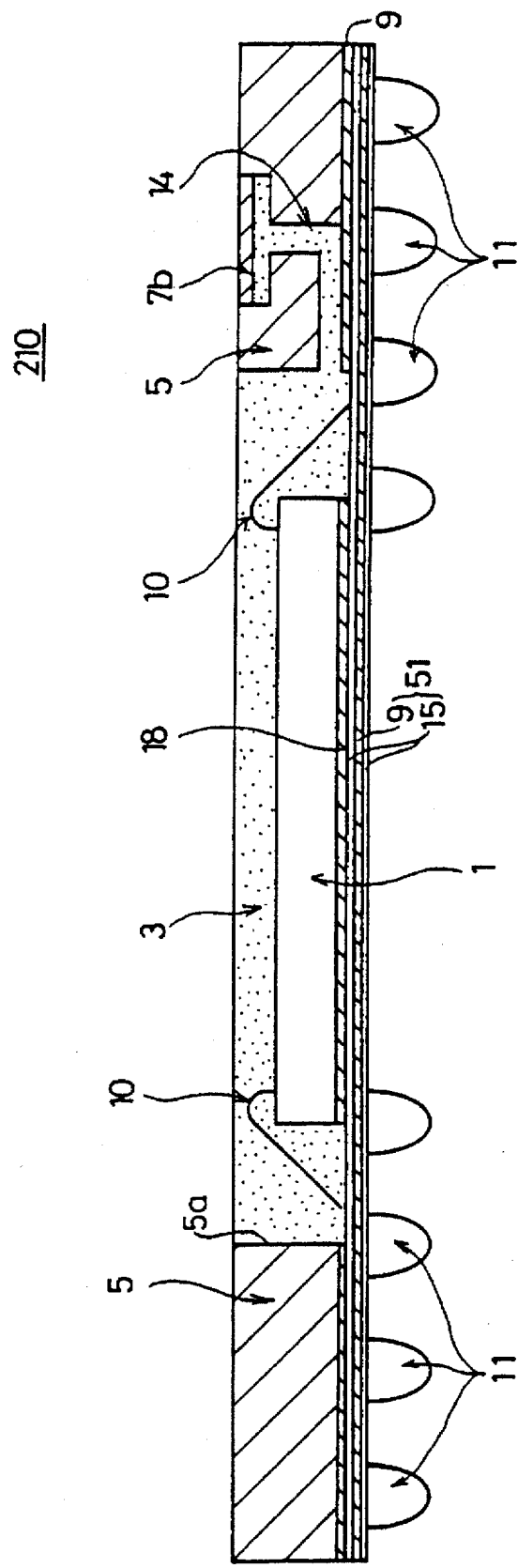
FIG. 14 is a cross sectional view showing an important part of an eleventh embodiment of the semiconductor device according to the present invention.

FIG. 14 shows a cross section of an eleventh embodiment of the semiconductor device according to the present invention. This eleventh embodiment of the semiconductor device employs the first aspect of the present invention. In FIG. 14, those parts which are the same as those corresponding parts in FIGS. 2 through 4 are designated by the same reference numerals, and a description thereof will be omitted.

A semiconductor device 210 shown in FIG. 14 is characterized in that no substrate 2 is provided and the frame body 5 is used as the package. More particularly, the insulator layers 9 are made of a flexible resin, and the wiring layers 15 and the insulator layers 9 are alternately bonded to form a flexible printed circuit (FPC) 51. The semiconductor element 1 is die-bonded on this FPC 51. The wires 10 are provided between the semiconductor element 1 and predetermined positions of the FPC 51, and the semiconductor element 1 and the FPC 51 are electrically connect via the wires 10. In addition, the bumps 11 which are made up of solder or the like and used as external connecting terminals are formed at predetermined positions on the lower part of the FPC 51.

The frame body 5 shown in FIG. 14 is slightly larger than that of the first embodiment. In addition, the frame body 5 is arranged on top of the FPC 51, and is fixed to the FPC 51 by the insulator layer 9 which also functions as an adhesive. In addition, the resin gate holes 14 are formed in the side wall of the frame body 5. The resin gate hole 14 has an approximately L-shaped cross section as shown in FIG. 14. One end of the resin gate hole 14 opens to a resin filling part 5a which is an internal space of the frame body 5, and the other end of the resin gate hole 14 opens at the top surface of the frame body 5.

The resin 3 is filled into the resin filling part 5a, that is, into the internal space of the frame body 5, via the resin gate holes 14. Accordingly, it is also possible in this embodiment to fill the resin 3 directly via the resin gate holes 14, and there is no need to provide the cull part, the runner part, the gate part and the like in the mold. As a result, it is possible to select the kind and amount of mold release agent to be added to the resin 3 without taking the mold release characteristic into much consideration. Consequently, it is possible to use as the resin 3 a resin having a high adhesive strength and improve the reliability of the semiconductor device 210.

In addition, according to this embodiment, the semiconductor device 210 is made up of the semiconductor element 1, the frame body 5 and the FPC 51, and has an extremely simple construction. Hence, the number of parts is small and the production cost of the semiconductor device 210 can be reduced. The lid member 7b prevents the resin 3 from leaking outside.

Figure 15:
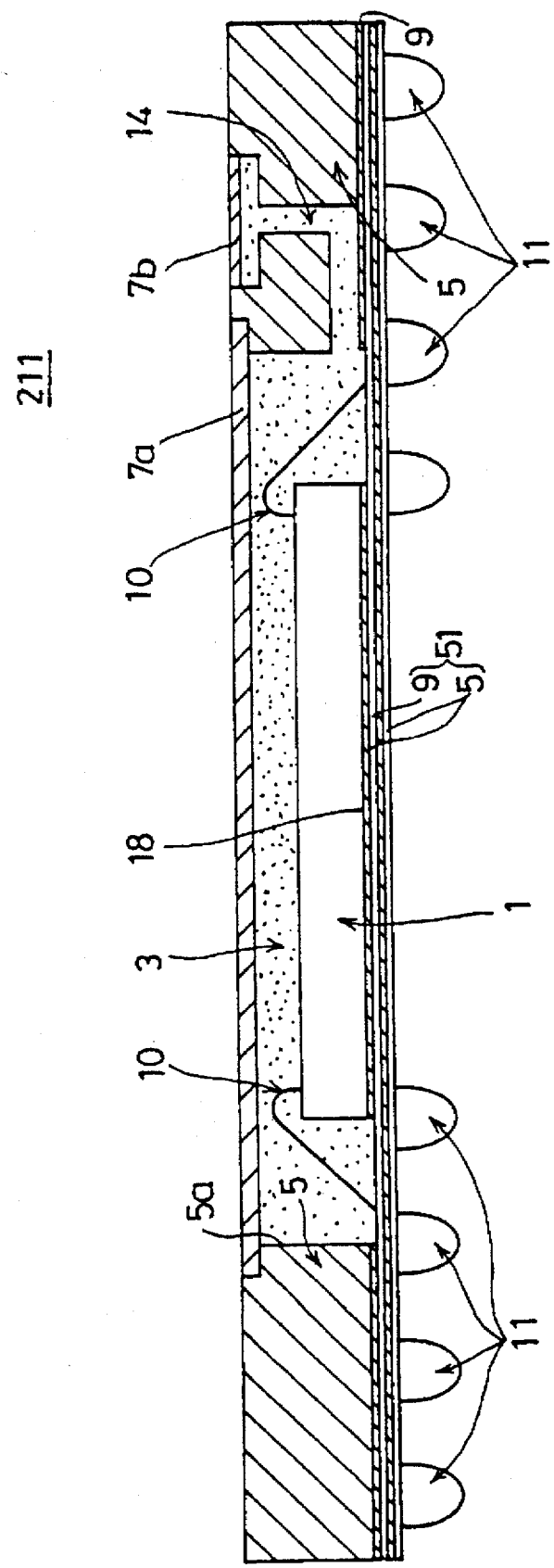
FIG. 15 is a cross sectional view showing an important part of a twelfth embodiment of the semiconductor device according to the present invention.

FIG. 15 shows a cross section of a twelfth embodiment of the semiconductor device according to the present invention. This twelfth embodiment of the semiconductor device employs the first aspect of the present invention. In FIG. 15, those parts which are the same as those corresponding parts in FIGS. 2 through 4 and 14 are designated by the same reference numerals, and a description thereof will be omitted.

A semiconductor device 211 shown in FIG. 15 has a basic construction similar to that of the eleventh embodiment, but is characterized in that the upper lid member 7a is provided above the resin filling part 5a. By providing the upper lid member 7a above the resin filling part 5a, it is possible to improve the mold release characteristic because the contact area between the rein 3 and the mold becomes small when using the mold and filling the resin 3. In addition, compared to the eleventh embodiment, it is possible to reduce the amount or eliminate the need for the mold release agent that is added to the resin 3, thereby improving the adhesive strength of the resin 3 and improving the reliability of the semiconductor device 211.

Next, a description will be given of embodiments of a method of producing the semiconductor device according to the present invention, by referring to FIGS. 16 through 20. These embodiments of the method employ the first aspect of the present invention.

Figure 16A:
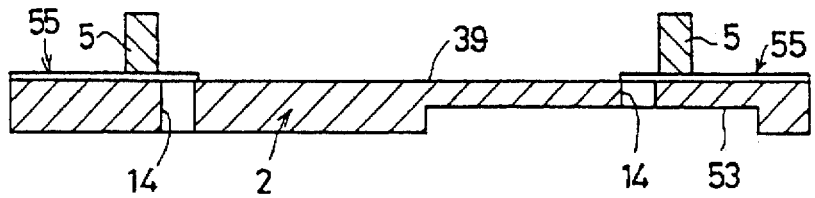
Figure 16B:
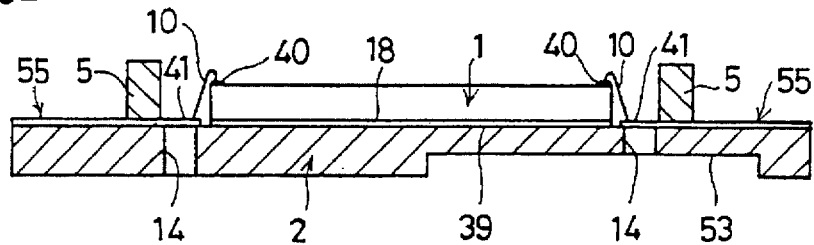
Figure 16C:
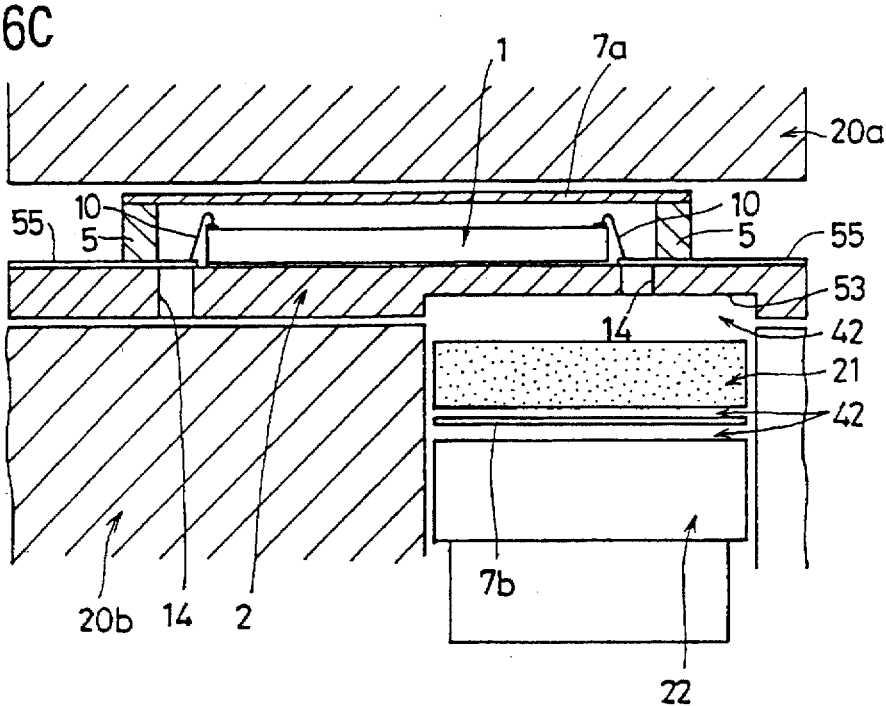
Figure 17:
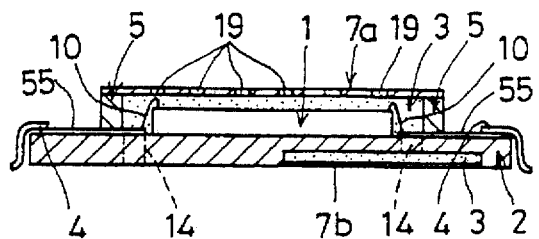
FIG. 17 is a cross sectional view showing a semiconductor device produced by a second embodiment of the method of producing the semiconductor device according to the present invention.

FIGS. 16 and 17 are cross sectional views for explaining a first embodiment of the method according to the present invention. This first embodiment of the method produces the semiconductor device 200 described above. In this embodiment of the method and the other embodiments of the method described later, the process of supplying the resin 3 into the resin gate holes 14 so as to encapsulate the semiconductor element 1 by the resin 3 is basically the same, and the description of this process will be omitted in the latter embodiments of the method.

In order to produce the semiconductor device 200, the substrate 2 is first formed as shown in FIG. 16A. More particularly, the resin filling recess 53 is formed in a metal member which becomes the substrate 2, and the resin gate holes 14 are formed at positions within the resin filling recess 53 and outside the resin filling recess 53. A plurality of resin gate holes 14 are formed in FIG. 16A, but it is possible to form only one resin gate hole 14. When a plurality of resin gate holes 14 are provided, it is possible to improve the efficiency with which the resin 3 is filled in a resin filling process which will be described later. More particularly, if 4 resin gate holes 14 are provided and the resin 3 is filled via 1 resin gate hole 14, it is possible to smoothly fill the resin 3 by using the remaining 3 resin gate holes 14 as air vents, so that the efficiency with which the resin 3 is filled is improved.

When the process of forming the resin filling recess 53 and the resin gate holes 14 ends, the multi-level circuit 55 and the frame body 5 are provided on top of the substrate 2. The multi-level circuit 2 is produced in advance by an independent process, and the wiring layers 15 are already exposed at positions where the wires 10 connect and at positions where the outer leads 4 are arranged.

When the process of forming the substrate 2 ends, the semiconductor element 1 is mounted on the die-pad portion 39 of the substrate 2 via the die-bond layer 18, as shown in FIG. 16B. In addition, the wires 10 are provided between the electrode pads 40 on the top surface of the semiconductor element 1 and the multi-level circuit 55. The wires 10 are bonded using a known wire-bonding machine. As a result, the semiconductor element 1 and the multi-level circuit 55 are electrically connected.

When the process of mounting the semiconductor element 1 ends, the substrate 2 mounted with the semiconductor element 1 is loaded into molds so as to carry out a resin filling process. FIG. 16C is a cross sectional view for explaining the resin filling process.

When the process of mounting the semiconductor element 1 ends, the upper lid member 7a is provided on top of the frame body 5 and the substrate 2 in this state is placed between the upper and lower molds 20a and 20b. In this loaded position of the substrate 2 between the upper and lower molds 20a and 20b, the upper mold 20a confronts the upper lid member 7a and the lower mold 20b confronts the bottom surface of the substrate 2. A plunger 22 and a plunger pot 42 which form a resin filling mechanism are provided in the lower mold 20b for the purpose of filling the resin 3.

The plunger 22 and the plunger pot 42 are positioned so as to confront the resin filling recess 53 formed in the substrate 2. In addition, the resin filling recess 53 and the plunger pot 42 have the same area and shape in the plan view. Hence, in the state where the substrate 2 is loaded between the upper and lower molds 20a and 20b, the resin filling recess 53 and the plunger pot 42 communicate to form a single space. In other words, the resin filling recess 53 also forms a part of the plunger pot 42. Furthermore, a resin tablet 21 which becomes the resin 3 is loaded above the plunger 22, and the lower lid member 7b is interposed between the resin tablet 21 and the plunger 22.

When the substrate 2 is loaded between the upper and lower molds 20a and 20b, the plunger 22 is then raised as shown in FIG. 16D while heating the resin tablet 21. As a result, the melted resin tablet 21, that is, the melted resin 3, passes through the resin filling recess 53 and the resin gate holes 14 and reaches the side of the substrate 2 provided with the semiconductor element 1. Hence, the resin 3 fills the space defined by the frame body 5 and the upper lid member 7a and surrounding the semiconductor element 1.

According to this embodiment of the method, it is possible to encapsulate the semiconductor element 1 by the resin 3 by directly filling the resin to the encapsulating position of the substrate 2 via the resin gate holes 14 formed in the substrate 2. In addition, it is possible to reduce the contact area between the resin 3 and the upper and lower molds 20a and 20b, because passages within the molds such as the cull part, the runner part and the gate part which were conventionally provided for passing the resin 3 are unnecessary in this embodiment. Furthermore, the plunger pot 42 within the upper and lower molds 20a and 20b through which the resin 3 passes has a large planar area, thereby making it easy for the resin 3 to flow. For this reason, it is possible to select the kind and amount of mold release agent to be added to the resin 3, without taking the mold release characteristic into consideration. Therefore, it is possible to use as the resin 3 a resin having a high adhesive strength, and the reliability of the semiconductor device 200 can be improved even when the size of the semiconductor device 200 is reduced.

On the other hand, since the resin filling recess 53 and the plunger pot 42 formed in the lower mold 20b communicate to form a single space, it is possible to prevent the resin 3 from leaking and smoothly introduce the resin 3 into the resin gate holes 14. Moreover, by providing the lower lid member 7b between the resin tablet 21 and the plunger 22 in advance, it is possible to close the resin filling recess 53 by the lower lid member 7b at the same time when the filling of the resin 3 ends. Hence, this method is simpler and easier compared to the method of carrying out an independent process to mount the lower lid member 7b.

When the above resin filling process ends, an external terminal forming process is carried out to provide external connecting terminals on the outer side of the multi-level circuit 55. FIG. 16E shows a case where the outer leads 4 are provided as the external connecting terminals, and FIG. 16F shows a case where the bumps 11 are provided as the external connecting terminals.

Next, a description will be given of a second embodiment of the method for producing a semiconductor device shown in FIGS. 17 and 18 having a construction such that the moisture included in the resin 3 can be eliminated.

The basic construction of the semiconductor device shown in FIG. 17 is the same as that of the semiconductor device 200 described above with reference to FIGS. 2 through 4. However, in the case of the semiconductor device shown in FIG. 17, a plurality of through holes 19 are formed in the upper lid member 7a.

Figure 18A:
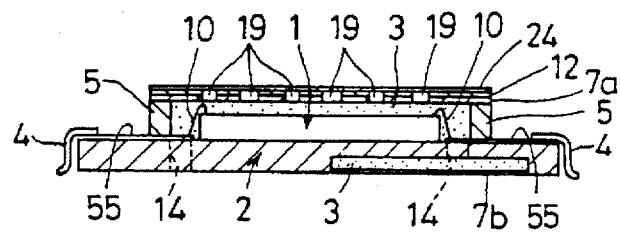
FIG. 18A is a cross sectional view for explaining the second embodiment of the method.

When producing the semiconductor device shown in FIG. 17, the plurality of through holes 19 are formed in the upper lid member 7a, and a mold separation film 24 is formed on the upper lid member 7a. Such an upper lid member 7a having the through holes 19 and the mold separation film 24 is used to produce the semiconductor device shown in FIG. 17 by carrying out the processes described above in conjunction with FIGS. 15 and 16. FIG. 18A shows the semiconductor device which is produced in this manner. In the case of the semiconductor device shown in FIG. 18A, a material 12 having a high thermal conductivity is arranged between the upper lid member 7a and the mold separation film 24.

During the production stage of the semiconductor device, the through holes 19 in the upper lid member 7a are closed by the mold separation film 24 which is arranged on the upper lid member 7a, and the resin 3 is prevented from leaking to the outside via the through holes 19 when the resin filling process is carried out. In addition, a satisfactory mold release characteristic is obtained after the resin filling process because the mold separation film 24 makes contact with the upper mold 20a.

Figure 18B:
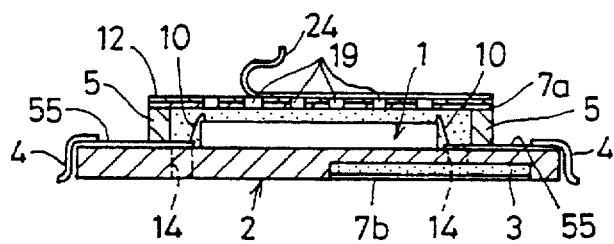
FIGS. 18B and 18C respectively are cross sectional views for explaining the mounting of the semiconductor device shown in FIG. 18A onto a mounting substrate.
Figure 18C:
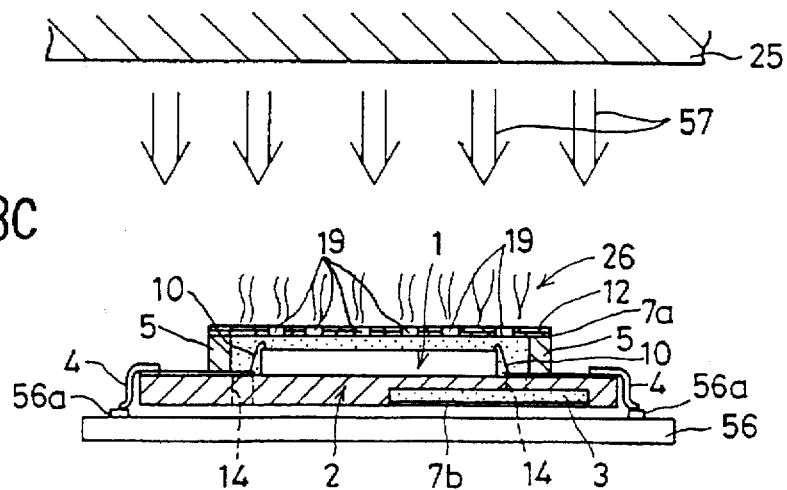

When mounting the semiconductor device shown in FIG. 18A on a mounting substrate 56, the mold separation film 24 on the upper lid member 7a is removed as shown in FIG. 18B. Thereafter, in order to solder the outer leads 4 onto terminals 56a formed on the mounting substrate 56 as shown in FIG. 18C, the semiconductor device is loaded into a fellow chamber 25 to subject the semiconductor device to heat or infrared ray 57, so as to melt the solder (not shown) provided at the connecting positions of the outer leads 4 and the terminals 56a.

Due to the heating process carried out within the fellow chamber 25, the moisture included within the resin 3 becomes water vapor 26 and escapes outside the semiconductor device via the through holes 19 in the upper lid member 7a. Because the moisture included within the resin 3 is eliminated, it is possible to prevent corrosion from being generated at the electrode pads 40, the wires 10 and the wiring layers 15. In addition, since the through holes 19 are provided, it is possible to prevent cracks from being formed in the resin due to the water vapor 26 that is generated during the heating process, thereby making it possible to improve the reliability of the semiconductor device.

FIGS. 19A through 19D respectively are cross sectional views for explaining a third embodiment of the method of producing the semiconductor device according to the present invention. This third embodiment of the method employs the plate mold technique using a plate 23 during the resin filling process.

Figure 19A:
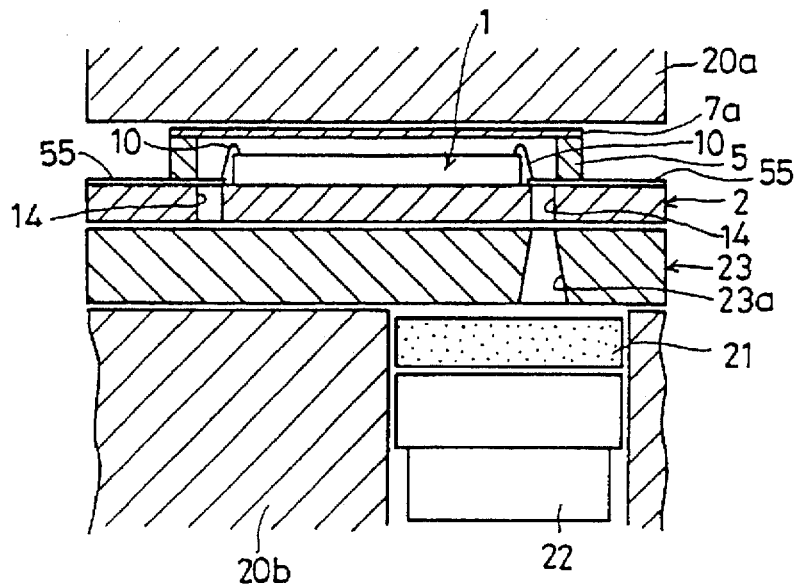
FIGS. 19A, 19B, 19C and 19D respectively are cross sectional views for explaining a third embodiment of the method of producing the semiconductor device according to the present invention.

When producing the semiconductor device employing the plate mold technique, the substrate 2 is loaded between the upper and lower molds 20a and 20b in a state where a plate 23 is interposed between the substrate 2 and the lower mold 20b as shown in FIG. 19A. This plate 23 includes a resin supplying hole 23a having a truncated cone shape. The lower end of the resin supplying hole 23a confronts the resin filling mechanism formed in the lower mold 20b, and the upper end of the resin supplying hole 23a confronts the resin gate hole 14 formed in the substrate 2. In this state, when the plunger 22 is raised while heating the resin tablet 21, the melted resin 3 passes through the resin supplying hole 23a in the plate 23 and reaches the resin gate hole 14 in the substrate 2. Then, the melted resin 3 passes through the resin gate hole 14 and reaches the side of the substrate 2 provided with the semiconductor element 1, so as to encapsulate the semiconductor element 1.

Figure 19B:
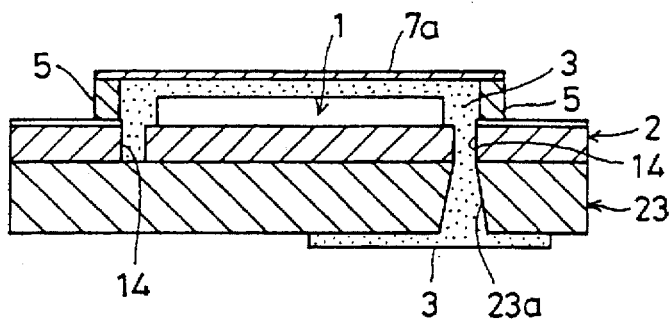

FIG. 19B shows a state where the resin filling process has ended and the substrate 2 is removed from the upper and lower molds 20a and 20b. In this state, the resin 3 continuously fills the resin supplying hole 23a and the resin gate hole 14, and the plate 23 is maintained in the state making contact with the bottom part of the substrate 2.

Figure 19C:
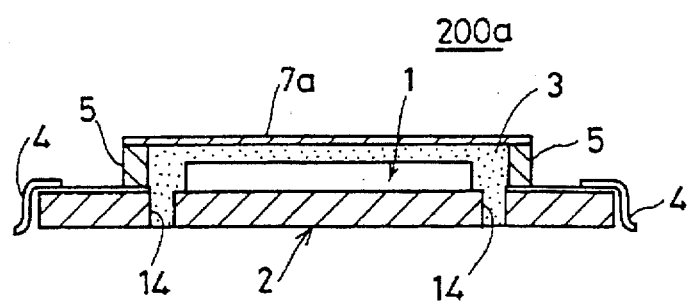
Figure 19D:
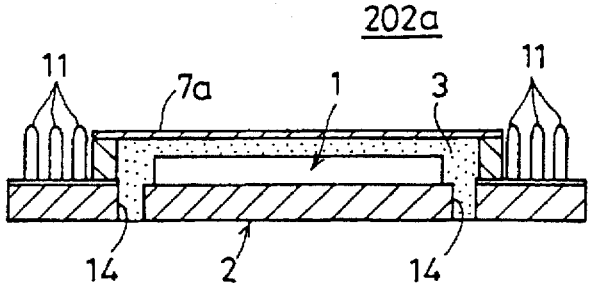

Next, the plate 23 is removed from the substrate 2, and a process of forming the external connecting terminals is carried out thereafter so as to obtain a semiconductor device 200a shown in FIG. 19C or a semiconductor device 202a shown in FIG. 19D. When the semiconductor device is produced using the plate mold technique as described above, it is unnecessary to provide a resin filling recess in the substrate 2 as in the case of the semiconductor device 206 described above in conjunction with FIG. 10. For this reason, it is possible to simplify the process of forming the substrate 2, and the mechanical strength of the substrate 2 can be improved. In addition, unlike the semiconductor device 206 shown in FIG. 10, the resin 3 will not remain at the bottom part of the substrate 2, and the excess resin 3 remains on the side of the plate 23 as a residual resin part. As a result, it is possible to absorb the inconsistency in the volume of the resin tablet 21 by the residual resin part.

FIGS. 20A through 20E are cross sectional views for explaining a fourth embodiment of the method of producing the semiconductor device according to the present invention. This embodiment of the method is characterized in that the resin table 21 is formed in advance, and the substrate 2 is interposed between the upper and lower molds 20a and 20b after loading this resin tablet 21 into a resin filling recess 53 formed in the substrate 2.

FIGS. 20A and 20B are cross sectional views for explaining a method of forming the resin tablet 21. When forming the resin tablet 21, a predetermined amount of resin powder 49 is first supplied from a nozzle 48 into a mold having a cavity 49 for forming the resin tablet 21 as shown in FIG. 19A. This cavity 49 corresponds to the shape of the resin filling recess 53 formed in the substrate 2. The amount of the resin power 49 supplied is selected so as to correspond to the amount of the resin to be filled into the semiconductor device. Then, the lower lid member 7b is arranged on top of the resin powder 49, a press process is carried out by a press member 50 as shown in FIG. 20B, so as to solidify the resin powder 49 into the resin tablet 21.

When the resin tablet 21 is formed, this resin tablet 21 is loaded into the resin filling recess 53 of the substrate 2 as shown in FIG. 20C, not into the plunger pot. Thereafter, the resin filling process is carried out to fill the resin 3 as shown in FIGS. 20D and 20E, similarly to the method described above.

According to this embodiment of the method, the resin tablet 21 is arranged on the side of the substrate 2. For this reason, it is unnecessary to carry out the process of placing the resin tablet 21 in the plunger pot of the lower mold 20b, thereby making it easier to carry out the resin filling process automatically.

Next, a description will be given of the second aspect of the present invention, by referring to FIGS. 34 through 72.

Figure 34:
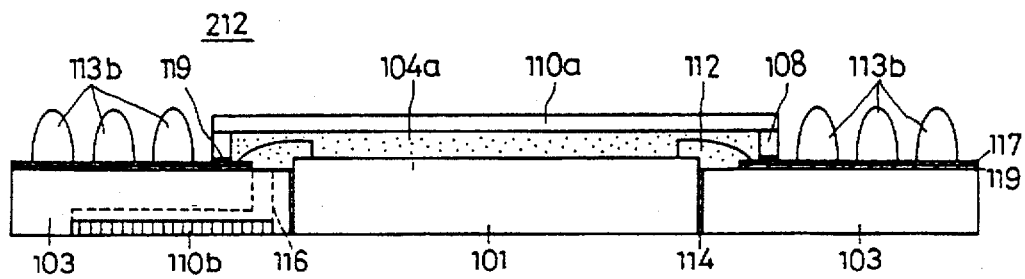
FIG. 34 is a cross sectional view showing an important part of a thirteenth embodiment of the semiconductor device according to the present invention.

FIG. 34 shows a cross section of a thirteenth embodiment of the semiconductor device according to the present invention employing the second aspect of the present invention.

A semiconductor device 212 shown in FIG. 34 is characterized in that an outer periphery of a semiconductor element 101 is surrounded on 4 sides by a base substrate (hereinafter simply referred to as a substrate) 103. The substrate 103 is made up of a plurality of divided substrates as will be described later, and is bonded to the side surface of the semiconductor element 101 using a bond material 114. Since FIG. 34 shows the vertical cross section of the semiconductor device 212, the substrate 103 is arranged only on the right and left sides of the semiconductor element 101. However, the substrate 103 actually surrounds the outer periphery on all 4 sides of the semiconductor element 101.

The substrate 103 is made of a material having a satisfactory heat radiation characteristic. For example, metals including copper alloys, aluminum alloys, copper-tungsten alloys having low coefficients of linear expansion, molybdenum alloys, cladding materials including copper and molybdenum and the like, and insulative ceramics such as aluminum nitride, silicon nitride and alumina may be used for the substrate 103. In addition, the bond material 114 may be a thermo-compression hardening type bond having a Young's modulus in the range of 0.1 to 500 Kgf/mm$^2$ at room temperature and having metal powder or insulator powder as the filling. The metal powder may be selected from silver having a satisfactory thermal conductivity, silver palladium alloy, copper and the like. On the other hand, the insulator powder may be selected from silica, alumina, aluminum nitride, silicon nitride, boron nitride, diamond and the like.

In addition, a resin gate hole 116 is formed in the substrate 103 and penetrates the substrate 103. The upper end of this resin gate hole 116 opens to the side of the substrate 103 provided with the semiconductor element 101, and the lower end of this resin gate hole 116 opens to the back (or bottom) side of the substrate 103. A lower lid member 110b is arranged at the back side of the substrate 103 where the lower end of the resin gate hole 116 opens.

In addition, a wiring layer 117 and an insulator layer 119 forming a stacked structure are arranged on the side (top surface) of the substrate 103 provided with the semiconductor element 101. The inner end part of the wiring layer 117 is electrically connected to electrode pads (not shown) formed on the top surface of the semiconductor element 101 by wires 112. Further, bumps 113b which become external connecting terminals for connecting the semiconductor device 212 and connecting terminals formed on a mounting substrate (not shown) are provided on the outer end part of the wiring layer 117.

A frame body 108 is provided at a predetermined position on the substrate 103 so as to surround the semiconductor element 101. An upper lid member 110a is arranged on top of this frame body 108. The frame body 108 and the upper lid member 110a are both made of a metal material having a satisfactory thermal conductivity, and are bonded by soldering, bonding, welding or the like. The frame body 108 and the upper lid member 110a may be connected similarly as described above with reference to FIGS. 33A through 33E.

According to the semiconductor device 212 having the above described construction, the substrate 103 makes contact with the side surface of the semiconductor element 101 and surrounds the semiconductor element 101. Hence, the contact area between the semiconductor element 101 and the substrate 103 is large, and the heat generated from the semiconductor element 101 can be released via this substrate 103. As a result, it is possible to improve the heat radiation characteristic of the semiconductor element 101. In addition, since the heat is released via the substrate 103 which holds the semiconductor element 101, the size of the semiconductor device 212 will not increase. In addition, because the substrate 103 and the bond material 114 are both made of the material having the satisfactory thermal conductivity, it is possible to improve the heat radiation characteristic of the semiconductor element 101 also from this point of view.

Figure 35:
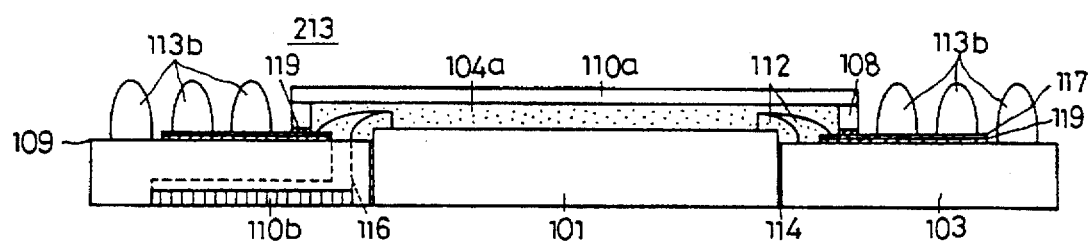
FIG. 35 is a cross sectional view showing an important part of a fourteenth embodiment of the semiconductor device according to the present invention.

FIG. 35 shows a cross section of a fourteenth embodiment of the semiconductor device according to the present invention employing the second aspect of the present invention. In FIG. 35, those parts which are the same as those corresponding parts in FIG. 34 are designated by the same reference numerals, and a description thereof will be omitted.

A semiconductor device 213 shown in FIG. 35 is characterized in that the substrate 103 is made of a conductive metal so that the substrate 103 has a function similar to that of the wiring layer 117. Hence, in this embodiment, the wires 112 are also bonded on the substrate 103, and the bumps 113b arranged on the outermost periphery are formed directly on top of the substrate 103 as shown in FIG. 35. By also using the substrate 103 as a wiring layer, it is possible to reduce the number of wiring layers 117 and insulator layers 119 formed on the substrate 103. In addition, since the volume of the substrate 103 is large compared to the wiring layer 117 and the impedance of the substrate 103 is small, the substrate 103 is suited for use as a wiring layer for supplying a power supply voltage or for grounding.

In this embodiment, some bumps 113b are formed on top of the stacked structure which is made up of the wiring layer 117 and the insulator layer 119, and some bumps 113b are formed directly on the substrate 103. For this reason, in order to make the heights of the bumps 113b uniform, it is necessary to make the height of the bumps 113b themselves formed on the stacked structure of the wiring layer 117 and the insulator layer 119 different from the height of the bumps 113b themselves formed on the substrate 103. In other words, the bumps 113b formed on the substrate 103 must by themselves be higher than the bumps 113b themselves formed on the stacked structure. In order to realize the different heights, it is possible to employ the method of forming the bumps described above with reference to FIGS. 23 through 26 or, the method of forming the bumps described above with reference to FIGS. 27 through 32. In this embodiment, however, the bond material 114 used must be an insulative material so that the semiconductor element 101 and the substrate 103 will not be electrically connected.

Figure 36:
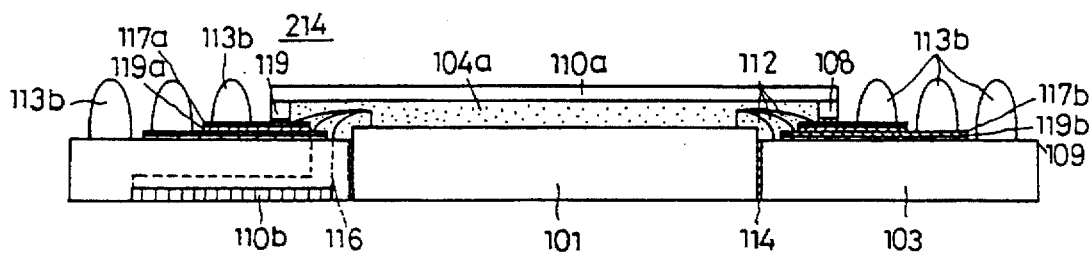
FIG. 36 is a cross sectional view showing an important part of a fifteenth embodiment of the semiconductor device according to the present invention.

FIG. 36 shows a cross section of a fifteenth embodiment of the semiconductor device according to the present invention employing the second aspect of the present invention. In FIG. 36, those parts which are the same as those corresponding parts in FIG. 35 are designated by the same reference numerals, and a description thereof will be omitted.

The basic construction of a semiconductor device 214 shown in FIG. 36 is the same as that of the semiconductor device 213 described above, except that the semiconductor device 214 is characterized in that 2 wiring layers 117a and 117b are provided. By using the multi-level circuit having the stacked wiring layers 117a and 117b, it is possible to draw out the wiring layers 117a and 117b with a large degree of freedom. In addition, since it is possible to independently provide the signal wiring, the power supply wiring and the ground wiring, interference among the wiring layers can be prevented.

In this embodiment, it is also necessary to make the heights of the bumps 113b themselves different depending on the layer on which the bumps 113b are provided, that is, depending on whether the bumps 113b are formed on the wiring layer 117a, the wiring layer 117b or the substrate 103. In order to realize the different heights, it is possible to employ the method of forming the bumps described above with reference to FIGS. 23 through 26 or, the method of forming the bumps described above with reference to FIGS. 27 through 32.

Figure 37:
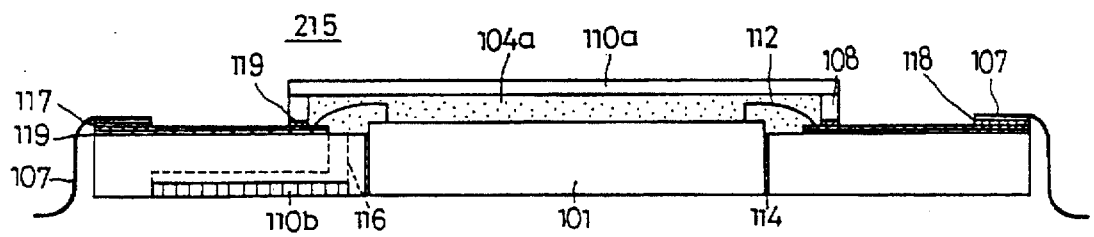
FIG. 37 is a cross sectional view showing an important part of a sixteenth embodiment of the semiconductor device according to the present invention.

FIG. 37 shows a cross section of a sixteenth embodiment of the semiconductor device according to the present invention employing the second aspect of the present invention. In FIG. 37, those parts which are the same as those corresponding parts in FIG. 35 are designated by the same reference numerals, and a description thereof will be omitted.

The basic construction of a semiconductor device 215 shown in FIG. 37 is the same as that of the semiconductor device 213 described above, except that the semiconductor device 215 is characterized in that outer leads 107 are used as the external connecting terminals. For example, a conductive bond material (not shown) is used to connect the outer leads 107 and the wiring layer 117. It may thus be seen that the second aspect of the present invention may be applied regardless of the structure of the external connecting terminals.

Figure 38:
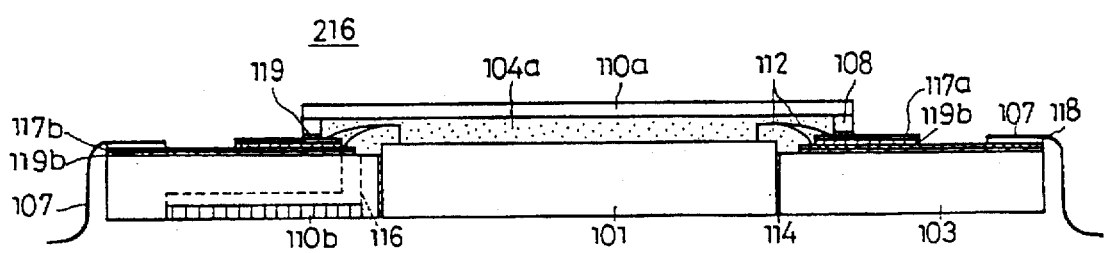
FIG. 38 is a cross sectional view showing an important part of a seventeenth embodiment of the semiconductor device according to the present invention.

FIG. 38 shows a cross section of a seventeenth embodiment of the semiconductor device according to the present invention employing the second aspect of the present invention. In FIG. 38, those parts which are the same as those corresponding parts in FIG. 37 are designated by the same reference numerals, and a description thereof will be omitted.

The basic construction of a semiconductor device 216 shown in FIG. 38 is the same as that of the semiconductor device 215 described above, except that the semiconductor device 216 is characterized in that a wiring layer 117b and an insulator layer 119b are further formed above the wiring layer 117 and the insulator layer 119 which are provided on the substrate 103. Therefore, it may be seen that the wiring layers and the insulator layers may be arranged with a relatively large degree of freedom even in the case of the semiconductor device employing the second aspect of the present invention.

In addition, by providing a plurality of wiring layers 117 in a stacked arrangement, it becomes necessary to connect the wiring layers. But the wiring layers may easily be connected using the concept of the mechanical via 17 described above with reference to FIGS. 21A and 21B.

Figure 39:
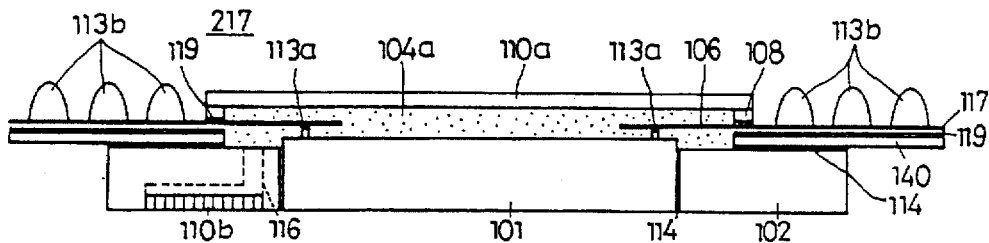
FIG. 39 is a cross sectional view showing an important part of an eighteenth embodiment of the semiconductor device according to the present invention.

FIG. 39 shows a cross section of an eighteenth embodiment of the semiconductor device according to the present invention employing the second aspect of the present invention. In FIG. 39, those parts which are the same as those corresponding parts in FIG. 34 are designated by the same reference numerals, and a description thereof will be omitted.

A semiconductor device 217 shown in FIG. 39 is characterized in that the tape automated bonding (TAB) technique is used to connect the semiconductor element 101 and the external electrode which are the bumps 113b in this embodiment.

In FIG. 39, an insulating substrate 140 is made of polyimide or the like and forms a TAB tape. The wiring layer 117 is formed on the insulating substrate 140 via the insulating layer 119. This insulating substrate 140 is bonded on a plate-shaped substrate 102 by a bonding member 114. The wiring layer 117 extends deeply within the frame body 108. More particularly, the wiring layer 117 extends to a position confronting inner bumps 113a which are formed on the semiconductor element 101. The inner bumps 113a and the wiring layer 117 are bonded based on a method which will be described later. In addition, outer bumps 113b which become the external connecting terminals are formed on the wiring layer 117 at a position on the outer side of the frame body 108. Hence, the semiconductor element 101 and the outer bumps 113b are electrically connected via the wiring layer 117.

By connecting the inner bumps 113a formed on the semiconductor element 101 and the wiring layer 117 by use of the TAB technique as described above, it is also possible to satisfactorily cope with the case where a large number of inner bumps 113a are formed on the semiconductor element 101 and the connection must be made at a high density. As a result, it is possible to realize the semiconductor device 217 which includes the connections which are made at the high density.

Figure 40:
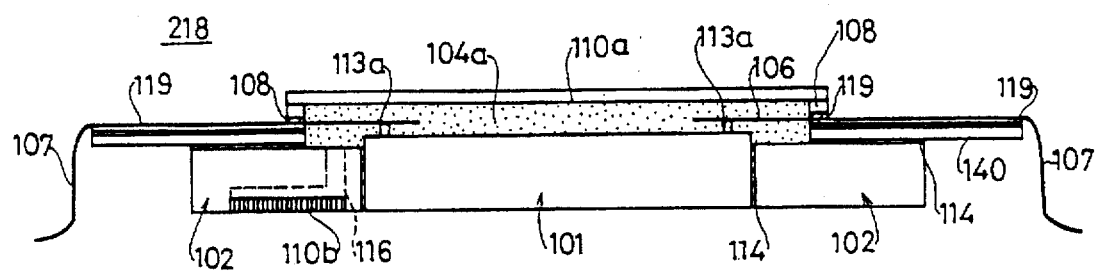
FIG. 40 is a cross sectional view showing an important part of a nineteenth embodiment of the semiconductor device according to the present invention.

FIG. 40 shows a cross section of a nineteenth embodiment of the semiconductor device according to the present invention employing the second aspect of the present invention. In FIG. 40, those parts which are the same as those corresponding parts in FIG. 39 are designated by the same reference numerals, and a description thereof will be omitted.

The basic construction of a semiconductor device 218 shown in FIG. 40 is the same as that of the semiconductor device 217, however, the semiconductor device 218 is characterized in that the part of the wiring layer 117 on the outer side of the frame body 108 is extended further on the outer side and bent into a gull-wing shape to form the outer leads 107.

By forming the outer leads 107 by use of the wiring layer 117, it becomes unnecessary to form the outer leads independently of the TAB tape and there is no need to arranged such independently formed outer leads on the plate-shaped substrate 102. Therefore, it is possible to reduce the number of parts, and also simplify the process of forming the external connecting terminals.

Figure 41:
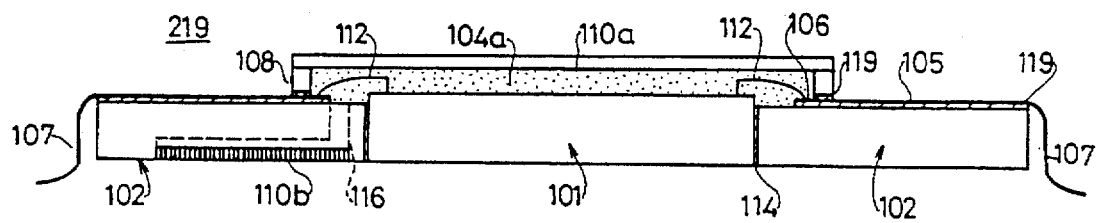
FIG. 41 is a cross sectional view showing an important part of a twentieth embodiment of the semiconductor device according to the present invention.

FIG. 41 shows a cross section of a twentieth embodiment of the semiconductor device according to the present invention employing the second aspect of the present invention. In FIG. 41, those parts which are the same as those corresponding parts in FIG. 40 are designated by the same reference numerals, and a description thereof will be omitted.

A semiconductor device 219 shown in FIG. 41 is characterized in that a lead frame 105 is used in place of the wiring layer 117 arranged on the TAB tape of the semiconductor device 218. For example, iron-nickel alloys, copper alloys or the like may be used for the lead frame 105.

Since this embodiment uses the lead frame 105 in place of the wiring layer 117, it is possible to improve the mechanical strength of the outer leads 107, and also eliminate the need for the insulating substrate 140 that is made of polyimide or the like.

Figure 42:
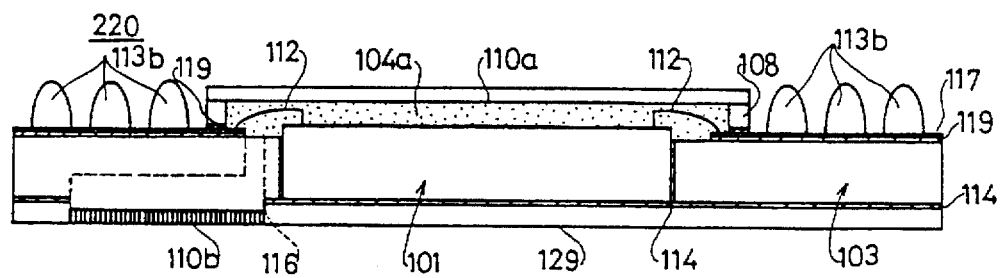
FIG. 42 is a cross sectional view showing an important part of a twenty-first embodiment of the semiconductor device according to the present invention.

FIG. 42 shows a cross section of a twenty-first embodiment of the semiconductor device according to the present invention employing the second aspect of the present invention. In FIG. 42, those parts which are the same as those corresponding parts in FIG. 39 are designated by the same reference numerals, and a description thereof will be omitted.

A semiconductor device 220 shown in FIG. 42 is characterized in that a heat radiation plate 129 is arranged below the semiconductor element 101 and the substrate 103. For example, this heat radiation plate 129 is made of a metal material having a satisfactory thermal conductivity.

By providing the metal heat radiation plate 129 below the substrate 103, it is possible to improve the mechanical strength of the substrate 103. In addition, since the heat radiation plate 129 having the satisfactory thermal conductivity also makes contact with the bottom part of the semiconductor element 101, it is possible to efficiently radiate (or release) the heat generated from the semiconductor element 101.

Figure 43:
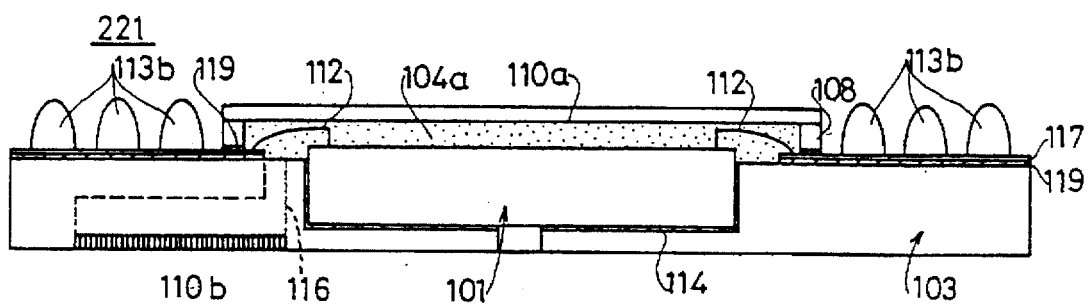
FIG. 43 is a cross sectional view showing an important part of a twenty-second embodiment of the semiconductor device according to the present invention.

FIG. 43 shows a cross section of a twenty-second embodiment of the semiconductor device according to the present invention employing the second aspect of the present invention. In FIG. 43, those parts which are the same as those corresponding parts in FIG. 39 are designated by the same reference numerals, and a description thereof will be omitted.

A semiconductor device 221 shown in FIG. 43 is characterized in that the bottom part of the substrate 103 extends to the bottom surface of the semiconductor element 101.

According to the semiconductor device 221, a part of the substrate 103 extend to the bottom part of the semiconductor element 101. For this reason, the exposed part of the semiconductor device 101 is small, and it is possible to reduce the damage that is applied directly on the semiconductor element 101 from the outside. In addition, because the substrate 103 is made of a material having a satisfactory thermal conductivity, it is possible to improve the heat radiation characteristic of the semiconductor element 101 without having to provide the independent heat radiation plate 129 as in the case of the semiconductor device 220 described above.

Figure 44:
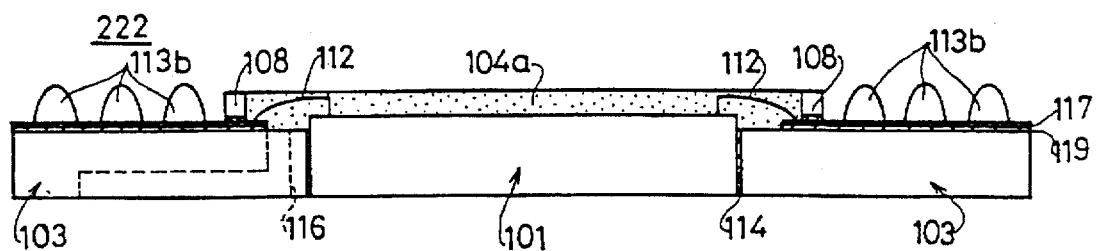
FIG. 44 is a cross sectional view showing an important part of a twenty-third embodiment of the semiconductor device according to the present invention.

FIG. 44 shows a cross section of a twenty-third embodiment of the semiconductor device according to the present invention employing the second aspect of the present invention. In FIG. 44, those parts which are the same as those corresponding parts in FIG. 34 are designated by the same reference numerals, and a description thereof will be omitted.

A semiconductor device 222 shown in FIG. 44 is characterized in that the upper lid member 110a and the lower lid member 110b are removed from the semiconductor device 212 described above. In other words, the semiconductor device 222 has a construction similar to that of the semiconductor device 207 shown in FIG. 11 described above, and it is possible to reduce both the number of parts and the thickness of the semiconductor device.

Figure 45:
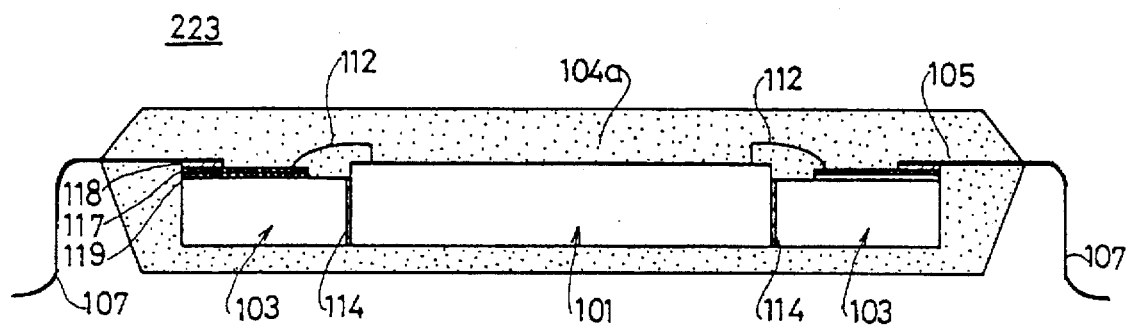
FIG. 45 is a cross sectional view showing an important part of a twenty-fourth embodiment of the semiconductor device according to the present invention.

FIG. 45 shows a cross section of a twenty-fourth embodiment of the semiconductor device according to the present invention employing the second aspect of the present invention. In FIG. 45, those parts which are the same as those corresponding parts in FIG. 34 are designated by the same reference numerals, and a description thereof will be omitted.

A semiconductor device 223 shown in FIG. 45 is characterized in that the substrate 103 is used as a so-called extension substrate, and a package is formed by molding a resin 104a over the substrate 103 which holds the semiconductor element 101 by a transfer mold, similarly as in the case of the general resin encapsulated type semiconductor device. In this embodiment, the semiconductor element 101 and the substrate 103 are completely embedded within the resin 104a, and the handling of the semiconductor device 223 at the time of mounting is facilitated. In this embodiment, it is unnecessary to provide the frame body 108 and the upper lid member 110a.

Figure 46:
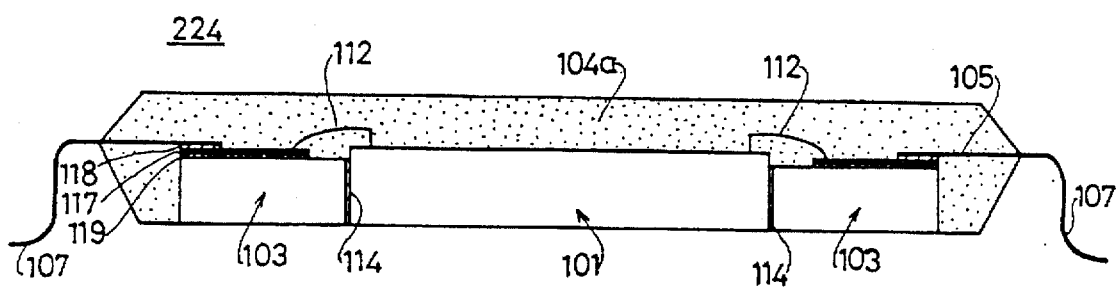
FIG. 46 is a cross sectional view showing an important part of a twenty-fifth embodiment of the semiconductor device according to the present invention.

FIG. 46 shows a cross section of a twenty-fifth embodiment of the semiconductor device according to the present invention employing the second aspect of the present invention. In FIG. 46, those parts which are the same as those corresponding parts in FIG. 45 are designated by the same reference numerals, and a description thereof will be omitted.

The basic construction of a semiconductor device 224 shown in FIG. 46 is the same as that of the semiconductor device 223 described above, however, the semiconductor device 224 is characterized in that the bottom part of the semiconductor element 101 is exposed outside the resin 104a. According to this embodiment, it is possible to directly release the heat generated from the semiconductor element 101 to the outside from the bottom surface of the semiconductor element 101, and the heat radiation characteristic is improved. In addition, since the resin 104a is unnecessary at the bottom of the substrate 103, it is possible to reduce the thickness of the semiconductor device 224 and also reduce the amount of resin 104a that is required.

Figure 47:
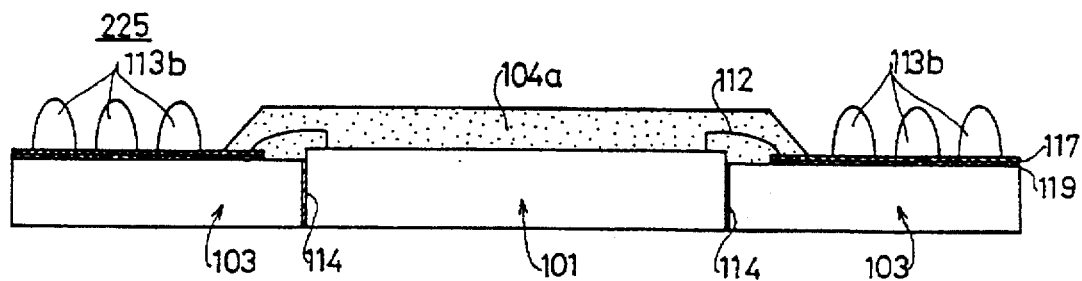
FIG. 47 is a cross sectional view showing an important part of a twenty-sixth embodiment of the semiconductor device according to the present invention.

FIG. 47 shows a cross section of a twenty-sixth embodiment of the semiconductor device according to the present invention employing the second aspect of the present invention. In FIG. 47, those parts which are the same as those corresponding parts in FIG. 34 are designated by the same reference numerals, and a description thereof will be omitted.

A semiconductor device 225 shown in FIG. 47 is characterized in that a so-called over-mold is used to encapsulate the electrode pads of the semiconductor element 101 and the wires 112 by the resin 104a.

Figure 48:
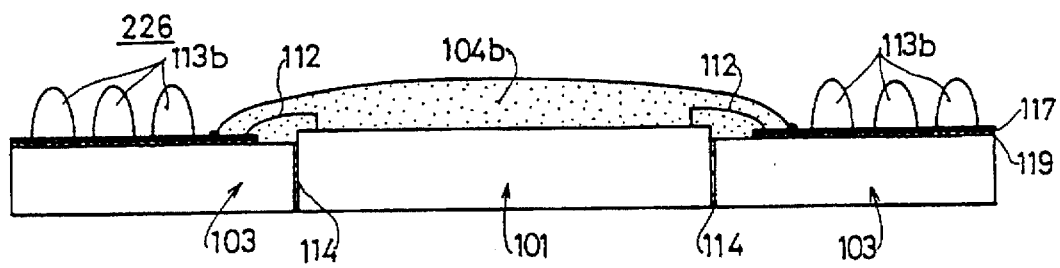
FIG. 48 is a cross sectional view showing an important part of a twenty-seventh embodiment of the semiconductor device according to the present invention.

FIG. 48 shows a cross section of a twenty-seventh embodiment of the semiconductor device according to the present invention employing the second aspect of the present invention. In FIG. 48, those parts which are the same as those corresponding parts in FIG. 34 are designated by the same reference numerals, and a description thereof will be omitted.

A semiconductor device 226 shown in FIG. 48 is characterized in that a so-called potting is used to encapsulate the electrode pads of the semiconductor element 101 and the wires 112 by the resin 104a.

Figure 49:
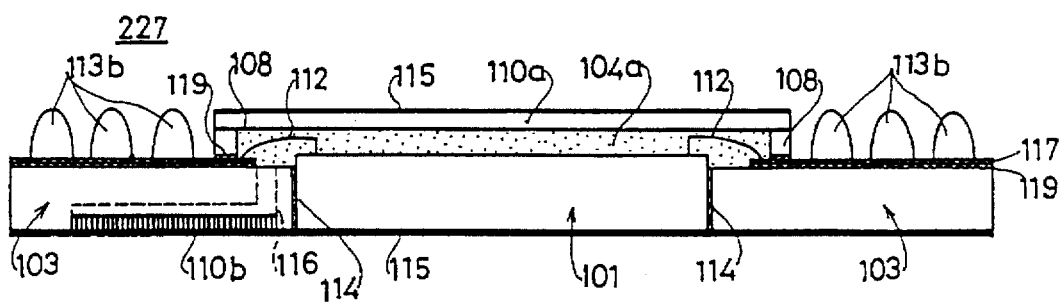
FIG. 49 is a cross sectional view showing an important part of a twenty-eighth embodiment of the semiconductor device according to the present invention.

FIG. 49 shows a cross section of a twenty-eighth embodiment of the semiconductor device according to the present invention employing the second aspect of the present invention. In FIG. 49, those parts which are the same as those corresponding parts in FIG. 34 are designated by the same reference numerals, and a description thereof will be omitted.

A semiconductor device 227 shown in FIG. 49 is characterized in that a material 115 having a high thermal conductivity is formed to a predetermined thickness on the surfaces of the frame body 108, the upper lid member 110a, the lower lid member 110b, the semiconductor element 101 and the substrate 103. In other words, the material 115 having the high thermal conductivity is formed on parts of the semiconductor device 227 exposed to the outside, so that the heat generated from the semiconductor element 101 is efficiently released outside the semiconductor device 227. For example, the material 115 having the high thermal conductivity may have a metal powder or an insulator powder as the filling. The metal powder may be selected from silver having a satisfactory thermal conductivity, silver palladium alloy, copper and the like. On the other hand, the insulator powder may be selected from silica, alumina, aluminum nitride, silicon nitride, boron nitride, diamond and the like.

Figure 50:
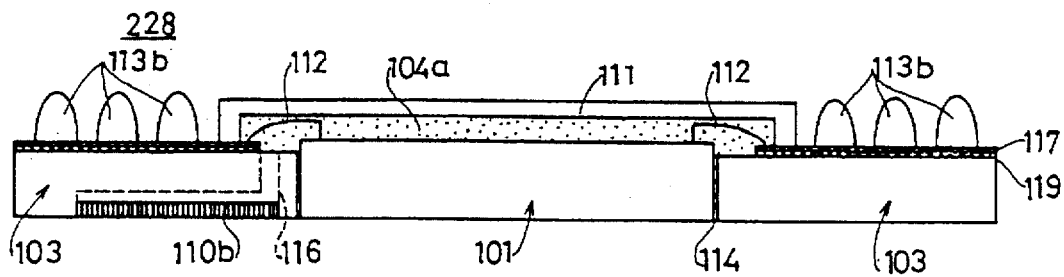
FIG. 50 is a cross sectional view showing an important part of a twenty-ninth embodiment of the semiconductor device according to the present invention.

FIG. 50 shows a cross section of a twenty-ninth embodiment of the semiconductor device according to the present invention employing the second aspect of the present invention. In FIG. 50, those parts which are the same as those corresponding parts in FIG. 34 are designated by the same reference numerals, and a description thereof will be omitted.

A semiconductor device 228 shown in FIG. 50 is characterized in that a metal cap 111 is used in place of the frame body 108 and the upper lid member 110a of the semiconductor device 212 described above, so as to close the upper part of the semiconductor element 101. According to this embodiment, it is unnecessary to carry out the process of bonding the frame body 108 and the upper lid member 110a as was required in the case of the semiconductor device 212, and it is also possible to reduce the number of parts. Furthermore, since it is possible to prevent defective or incomplete bonding between the frame body 108 and the upper lid member 110a, the leaking of the resin 104a can be prevented and the reliability of the semiconductor device 228 can be improved.

Figure 51:
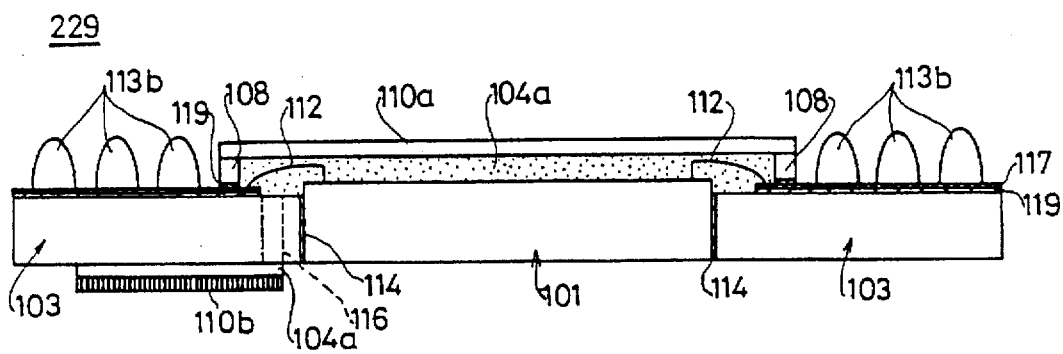
FIG. 51 is a cross sectional view showing an important part of a thirtieth embodiment of the semiconductor device according to the present Invention.

FIG. 51 shows a cross section of a thirtieth embodiment of the semiconductor device according to the present invention employing the second aspect of the present invention. In FIG. 51, those parts which are the same as those corresponding parts in FIG. 49 are designated by the same reference numerals, and a description thereof will be omitted.

A semiconductor device 229 shown in FIG. 51 is characterized in that a part of the resin 104a and the lower lid member 110b are exposed at the bottom part of the substrate 103. According to this embodiment, it is only necessary to form a resin gate hole 116 in the substrate 103, and it is unnecessary to provide a resin filling recess as in the case of the first aspect of the present invention described above, thereby making it easy to produce the semiconductor device 229. In addition, it is possible to simplify the construction of the substrate 103 because it is unnecessary to provide the resin filling recess, and thus, it is possible to improve the mechanical strength of the substrate 103.

Figure 52:
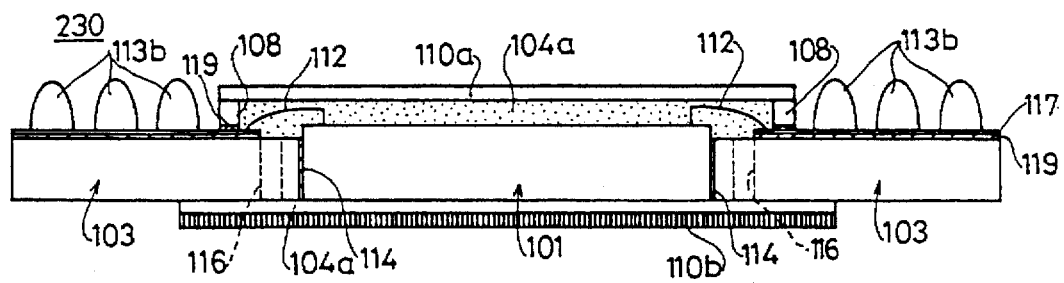
FIG. 52 is a cross sectional view showing an important part of a thirty-first embodiment of the semiconductor device according to the present invention.

FIG. 52 shows a cross section of a thirty-first embodiment of the semiconductor device according to the present invention employing the second aspect of the present invention. In FIG. 52, those parts which are the same as those corresponding parts in FIG. 51 are designated by the same reference numerals, and a description thereof will be omitted.

A semiconductor device 230 shown in FIG. 52 is characterized in that a plurality of resin gate holes 116 are formed in the substrate 103. By providing the plurality of resin gate holes 116, it is possible to efficiently and uniformly fill the resin 104a at the top surface of the substrate 103, and the resin filling process can positively be carried out within a short time.

Figure 53:
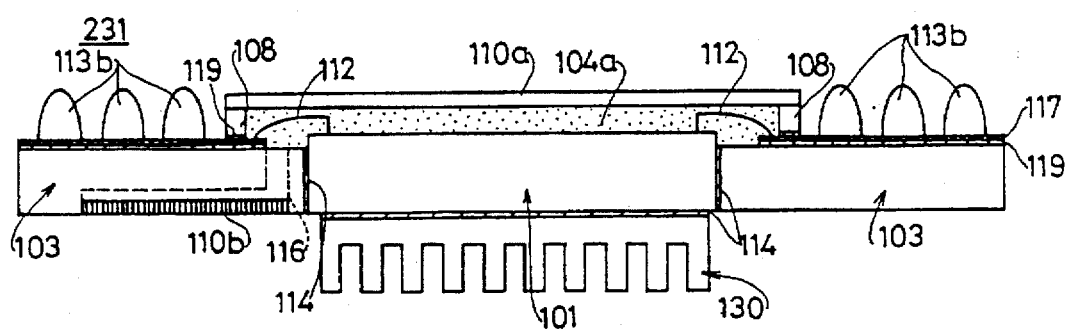
FIG. 53 is a cross sectional view showing an important part of a thirty-second embodiment of the semiconductor device according to the present invention.

FIG. 53 shows a cross section of a thirty-second embodiment of the semiconductor device according to the present invention employing the second aspect of the present invention. In FIG. 53, those parts which are the same as those corresponding parts in FIG. 34 are designated by the same reference numerals, and a description thereof will be omitted.

A semiconductor device 231 shown in FIG. 53 is characterized in that a heat radiating member 130 is provided on the entire bottom part of the semiconductor device 231 or on the bottom surface of the semiconductor element 101 that is exposed to the outside when compared to the semiconductor device 212 described above. The heat radiating member 130 is made of a metal such as aluminum having a satisfactory heat radiation characteristic, and is bonded on the bottom surface of the semiconductor element 101 by the bond material 114. In addition, the heat radiating member 130 has a shape with a large heat radiation area such as fins, so as to improve the heat radiation characteristic.

Figure 54:
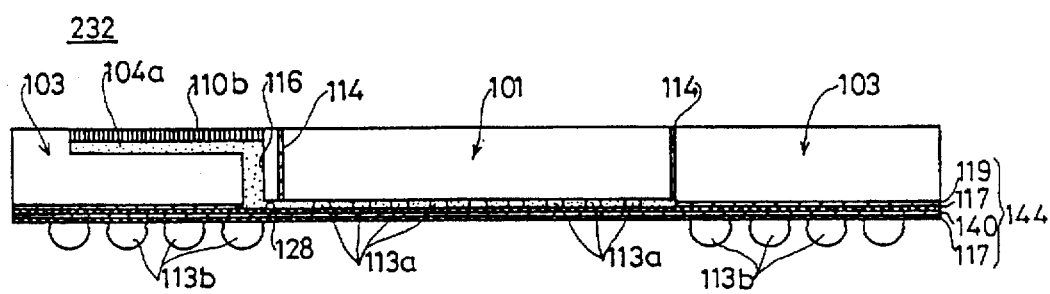
FIG. 54 is a cross sectional view showing an important part of a thirty-third embodiment of the semiconductor device according to the present invention.

FIG. 54 shows a cross section of a thirty-third embodiment of the semiconductor device according to the present invention employing the second aspect of the present invention. In FIG. 54, those parts which are the same as those corresponding parts in FIG. 34 are designated by the same reference numerals, and a description thereof will be omitted.

A semiconductor device 232 shown in FIG. 54 is characterized in that a flexible printed circuit (FPC) 144 is used as the circuit, and the electrical connection between the FPC 144 and the semiconductor element 101 is realized by use of flip-chip bonding.

In other words, inner bumps 113a are formed on the semiconductor element 101, and the electrical connection between the semiconductor element 101 and the FPC 144 is made by connecting the inner bumps 113a to the FPC 144. In addition, outer bumps 113b which become the external connecting terminals are formed on the FPC 144. The outer bumps 113b may employ the construction of the mechanical bumps 17a described above with reference to FIGS. 22A through 22C. According to this embodiment, it is possible to improve the density of the semiconductor device 232 and reduce the size of the semiconductor device 232.

Figure 55:
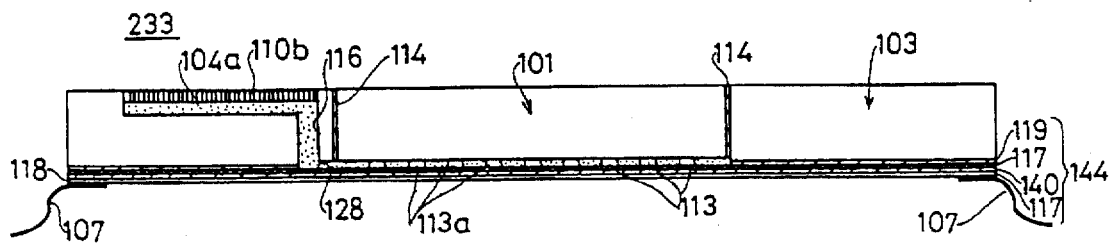
FIG. 55 is a cross sectional view showing an important part of a thirty-fourth embodiment of the semiconductor device according to the present invention.

FIG. 55 shows a cross section of a thirty-fourth embodiment of the semiconductor device according to the present invention employing the second aspect of the present invention. In FIG. 55, those parts which are the same as those corresponding parts in FIG. 54 are designated by the same reference numerals, and a description thereof will be omitted.

The basic construction of a semiconductor device 233 shown in FIG. 55 is the same as that of the semiconductor device 232 described above, but the semiconductor device 233 is characterized in that the outer leads 107 having the gull-wing shape are provided as the external connecting terminals in place of the outer bumps 133b.

Next, a description will be given of embodiments of the method of producing the semiconductor device according to the present invention, by referring to FIGS. 56 through 72. These embodiments of the method employ the second aspect of the present invention.

FIGS. 56A through 56H and 57 are cross sectional views for explaining a fifth embodiment of the method of producing the semiconductor device according to the present invention. In this embodiment, it is assumed for the sake of convenience that the semiconductor device 212 described above is produced.

Figure 56A:
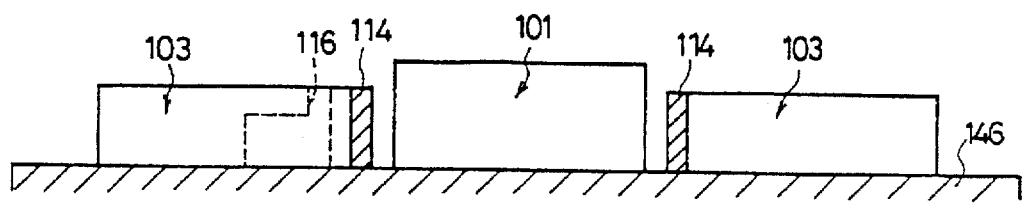
FIGS. 56A, 56B, 56C, 56D, 56E, 56F, 56G and 56H respectively are cross sectional views for explaining a fifth embodiment of the method of producing the semiconductor device according to the present invention.

When producing the semiconductor device 212, the substrates 103 which are divided as shown in FIG. 56A are formed in advance, and the bond material 114 is provided on the divided substrates 103 at parts where the semiconductor element 101 is bonded. When forming the divided substrates 103, the resin gate hole 116 is formed in at least one of the divided substrates 103.

Figure 56B:
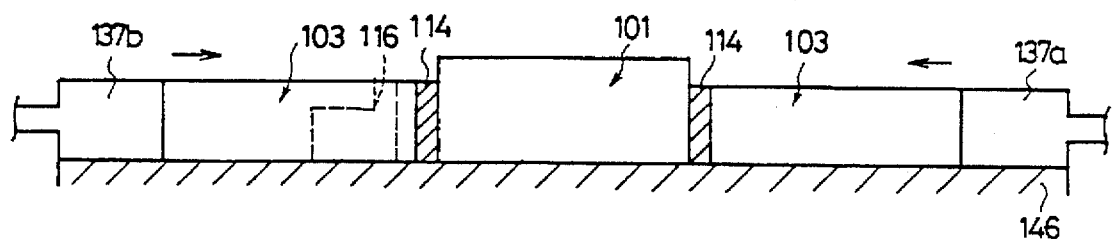

Then, the divided substrates 103 are positioned so that the parts where the bond material 114 is provided confront the 4 outer peripheral sides of the semiconductor element 101. The divided substrates 103 are then pressed towards the semiconductor element 101 by use of pressing tools 137a and 137b as shown in FIG. 56B. In this state, the divided substrates 103 and the semiconductor element 101 are placed on top of a base 146, and the divided substrates 103 are pressed against the semiconductor element 101 while maintaining this state. Hence, the bottom surfaces of the divided substrates 103 and the bottom surface of the semiconductor element 101 approximately match. The processing of pressing the divided substrates 103 against the semiconductor element 101 by use of the pressing tools 137a and 137b is carried out until the divided substrates 103 and the semiconductor element 101 are positively bonded by the bond materials 114.

Figure 59A:
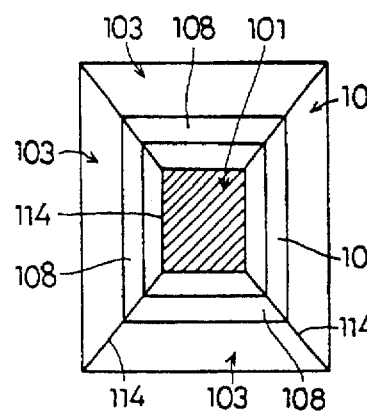
FIGS. 59A, 59B, 59C, 59D, 59E, 59F and 59G respectively are plan views for explaining various methods of dividing a substrate.
Figure 59B:
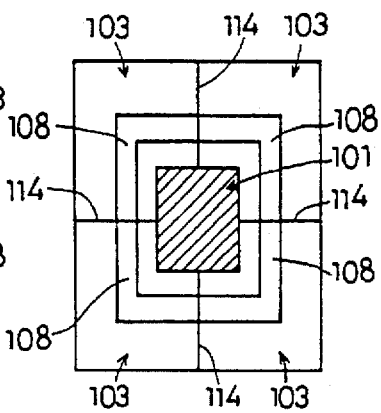
Figure 59C:
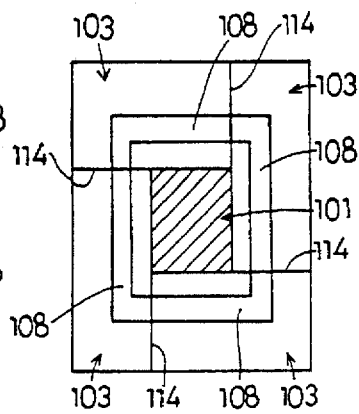
Figure 59D:
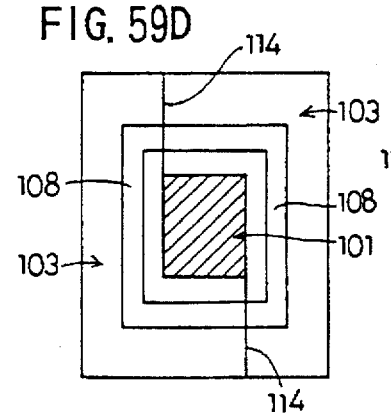
Figure 59E:
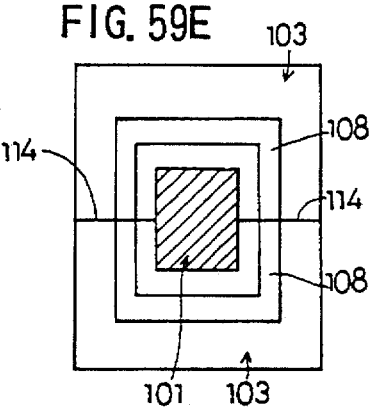
Figure 59F:
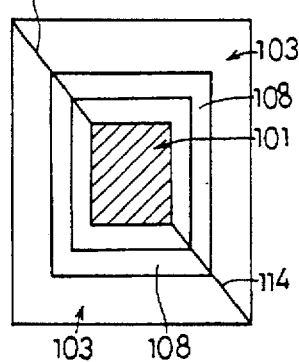
Figure 59G:
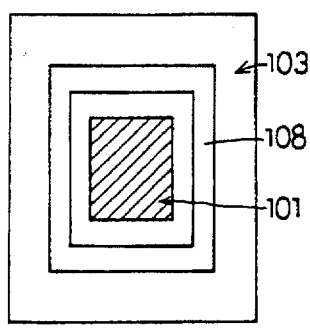

FIGS. 59A through 59G are plan views for explaining various methods of dividing the substrate 103. FIGS. 59A, 59B and 59C show cases where the substrate 103 is divided into 4 pieces. FIGS. 59D, 59E and 59F show cases where the substrate 103 is divided into 2 pieces. On the other hand, FIG. 59G shows a case where the substrate 103 is not divided as is 1 piece. As may be seen from FIGS. 59A through 59G, there are various methods of dividing the substrate 103, and the number of pieces into which the division is made, the dividing positions and the like may be appropriately selected depending on the size, the positional relationships of the wirings and the like of the semiconductor device.

If it is assumed for the sake of convenience that the substrate 103 is not divided but is constructed to surround the semiconductor element 101, it is necessary to provide a hole at the center of this substrate 103 to fit the semiconductor element 101.

On the other hand, when the divided substrates 103 are formed in advance and such divided substrates 103 are bonded on the side surfaces of the semiconductor element 101 as described above, it is much easier to bond the divided substrates 103 on the side surfaces of the semiconductor element 101.

Figure 62:
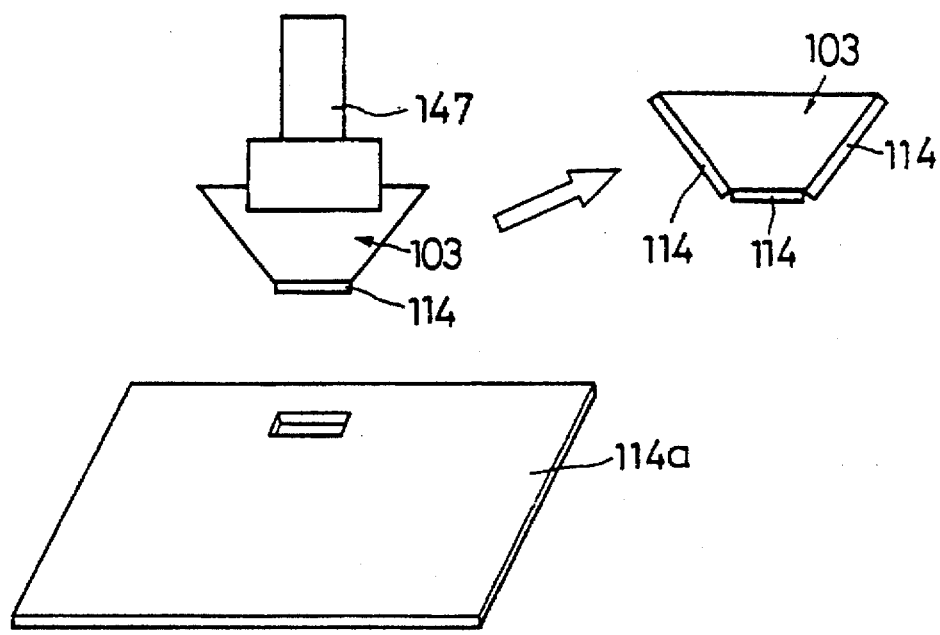
FIG. 62 is a perspective view for explaining a method of providing a bond material.
Figure 63:
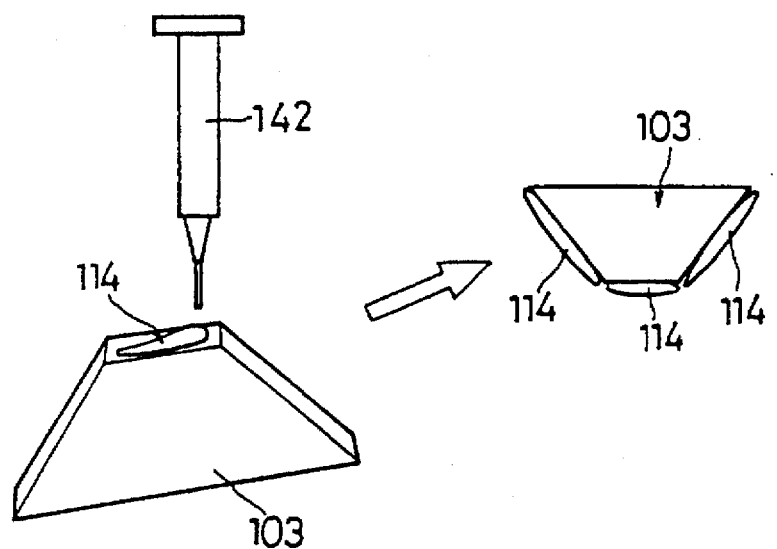
FIG. 63 is a perspective view for explaining another method of providing the bond material.
Figure 64:
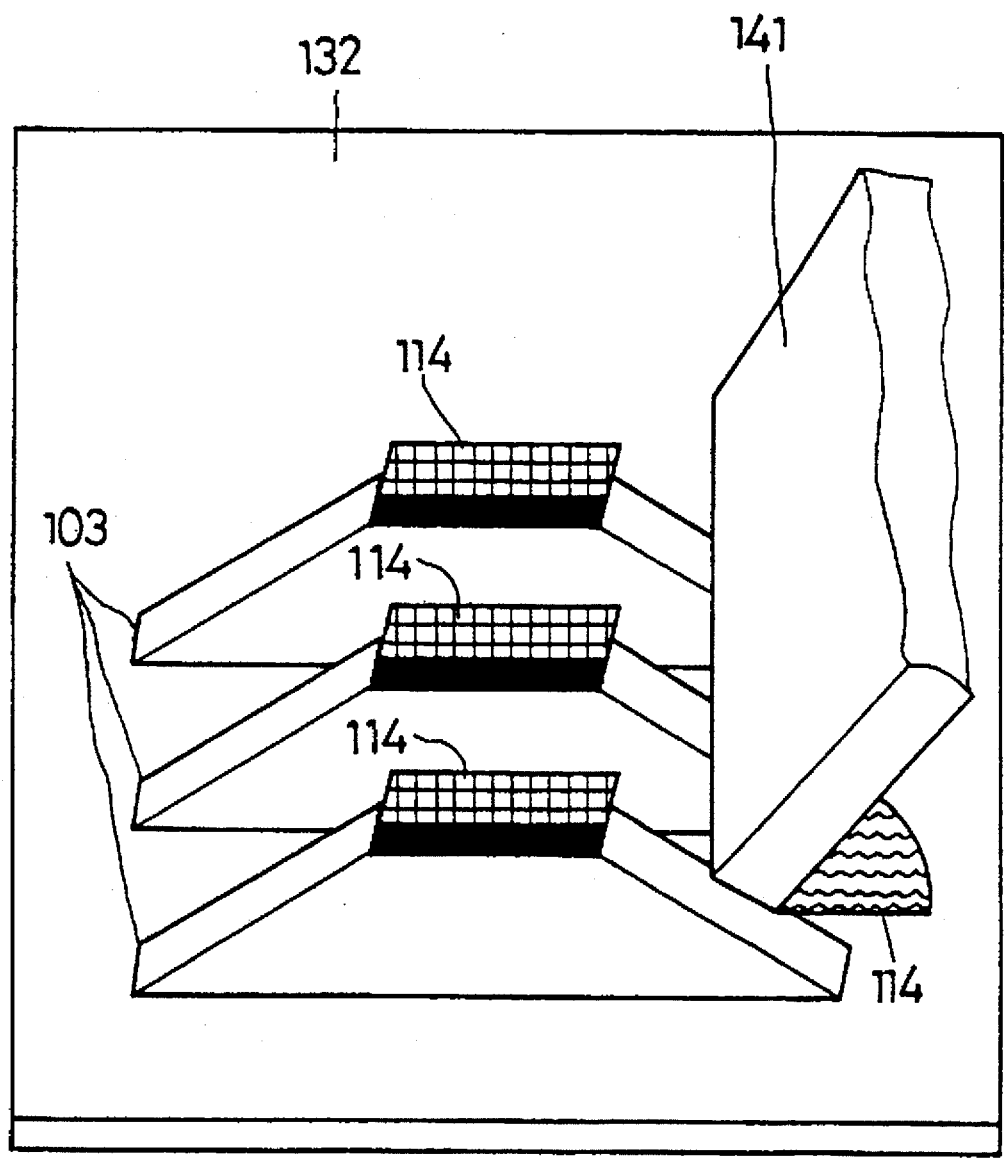
FIG. 64 is a perspective view for explaining still another method of providing the bond material.

FIGS. 62 through 64 are perspective views for explaining methods of providing the bond material 114 on the divided substrates 103.

FIG. 62 shows a case where the so-called transfer method is employed. In this case, the bond material 114 is formed into a plate shape, and the substrate 103 held by a holding tool 147 is pushed against this plate-shaped bond material 114, so as to provide the bond material 114 at predetermined positions on the substrate 103.

FIG. 63 shows a case where the dispense method is employed. In this case, the bond material 114 is loaded into a dispenser 142, and the bond material 114 is provided at predetermined positions on the substrate 103 by this dispenser 142.

Further, FIG. 64 shows a case where the screen printing method is employed. A print mask 132 having holes at positions corresponding to the positions of the substrate 103 where the bond material 114 is to be provided is arranged on top of the substrate 103. Then, the bond material 114 is printed on the substrate from the top of the print mask 132 using a squeegee 141.

The bond material 114 can thus be provided on the substrate 103 according to any of the methods described above.

Figure 56C:
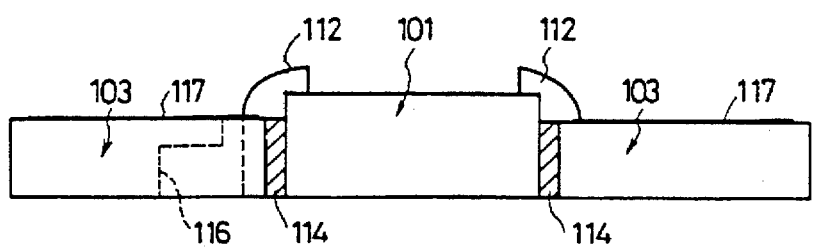
Figure 56D:
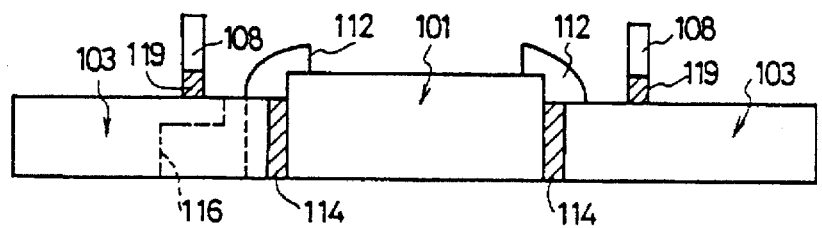

Returning now to the description of the fifth embodiment of the method, when the substrate 103 is made to surround the semiconductor element 101, the wiring layer 117 is provided on top of the substrate as shown in FIG. 56C, and the wires 112 are bonded between the wiring layer 117 and the semiconductor element 101. When the wires 112 are provided and the electrical connection between the wiring layer 117 and the semiconductor element 101 is finished, the frame body 108 is provided on top of the substrate 103 as shown in FIG. 56D. The substrate 103 and the frame body 108 are bonded via the insulator layer 119 which also has the function of a bond.

Figure 60:
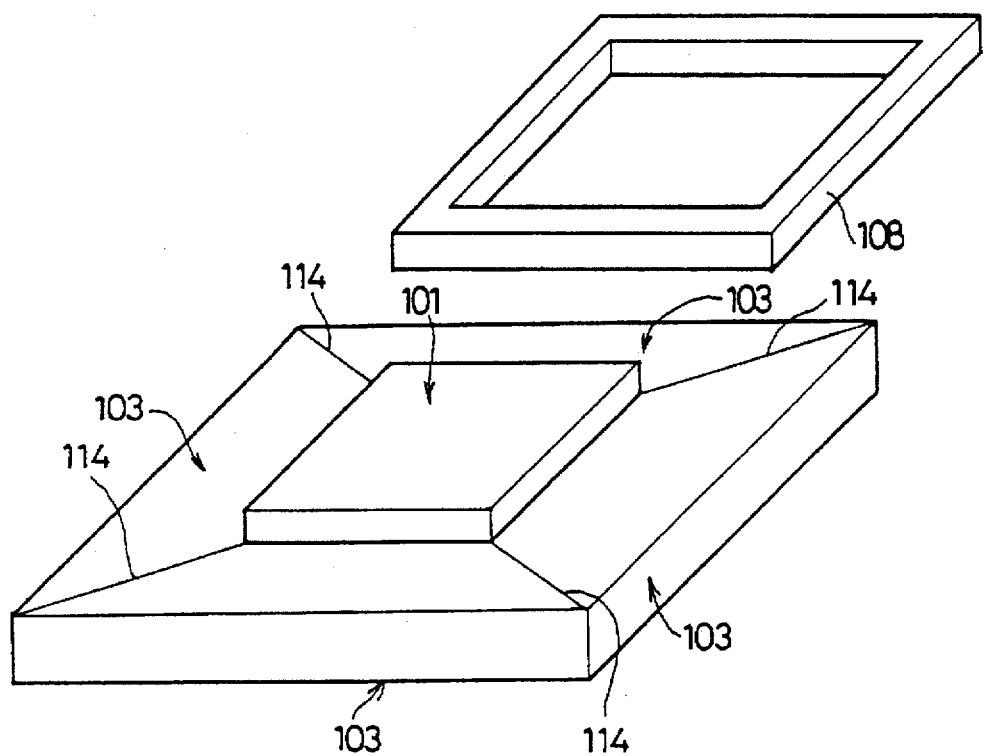
FIG. 60 is a perspective view for explaining a process of providing a frame body on the substrate.
Figure 61:
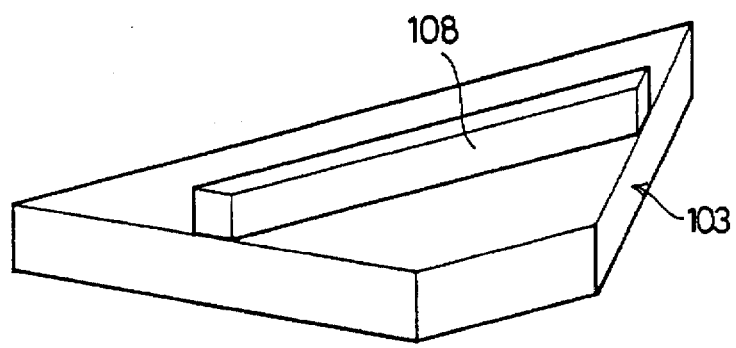
FIG. 61 is a perspective view for explaining another method of forming the frame body.

FIG. 60 is a perspective view showing the manner in which the frame body 108 is provided on the substrate 103. Of course, it is not essential to form the frame body 108 to have the shape shown from the beginning. For example, it is possible to provide parts of the frame body 108 on each divided substrate 103 as shown in FIG. 61, so that the frame body 108 is completed when all of the divided substrates 103 are bonded.

Figure 56E:
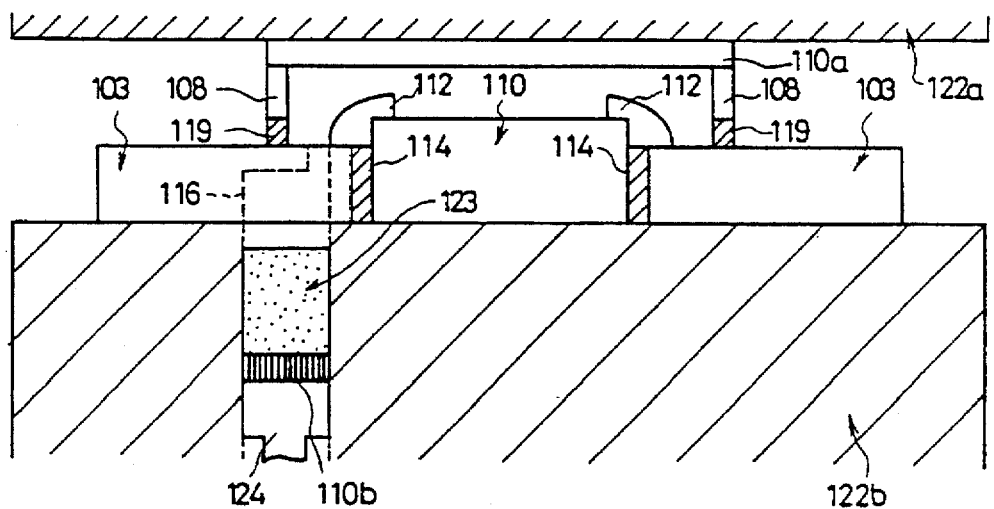

After providing the frame body 108 on the substrate 103, the upper lid member 110a is bonded on the frame body 108 as shown in FIG. 56E. In addition, after providing the upper lid member 110a on the frame body 108, the resin filling process is carried out using the resin 104a.

The substrate 103 having the upper lid member 110a provided on the frame body 108 as described above is loaded between an upper mold 122a and a lower mold 122b as shown in FIG. 56E. In this loaded state, the upper mold 122a confronts the upper lid member 110a, and the lower mold 122b confronts the bottom surface of the substrate 103. In addition, a plunger 124 which forms a resin filling mechanism for filling the resin 104a is provided in the lower mold 122b.

The plunger 124 is positioned so as to confront a resin filling recess of the resin gate hole 116 formed in the substrate 103. In addition, the resin filling recess and the plunger 124 have approximately the same area and shape in the plan view. A resin tablet 123 which becomes the resin 104a is loaded above the plunger 124, and a lower lid member 110b is interposed between the resin tablet 123 and the plunger 124.

Figure 56F:
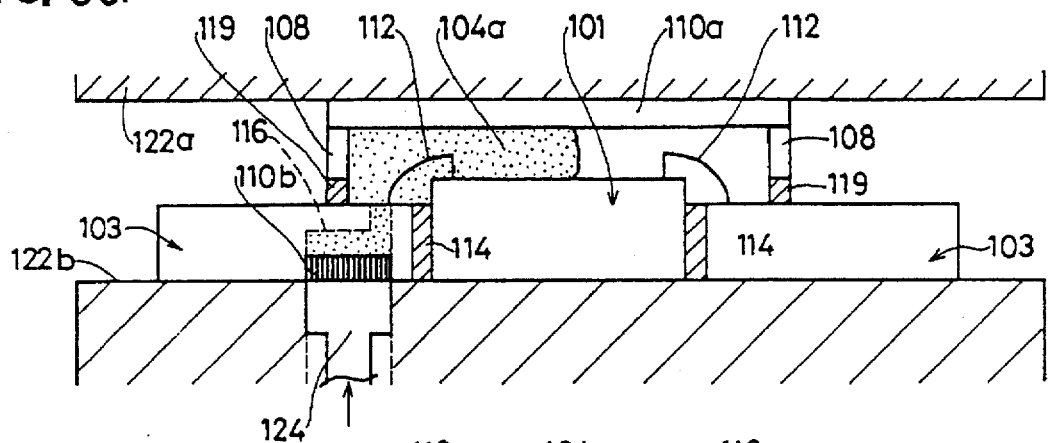

After the substrate 103 is loaded between the upper and lower molds 122a and 122b, the plunger 124 is raised while heating the resin tablet 123 as shown in FIG. 56F. As a result, the melted resin 104a passes through the resin gate hole 116 and reaches the top of the substrate 103, thereby filling the resin 104a into the space formed by the frame body 108 and the upper lid member 110a.

According to this embodiment of the method, it is also possible to directly fill the resin 104a to the semiconductor element encapsulating position on the substrate 103 via the resin gate hole 116, so that the predetermined part of the semiconductor element 101 is encapsulated. For this reason, it is possible to select the kind and amount of the mold release agent to be added to the resin 104a, without taking the mold separation characteristic into consideration. Hence, it is possible to use as the resin 104a a resin having a high adhesive strength, and the reliability of the semiconductor device can be improved even when the size of the semiconductor device is reduced.

Figure 56G:
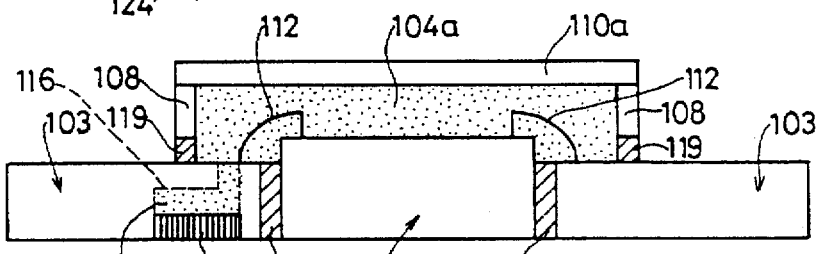
Figure 56H:
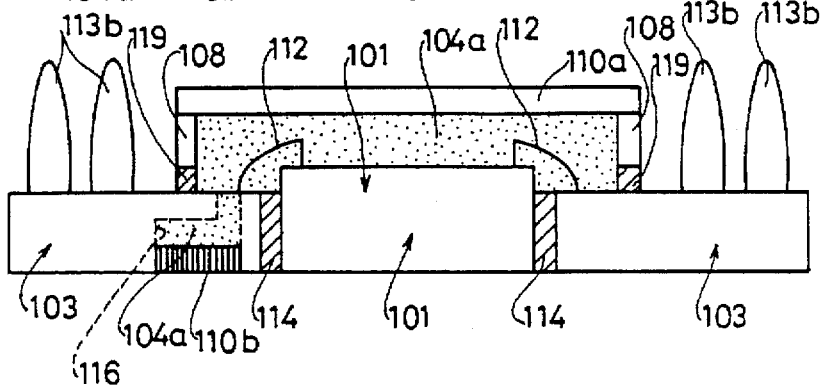

When the above described resin filling process ends, the substrate 103 is removed from the molds 122a and 122b as shown in FIG. 56G, and the bumps 113b which become the external connecting terminals are formed at predetermined positions on the substrate 103 as shown in FIG. 56H.

Figure 65:
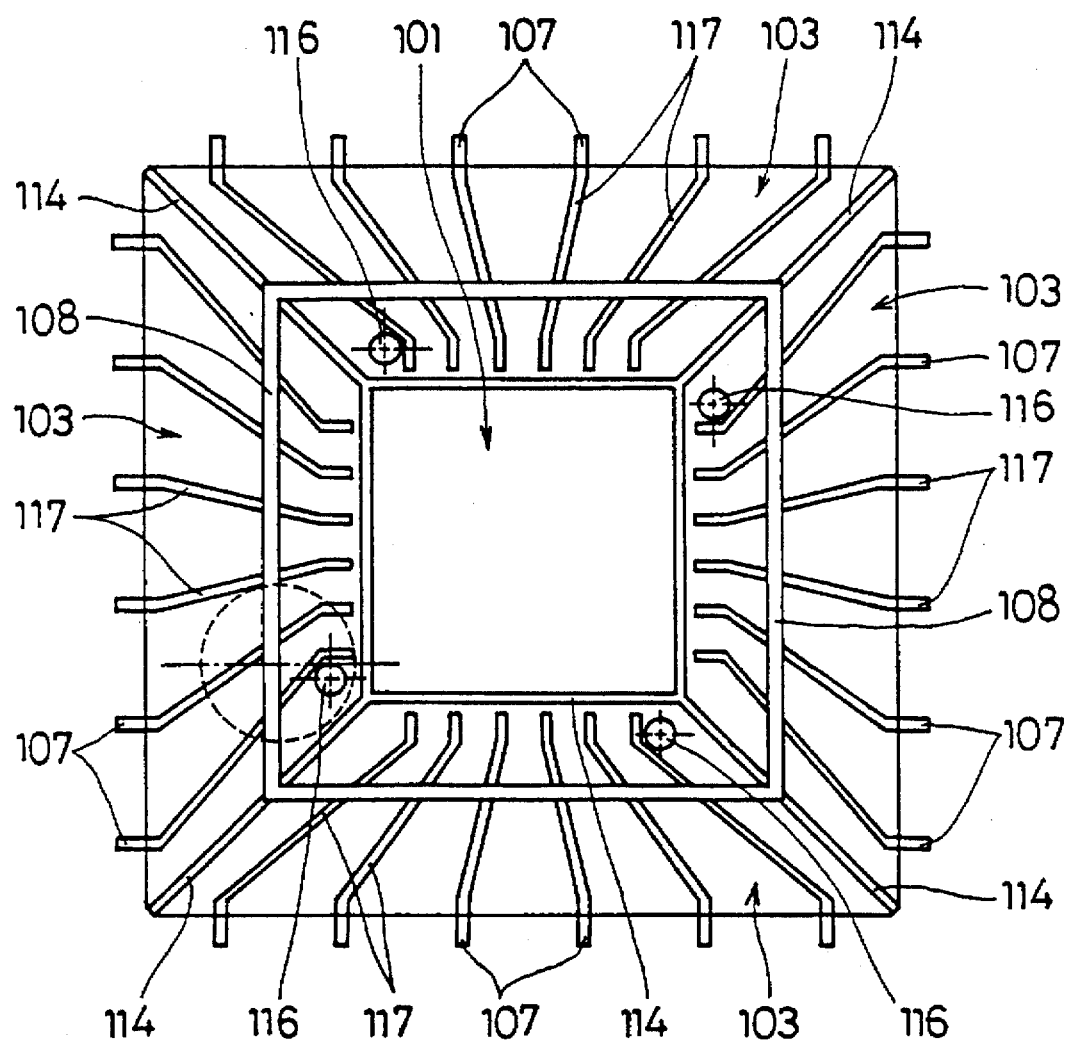
FIG. 65 is a plan view for explaining a method of forming resin gate holes.
Figure 66:
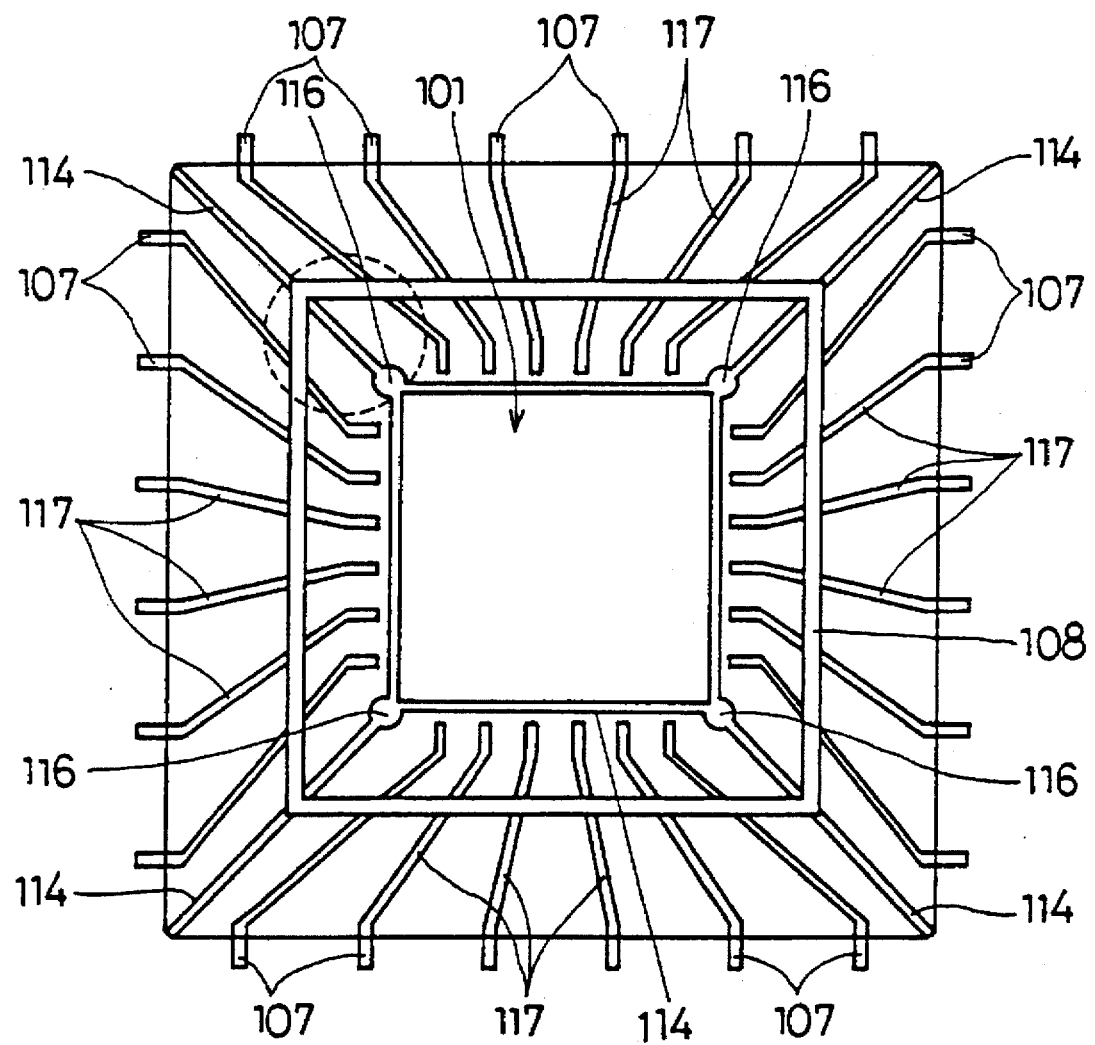
FIG. 66 is a plan view for explaining another method of forming the resin gate holes.

In this fifth embodiment of the method described above with reference to FIGS. 56A through 56H, only 1 resin gate hole 116 is provided. However, it is of course possible to provide a plurality of resin gate holes 116. When a plurality of resin gate holes 116 are provided, it is possible to improve the resin filling efficiency and also fill the resin 104a uniformly. FIG. 65 shows a case where 4 resin gate holes 116 are provided, and FIG. 66 shows a case where the resin gate holes 116 are provided by utilizing the bond positions of the divided substrates 103.

Figure 57:
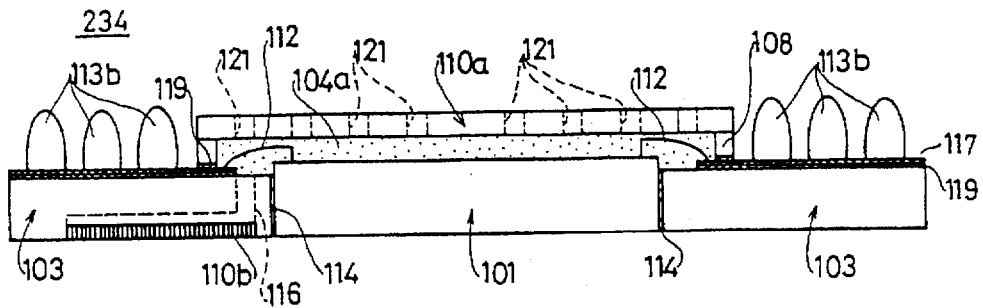
FIG. 57 is a cross sectional view showing an important part of a modification of the thirteenth embodiment of the semiconductor device produced by the fifth embodiment of the method.

FIG. 57 is shows a cross section of an important part of a modification of the thirteenth embodiment of the semiconductor device produced by the fifth embodiment of the method. The basic construction of a semiconductor device 234 shown in FIG. 57 is the same as that of the semiconductor device 212 shown in FIG. 34, except that a plurality of through holes 121 are formed in the upper lid member 110a in the case of the semiconductor device 234. Hence, this modification of the thirteenth embodiment of the semiconductor device corresponds to the semiconductor device shown in FIG. 17 described above.

Figure 58A:
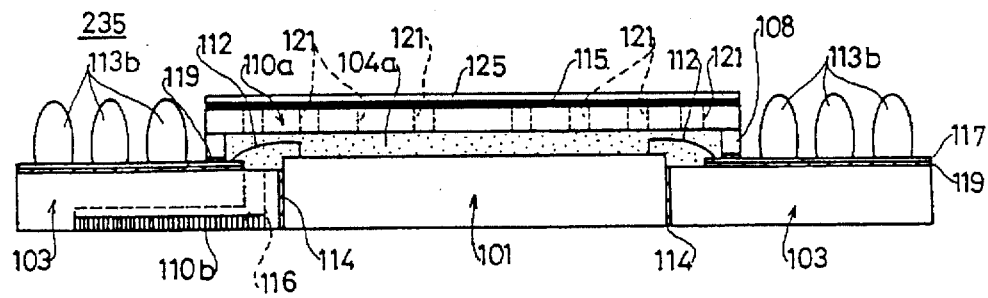
FIGS. 58A, 58B and 58C respectively are cross sectional views for explaining the method of producing the semiconductor device shown in FIG. 57.

When producing the semiconductor device 234 shown in FIG. 57, the plurality of through holes 121 are formed in the upper lid member 110a, and a mold separation film 125 is arranged above this upper lid member 110a. Then, the processes described above with reference to FIGS. 56A through 56H is carried out using this upper lid member 110a. FIG. 58A shows a semiconductor device 235 which is produced in this manner. In the semiconductor device 235 shown in FIG. 58A, the material 115 having the high thermal conductivity and ventilation characteristic is provided between the upper lid member 110a and the mold separation film 125.

During the production process of the semiconductor device, the through holes 121 formed in the upper lid member 110a are closed by the mold separation film 125 that is arranged above the upper lid member 110a. Hence, the resin 104a will not leak to the outside via the through holes 121 during the resin filling process. In addition, since the mold separation film 125 makes contact with the upper mold 122a, the mold release characteristic after the resin filling process is satisfactory.

Figure 58B:
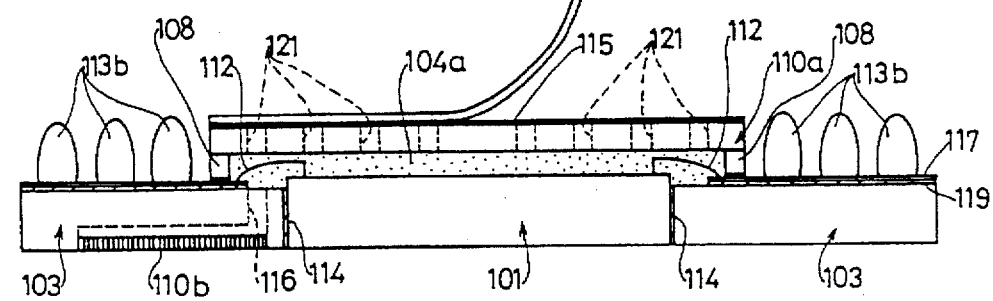
Figure 58C:
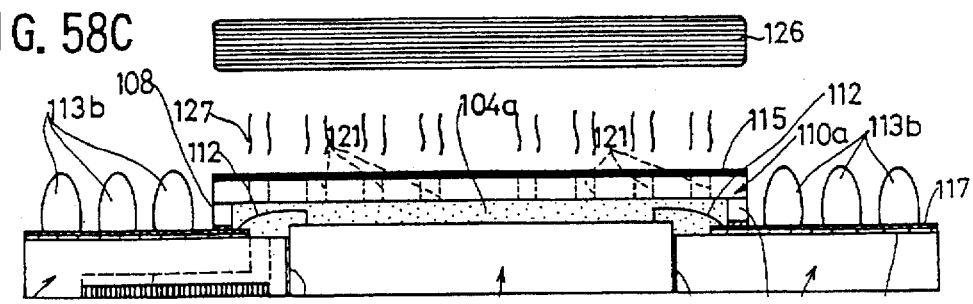

When mounting the semiconductor device 235 shown in FIG. 58A onto a mounting substrate (not shown), the mold separation film 125 arranged on top of the upper lid member 110a is removed as shown in FIG. 58B. Then, as shown in FIG. 58C, in order to solder the bumps 113b onto the terminals which are formed on the mounting substrate, the semiconductor device is loaded into a reflow chamber 126 and is subjected to a heating process. As a result, the bumps 113b melt and connect to the terminals of the mounting substrate.

When the heating process is carried out within the reflow chamber 126, the moisture included within the resin 104a becomes water vapor 127, and the water vapor 127 escapes outside the semiconductor device via the through holes 121 formed in the upper lid member 110a. Therefore, the moisture included within the resin 104a is eliminated, and it is possible to prevent the electrode pads, the wires 112, the wiring layer 117 and the like from corrosion and also prevent cracks from being generated in the resin 104a.

FIGS. 67A through 67F show cross sections for explaining a sixth embodiment of the method of producing the semiconductor device according to the present invention. In this embodiment, the semiconductor device uses the FPC 144 having the wiring layer 117.

First, processes similar to those described above with reference to FIGS. 56A and 56B are carried out to bond the divided substrates 103 on the outer peripheral side surfaces of the semiconductor element 101 using the bond material 114. As a result, a structure shown in FIG. 67A is obtained. Then, the bond material 114 is coated on the substrate 103 as shown in FIG. 67B, and the FPC 144 is arranged above the substrate 103 as shown in FIG. 67C. This FPC 144 is formed in advance by another process, and includes the insulating substrate 140, the insulator layer 119 and the wiring layer 117 which are stacked in this sequence from the bottom.

The processes shown in FIGS. 67D through 67F are identical to those shown in FIGS. 56D through 56G, and a description thereof will be omitted.

By using the FPC 144 as the wiring layer, it is possible to make the external shape of the semiconductor device constant by the shape of the FPC 144, regardless of the size and shape of the semiconductor element 101.

FIGS. 68A through 68F show cross sections for explaining a seventh embodiment of the method of producing the semiconductor device according to the present invention. This embodiment of the method produces the semiconductor device 217 shown in FIG. 39.

When producing the semiconductor device 217, processes similar to those described above with reference to FIGS. 56A and 56B are carried out to bond the divided substrates 103 on the outer peripheral side surfaces of the semiconductor element 101 using the bond material 114. As a result, a structure shown in FIG. 68A is obtained.

Next, the bond material 114 is formed above the substrate 103 as shown in FIG. 68B using the transfer method, the screen printing method, the dispense method or the like described above. Then, the TAB tape (FPC) 144 is bonded on the substrate 103. This TAB tape 144 is made up of the insulating substrate 140, the insulator layer 119 and the wiring layer 117 which are successively stacked in this sequence from the bottom. Generally, the wiring layer 117 and the inner leads 106 are integrally provided in the TAB tape 144 by electrolytic copper film or the like, and gold, tin, solder or the like is plated on the inner leads 106. The inner leads 106 are positioned above the inner bumps 103a of the semiconductor element 101 in the state where the TAB table 144 is arranged on the substrate 103. FIG. 68C shows a state where the TAB tape 144 is bonded on the substrate 103.

When the TAB tape 144 is bonded on the substrate 103, the frame body 108 is bonded on the TAB tape 144 by the insulator layer 119 which also functions as the bond material, as shown in FIG. 68D.

Thereafter, as shown in FIG. 68E, an inner lead bonding (ILB) is carried out using a tool 137b so as to bond the inner bumps 103a and the inner leads 106 by thermo-compression bonding or eutectic bonding. Next, processes similar to those described above with reference to FIGS. 56E through 56G are carried out, and the semiconductor device 217 shown in FIG. 68F is obtained.

FIGS. 69A through 68D show cross sections for explaining an eighth embodiment of the method of producing the semiconductor device according to the present invention. This embodiment of the method produces the semiconductor device 217 shown in FIG. 39.

This embodiment of the method is characterized in that, when producing the semiconductor device 217, the semiconductor element 101 is first connected to the TAB tape 144, and the substrate 103 is then bonded on the semiconductor element 101. For this reason, the inner bumps 103a are first formed on the semiconductor element 101 as shown in FIG. 69A, and the tool 137b is used to bond the inner bumps 103a and the inner leads 106 by the thermo-compression bonding or the eutectic bonding as shown in FIG. 69B. In this case, the frame body 108 is arranged above the TAB tape 144 when bonding the inner bumps 103a and the inner leads 106.

Next, as shown in FIG. 69C, the bond material 114 is provided on the surfaces of the divided substrates 103 confronting the semiconductor element 101 and the TAP tape 144, and the divided substrates 103 are bonded to the semiconductor element 101 and to the TAB tape 144 in one process. Thereafter, processes similar to those described above with reference to FIGS. 56E through 56G are carried out, and the semiconductor device 217 shown in FIG. 69D is obtained.

Figure 70A:
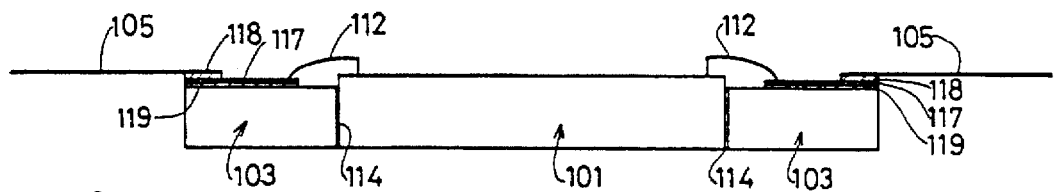
FIGS. 70A, 70B and 70C respectively are cross sectional views for explaining a ninth embodiment of the method of producing the semiconductor device according to the present invention.
Figure 70B:
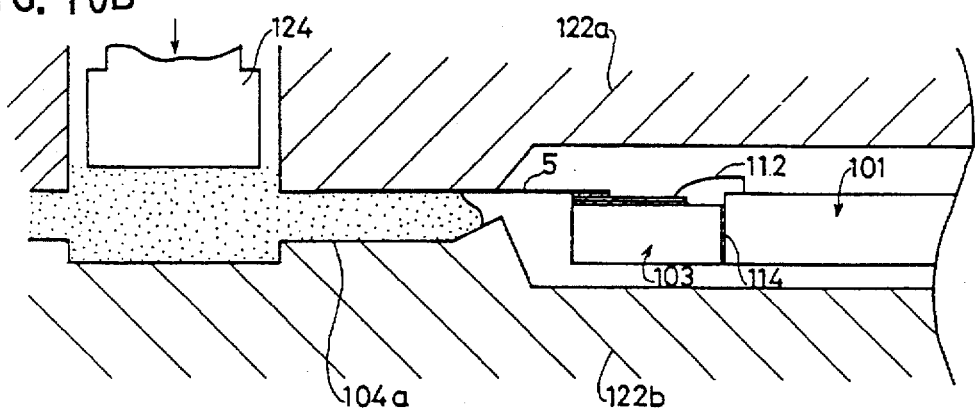
Figure 70C:
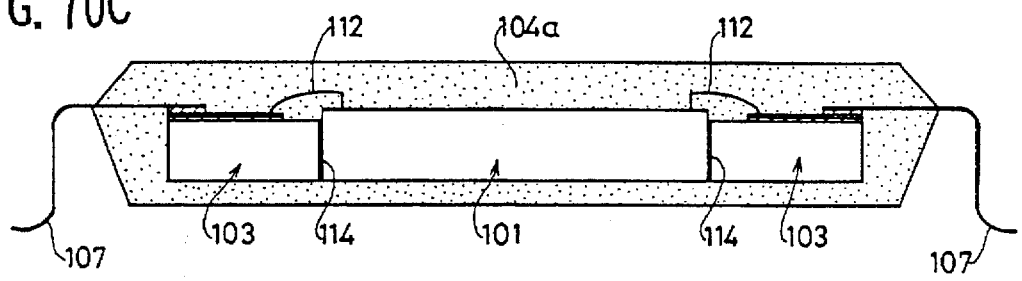

FIGS. 70A through 70C show cross sections for explaining a ninth embodiment of the method of producing the semiconductor device according to the present invention. This embodiment of the method produces the semiconductor device 223 shown in FIG. 45.

When producing the semiconductor device 223, the divided substrates 103 are bonded on the semiconductor element 101, and the wiring layer 117 and the insulator layer 119 are formed on the substrate 103. In addition, the wires 112 are provided between the wiring layer 117 and the semiconductor element 101, and the lead frame 105 is arranged as shown in FIG. 70A.

Then, the structure shown in FIG. 70A is loaded between the molds 122a and 122b as shown in FIG. 70B, so as to carry out a transfer mold process. The resin filling process shown in FIG. 70B is generally carried out when forming a resin package, and it is possible to encapsulate the structure shown in FIG. 70A by the resin 104a using the existing equipments. When the resin mold of the resin 104a with respect to the structure shown in FIG. 70A ends, this structure is removed from the molds 122a and 122b, and a shaping process is carried out with respect to the lead frame 105 so as to obtain the semiconductor device 217 shown in FIG. 70C.

Figure 71A:
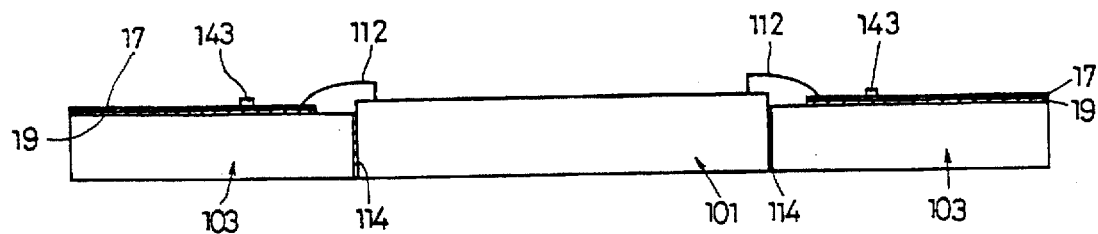
FIGS. 71A, 71B and 71C respectively are cross sectional views for explaining a tenth embodiment of the method of producing the semiconductor device according to the present invention.
Figure 71B:
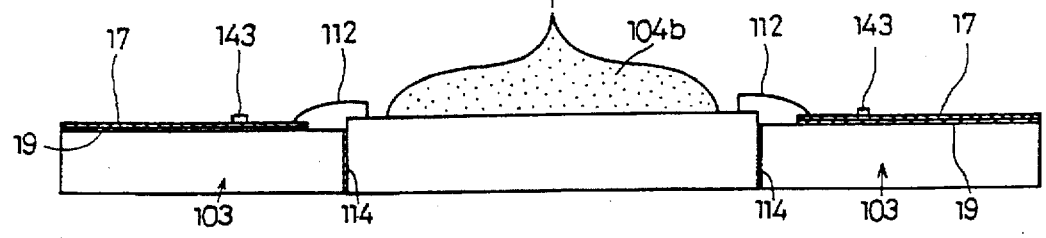
Figure 71C:
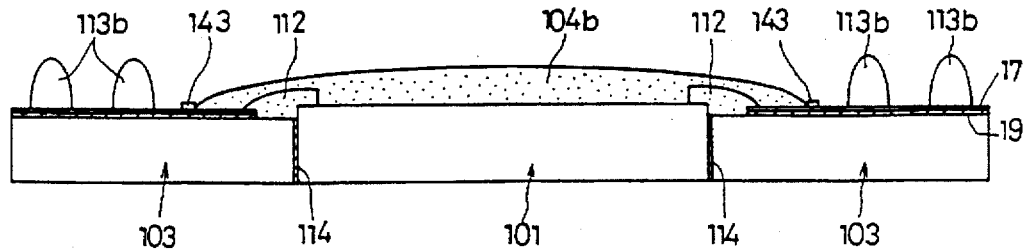

FIGS. 71A through 71C show cross sections for explaining a tenth embodiment of the method of producing the semiconductor device according to the present invention. This embodiment of the method produces the semiconductor device 228 shown in FIG. 48.

When producing the semiconductor device 226, the divided substrates 103 are bonded on the semiconductor element 101, and the wiring layer 117 and the insulator layer 119 are formed on the substrate 103. In addition, the wires 112 are provided between the wiring layer 117 and the semiconductor element 101, and a dam 143 for preventing the resin flow is formed on the wiring layer 117 as shown in FIG. 71A.

Then, as shown in FIG. 71B, the potting of the resin 104a on the semiconductor element 101 is made using the dispenser 142. As a result, the semiconductor device 226 shown in FIG. 71C is obtained.

FIGS. 72A through 72E show cross sections for explaining an eleventh embodiment of the method of producing the semiconductor device according to the present invention. This embodiment of the method produces the semiconductor device 232 shown in FIG. 54.

Figure 72A:
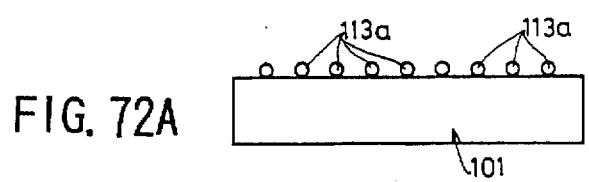
FIGS. 72A, 72B, 72C, 72D and 72E respectively are cross sectional views for explaining an eleventh embodiment of the method of producing the semiconductor device according to the present invention.
Figure 72B:
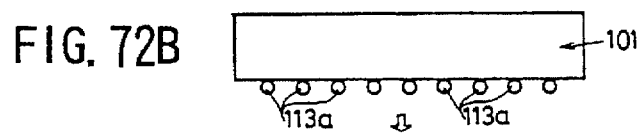

When producing the semiconductor device 232, the inner bumps 113a are formed on the semiconductor element 101 as shown in FIG. 72A. Then, as shown in FIG. 72B, the inner bumps 113a of the semiconductor element 101 are bonded on a FPC which is made up of the insulating substrate 140 and the wiring layers 117 which sandwich the insulating substrate 140.

Figure 72C:
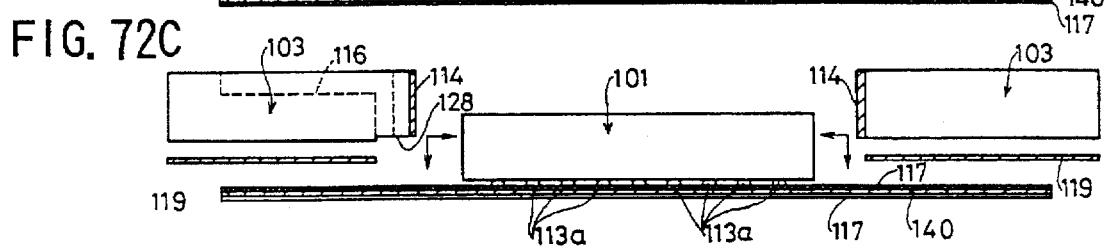

When the semiconductor element 101 is mounted on the FPC in the above described manner, the divided substrates 103 are bonded on the FPC so as to surround the semiconductor element 101 as shown in FIG. 72C. In this case, the outer peripheral side surfaces of the semiconductor element 101 and the divided substrates 103 are bonded by the bond material 114, and the FPC and the substrate 103 are bonded by the insulating layer 119 which also functions as a bond material.

Figure 72D:
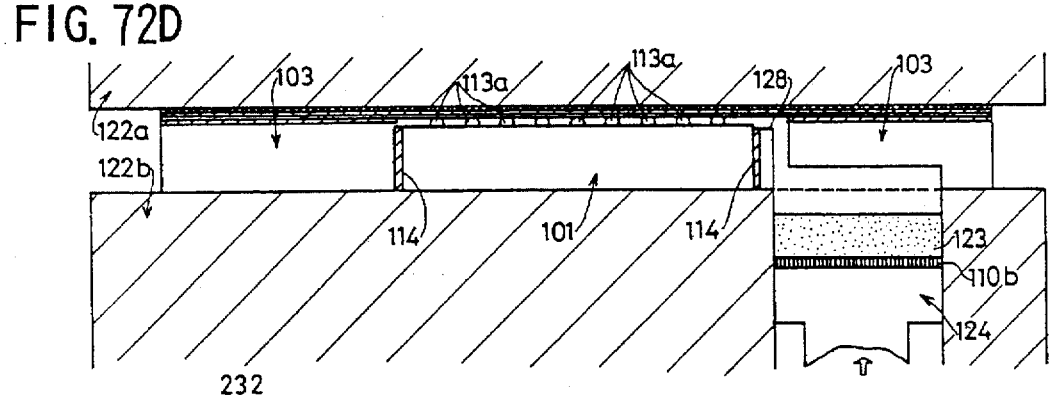
Figure 72E:
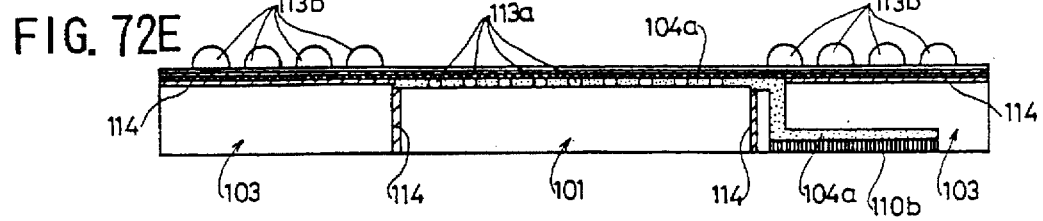

The FPC mounted with the substrate 103 is loaded between the molds 122a and 122b as shown in FIG. 72D, and the resin 104a is filled into the gap between the semiconductor element 101 and the FPC via the resin gate hole 116. Next, the outer bumps 113b are formed on the outer end parts of the FPC, and the semiconductor device 232 shown in FIG. 72E is obtained.

In each of the embodiments described above, the material having a satisfactory heat radiation characteristic and the material having a satisfactory or high thermal conductivity may be selected from a group consisting of (i) metals such as copper, aluminum, tungsten, molybdenum, clad materials of such metals, alloys of such metals and mixtures of such metals respectively having a thermal conductivity of 20 W/mk or greater, (ii) ceramics such as silicon nitride, aluminum nitride, alumina and composite materials of such ceramics, (iii) diamond, and (iv) composite materials of a plurality of materials such as metals, ceramics and diamond.

Further, the present invention is not limited to these embodiments, but various variations and modifications may be made without departing from the scope of the present invention.

What is claimed is:

1. A semiconductor device comprising:
   a substrate having top and bottom surfaces;
   a semiconductor element mounted on the top surface of said substrate;
   a resin package made of a resin and encapsulating said semiconductor element,
   said substrate including at least one resin gate hole enabling said resin to be introduced from the bottom surface of said substrate via the resin gate hole when encapsulating said semiconductor element by said resin; and
   a frame body surrounding a periphery of said resin package, a thickness of said frame body and a thickness of said resin being approximately the same.

2. The semiconductor device as claimed in claim 1, wherein said resin package fills a recess to which said resin gate hole opens on the bottom surface of said substrate.

3. The semiconductor device as claimed in claim 1, wherein said resin includes no mold release agent.

4. The semiconductor device as claimed in claim 1, which further comprises:
   a wiring layer provided on said substrate;
   connecting means for electrically connecting said semiconductor element and said wiring layer; and
   external connecting terminals provided on said wiring layer and used for electrically connecting the semiconductor device to an external element.

5. The semiconductor device as claimed in claim 4, wherein said connecting means includes wires electrically connecting said semiconductor element and said wiring layer.

6. The semiconductor device as claimed in claim 4, wherein said connecting means includes bumps electrically connecting said semiconductor element and said wiring layer.

7. The semiconductor device as claimed in claim 4, wherein said external connecting terminals include a lead member.

8. The semiconductor device as claimed in claim 4, wherein said external connecting terminals include bumps.

9. The semiconductor device as claimed in claim 4, wherein said external connecting terminals on said wiring layer include vias.

10. The semiconductor device as claimed in claim 4, wherein said wiring layer is made up of a multi-level circuit.

11. The semiconductor device as claimed in claim 10, wherein said multi-level circuit includes a stacked structure having wiping layers and insulator layers which are alternately stacked, and mechanical compressions making electrical connections among the wiring layers.

12. The semiconductor device as claimed in claim 1, wherein said substrate includes a plurality of resin gate holes.

13. The semiconductor device comprising:

a substrate having top and bottom surfaces;

a semiconductor element mounted on the top surface of said substrate;

a resin package made of a resin and encapsulating said semiconductor element, said substrate including at least one resin gate hole enabling said resin to be introduced from the bottom surface of said substrate via the resin gate hole when encapsulating said semiconductor element by said resin; and a lid member arranged above said resin package and including a plurality of through holes, said through holes providing a passage for moisture included within the resin of said resin package to escape outside said resin package.

14. The semiconductor device as claimed in claim 13, wherein said lid member is made of a material having a high thermal conductivity, said material being selected from a group consisting of (i) copper, aluminum, tungsten, molybdenum, clad materials of such metals, alloys of such metals and mixtures of such metals respectively having a thermal conductivity of 20 W/mk or greater, (ii) silicon nitride, aluminum nitride, alumina and composite materials of such ceramics, (iii) diamond, and (iv) composite materials of a plurality of metals, ceramics and diamond.

15. A semiconductor device comprising:

a circuit;

a semiconductor element having a top surface and mounted on said circuit;

a frame body provided on said circuit and surrounding said semiconductor element in a state where a gap is formed between said semiconductor element and said frame body; and a resin package made of a resin filled on an inner side of said frame body and encapsulating said semiconductor element, a thickness of said resin and a thickness of said frame body being substantially the same, said frame body including a resin gate hole which opens at a surface other than a surface confronting the top surface of said semiconductor element and enabling said resin to be introduced on the inner side of said frame body via the resin gate hole when encapsulating said semiconductor element by said resin.

* * * * *